(12) United States Patent
Ikegami et al.

(10) Patent No.: US 9,780,187 B2
(45) Date of Patent: Oct. 3, 2017

(54) SEMICONDUCTOR DEVICE INCLUDING AN IGBT AS A POWER TRANSISTOR AND A METHOD OF MANUFACTURING THE SAME

(71) Applicant: Renesas Electronics Corporation, Tokyo (JP)

(72) Inventors: Yuta Ikegami, Tokyo (JP); Tsuyoshi Kachi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/198,395

(22) Filed: Jun. 30, 2016

(65) Prior Publication Data
US 2016/0308022 A1 Oct. 20, 2016

Related U.S. Application Data

(62) Division of application No. 14/806,115, filed on Jul. 22, 2015, now Pat. No. 9,406,787.

(30) Foreign Application Priority Data

Aug. 8, 2014 (JP) ................................ 2014-162936

(51) Int. Cl.
*H01L 29/66* (2006.01)
*H01L 29/423* (2006.01)
(Continued)

(52) U.S. Cl.
CPC .... *H01L 29/66348* (2013.01); *H01L 21/3085* (2013.01); *H01L 21/30604* (2013.01);
(Continued)

(58) Field of Classification Search
CPC ............ H01L 29/0696; H01L 29/1095; H01L 29/41708; H01L 29/4236; H01L 29/66325;
(Continued)

(56) References Cited

U.S. PATENT DOCUMENTS 5,448,083 A * 9/1995 Kitagawa ............ H01L 29/7455
257/133
6,246,104 B1 6/2001 Tsuda et al.
(Continued)

FOREIGN PATENT DOCUMENTS

JP 2013-251467 A 12/2013
WO WO2011/104850 A1 9/2011

*Primary Examiner* — Mohsen Ahmadi
(74) *Attorney, Agent, or Firm* — Mattingly & Malur, PC

(57) ABSTRACT

An improvement is achieved in the performance of a semiconductor device. Over the main surface of a semiconductor substrate for the n-type base of an IGBT, an insulating layer is formed. In a trench of the insulating layer, an n-type semiconductor layer is formed over the semiconductor substrate and, on both sides of the semiconductor layer, gate electrodes are formed via gate insulating films. In an upper portion of the semiconductor layer, a p-type semiconductor region for a p-type base and an n$^+$-type semiconductor region for an n-type emitter are formed. Under the gate electrodes, parts of the insulating layer are present. The side surfaces of the gate electrodes opposite to the side surfaces thereof facing the semiconductor layer via the gate insulating films are adjacent to the insulating layer.

12 Claims, 41 Drawing Sheets

(51) Int. Cl.
*H01L 29/06* (2006.01)
*H01L 29/739* (2006.01)
*H01L 29/10* (2006.01)
*H01L 21/8222* (2006.01)
*H01L 21/768* (2006.01)
*H01L 21/308* (2006.01)
*H01L 21/306* (2006.01)
*H01L 21/321* (2006.01)

(52) U.S. Cl.
CPC .. *H01L 21/32105* (2013.01); *H01L 21/76895* (2013.01); *H01L 21/8222* (2013.01); *H01L 29/0619* (2013.01); *H01L 29/0653* (2013.01); *H01L 29/1095* (2013.01); *H01L 29/4236* (2013.01); *H01L 29/42376* (2013.01); *H01L 29/6634* (2013.01); *H01L 29/7397* (2013.01)

(58) Field of Classification Search
CPC ............ H01L 29/6634; H01L 29/7393; H01L 29/7395; H01L 29/7397; H01L 2924/13055; H01L 21/8222
See application file for complete search history.

(56) References Cited

U.S. PATENT DOCUMENTS

| | | | |
|---|---|---|---|
| 7,180,130 B2* | 2/2007 | Numazawa | H01L 21/28185 257/330 |
| 8,587,087 B2 | 11/2013 | Arai et al. | |
| 9,368,595 B2* | 6/2016 | Matsuura | H01L 29/7813 |
| 9,583,606 B2* | 2/2017 | Tsuyuki | H01L 29/7397 |
| 9,627,248 B2* | 4/2017 | Saito | H01L 21/76229 |
| 2004/0232522 A1* | 11/2004 | Shimizu | H01L 21/763 257/548 |
| 2005/0045960 A1* | 3/2005 | Takahashi | H01L 29/0696 257/368 |
| 2007/0059887 A1* | 3/2007 | Poelzl | H01L 29/407 438/270 |
| 2007/0210350 A1* | 9/2007 | Omura | H01L 23/4824 257/287 |
| 2008/0164517 A1* | 7/2008 | Ohta | H01L 29/66727 257/330 |
| 2009/0050932 A1 | 2/2009 | Lu et al. | |
| 2012/0025874 A1* | 2/2012 | Saikaku | H01L 29/1095 327/109 |
| 2012/0074459 A1* | 3/2012 | Ogura | H01L 29/0696 257/139 |
| 2012/0326207 A1* | 12/2012 | Yoshimochi | H01L 29/866 257/139 |
| 2013/0115739 A1* | 5/2013 | Akiyama | H01L 21/20 438/137 |
| 2013/0221402 A1* | 8/2013 | Ogura | H01L 29/7395 257/139 |
| 2013/0285140 A1 | 10/2013 | Kagawa et al. | |
| 2014/0070266 A1* | 3/2014 | Matsudai | H01L 29/7397 257/139 |
| 2014/0231866 A1* | 8/2014 | Senoo | H01L 29/36 257/139 |
| 2015/0340480 A1* | 11/2015 | Matsuura | H01L 29/7813 257/144 |
| 2016/0035844 A1* | 2/2016 | Uchimura | H01L 21/26513 257/330 |

* cited by examiner

SEMICONDUCTOR DEVICE INCLUDING AN IGBT AS A POWER TRANSISTOR AND A METHOD OF MANUFACTURING THE SAME

CROSS-REFERENCE TO RELATED APPLICATIONS

The disclosure of Japanese Patent Application No. 2014-162936 filed on Aug. 8, 2014 including the specification, drawings and abstract is incorporated herein by reference in its entirety.

BACKGROUND

The present invention relates to a semiconductor device and a method of manufacturing the same, and can be used appropriately for a semiconductor device having, e.g., an IGBT and a method of manufacturing the same.

Examples of a power semiconductor device include a semiconductor device including an IGBT.

Each of International Publication No. WO 2011/104850 (Patent Document 1) and Japanese Unexamined Patent Publication No. 2013-251467 (Patent Document 2) describes a technique concerning a semiconductor device including an IGBT.

RELATED ART DOCUMENTS

Patent Documents

Patent Document 1
    International Publication No. WO 2011/104850
Patent Document 2
    Japanese Unexamined Patent Publication No. 2013-251467

SUMMARY

In a semiconductor device including an IGBT also, it is desired to maximally improve the performance thereof. Alternatively, it is desired to improve the reliability of the semiconductor device. Alternatively, it is desired to improve each of the performance and reliability of the semiconductor device.

Other problems and novel features of the present invention will become apparent from a statement in the present specification and the accompanying drawings.

According to an embodiment, a semiconductor device includes a first insulating layer formed over a main surface of a semiconductor substrate having a first conductivity type, a first semiconductor layer formed over the semiconductor substrate in a trench formed in the first insulating layer, a pair of gate electrodes formed on both sides of the first semiconductor layer in the trench, and gate insulating films interposed between the first semiconductor layer and the pair of gate electrodes in the trench. The semiconductor device further includes a second insulating layer formed over the first insulating layer so as to cover the first semiconductor layer and the pair of gate electrodes, a first contact hole extending through the second insulating layer to reach the first semiconductor layer, and a first electrode portion formed in the first contact hole. The semiconductor device further includes a first semiconductor region formed on a back surface side of the semiconductor substrate and having a second conductivity type, and a back-side electrode formed over the back surface of the semiconductor substrate. Under the pair of gate electrodes, parts of the first insulating layer are present. The side surfaces of the pair of gate electrodes opposite to the side surfaces thereof facing the first semiconductor layer via the gate insulating films are adjacent to the first insulating layer. In an upper portion of the first semiconductor layer, a second semiconductor region having the second conductivity type is formed. Over the second semiconductor region, a third semiconductor region having the first conductivity type is formed. A portion of the first semiconductor layer which is located under the second semiconductor region has the first conductivity type. A lower surface of the second semiconductor region is shallower than lower surfaces of the pair of gate electrodes. The first electrode portion is electrically coupled to the second and third semiconductor regions.

According to the embodiment, in a method of manufacturing a semiconductor device including an IGBT, a first insulating layer is formed over a main surface of a semiconductor substrate. In the first insulating layer, a first trench is formed to extend through the first insulating layer and expose a part of the semiconductor substrate. Over the semiconductor substrate exposed at a bottom portion of the first trench, a first semiconductor layer is formed so as to be embedded in the first trench. In the first insulating layer, a pair of second trenches are formed on both sides of the first trench. At this stage, side surfaces of the first semiconductor layer are not exposed from the pair of second trenches and the pair of second trenches have not reached the semiconductor substrate. Then, the pair of second trenches are expanded to expose parts of the side surfaces of the first semiconductor layer, insulating films for gate insulating films are formed over the side surfaces of the first semiconductor layer exposed from the pair of second trenches, and respective gate electrodes are formed in the pair of second trenches.

According to the embodiment, it is possible to improve the performance of the semiconductor device.

Alternatively, it is possible to improve the reliability of the semiconductor device.

Alternatively, it is possible to improve each of the performance and reliability of the semiconductor device.

DETAILED DESCRIPTION

Figure 1:
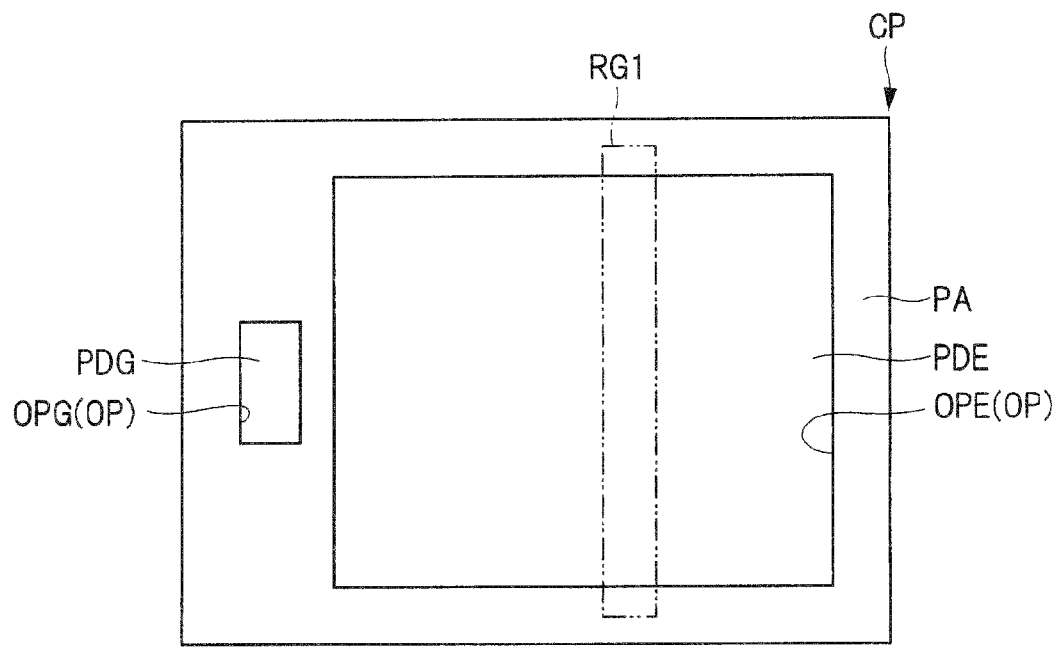
FIG. 1 is an overall plan view of a semiconductor device in an embodiment.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are mentioned, they are not limited to specified numbers unless particularly explicitly described otherwise or unless they are obviously limited to the specified numbers in principle. The number and the like of the elements may be not less than or not more than the specified numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are mentioned in the following embodiments, the shapes, positional relationships, and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross-sectional view for improved clarity of illustration, while even a plan view may be hatched for improved clarity of illustration.

Embodiment 1

<About Overall Structure of Semiconductor Device>

Referring to the drawings, a semiconductor device in the present embodiment will be described.

Figure 2:
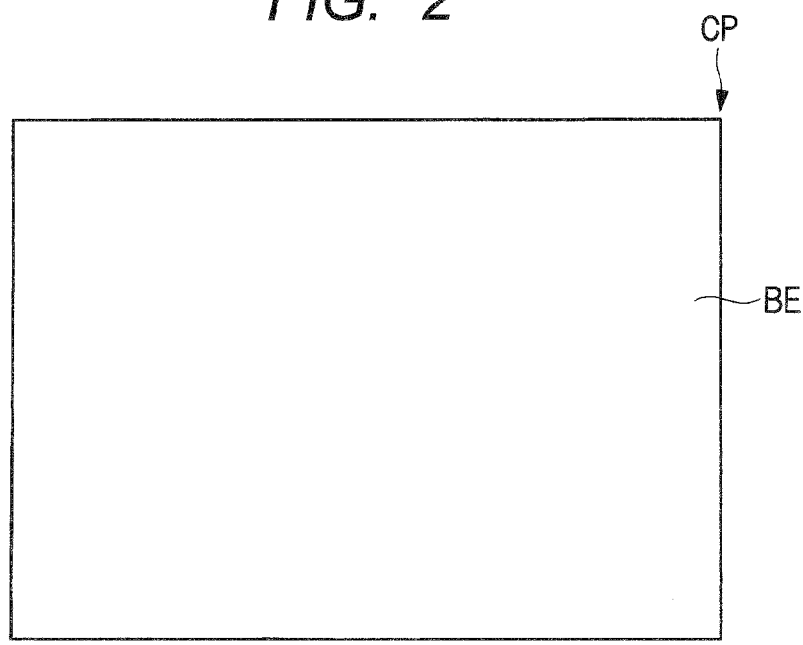
FIG. 2 is an overall plan view of the semiconductor device in the embodiment.

FIGS. 1 and 2 are overall plan views of a semiconductor device (semiconductor chip) CP in the present embodiment, of which FIG. 1 shows the overall plan view of the upper surface side of the semiconductor device CP and FIG. 2 shows the overall plan view of the back surface (lower surface) side of the semiconductor device CP.

As shown in FIGS. 1 and 2, the semiconductor device (semiconductor chip) CP in the present embodiment has an upper surface as a main surface and a back surface (lower surface) as a main surface opposite to the upper surface. FIG. 1 shows the upper surface of the semiconductor device CP. FIG. 2 shows the back surface of the semiconductor device CP.

As shown in FIG. 1, the semiconductor device CP has, on the upper surface side, an emitter pad PDE as a first terminal, and a gate pad PDG as a control terminal. As shown in FIG. 2, the semiconductor device CP also has, on the back surface side, a back-side electrode BE as a second terminal. Each of the emitter pad PDE, the gate pad PDG, and the back-side electrode BE can function as the external coupling terminal of the semiconductor device CP.

Specifically, in the top-side outermost layer of the semiconductor device CP, an insulating film PA as a surface protective film is formed. From an emitter opening OPE provided in the insulating film PA, the emitter pad PDE is exposed. From a gate opening OPG provided in the insulating film PA, the gate pad PDG is exposed. In the back-side outermost layer of the semiconductor device CP, the back-side electrode BE is provided. The back-side electrode BE is formed over the entire back surface of the semiconductor device CP.

Figure 4:
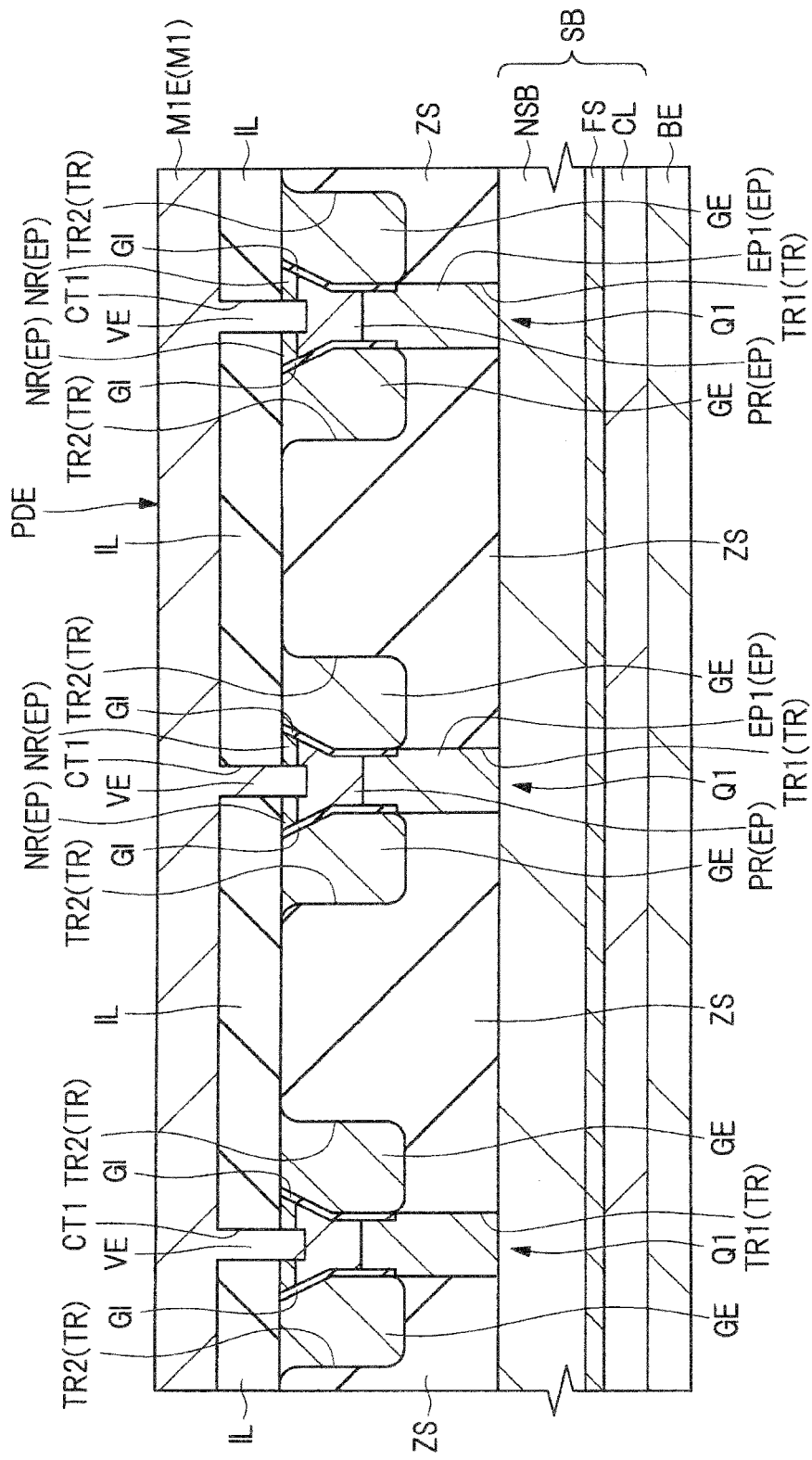
FIG. 4 is a main-portion cross-sectional view of the semiconductor device in the embodiment.

In the semiconductor substrate SB included in the semiconductor device CP, as a semiconductor element which controls electrical conduction between the first terminal (which is the emitter pad PDE herein) formed on the top side of the semiconductor device CP and a second terminal (which is the back-side electrode BE herein) formed on the back side of the semiconductor device CP, an IGBT is formed. Note that the semiconductor substrate SB included in the semiconductor device CP is not shown in FIGS. 1 and 2, but is shown in FIG. 4 described later. Accordingly, in the semiconductor device CP, by controlling the IGBT formed in the semiconductor substrate SB, the electrical conduction between the top-side first terminal and the back-side second terminal is controlled so that an electric current flows between the top-side first terminal and the back-side second terminal. Therefore, the semiconductor device CP can be used as, e.g., a switching element in which a large current flows. The gate pad PDG functions as a control terminal which controls the electrical conduction between the first and second terminals. Since the semiconductor element formed in the semiconductor device CP is the IGBT, the first terminal (which is the emitter pad PDE herein) on the top side of the semiconductor device CP is an emitter terminal, the second terminal (which is the back-side electrode BE herein) on the back side of the semiconductor device CP is a collector terminal, and the control terminal (gate pad PDG) on the top side of the semiconductor device CP is a gate terminal.

<About Internal Structure of Semiconductor Device>

Next, a description will be given of the internal structure of the foregoing semiconductor device (semiconductor chip) CP with reference to the drawings.

Figure 3:
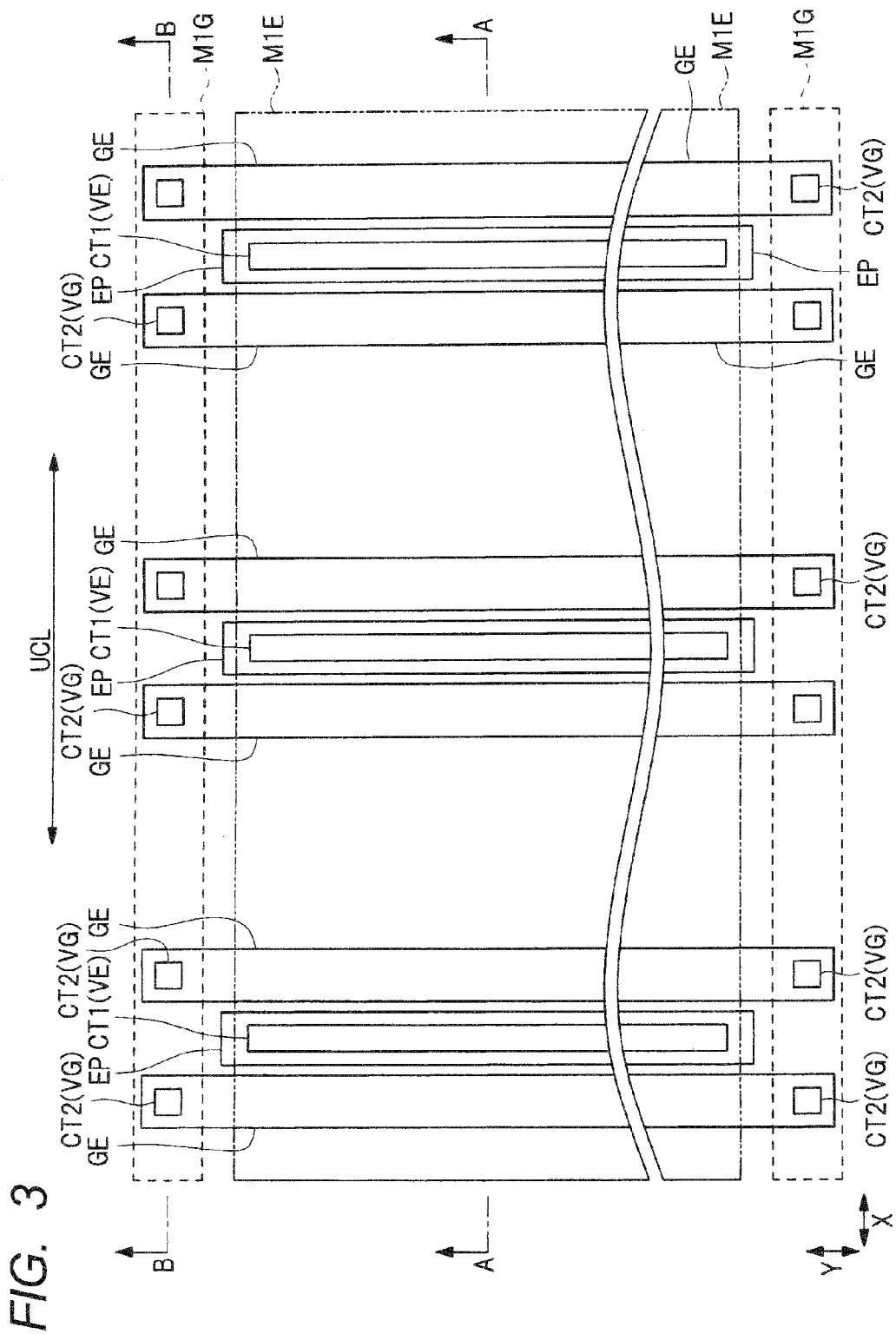
FIG. 3 is a main-portion plan view of the semiconductor device in the embodiment.
Figure 5:
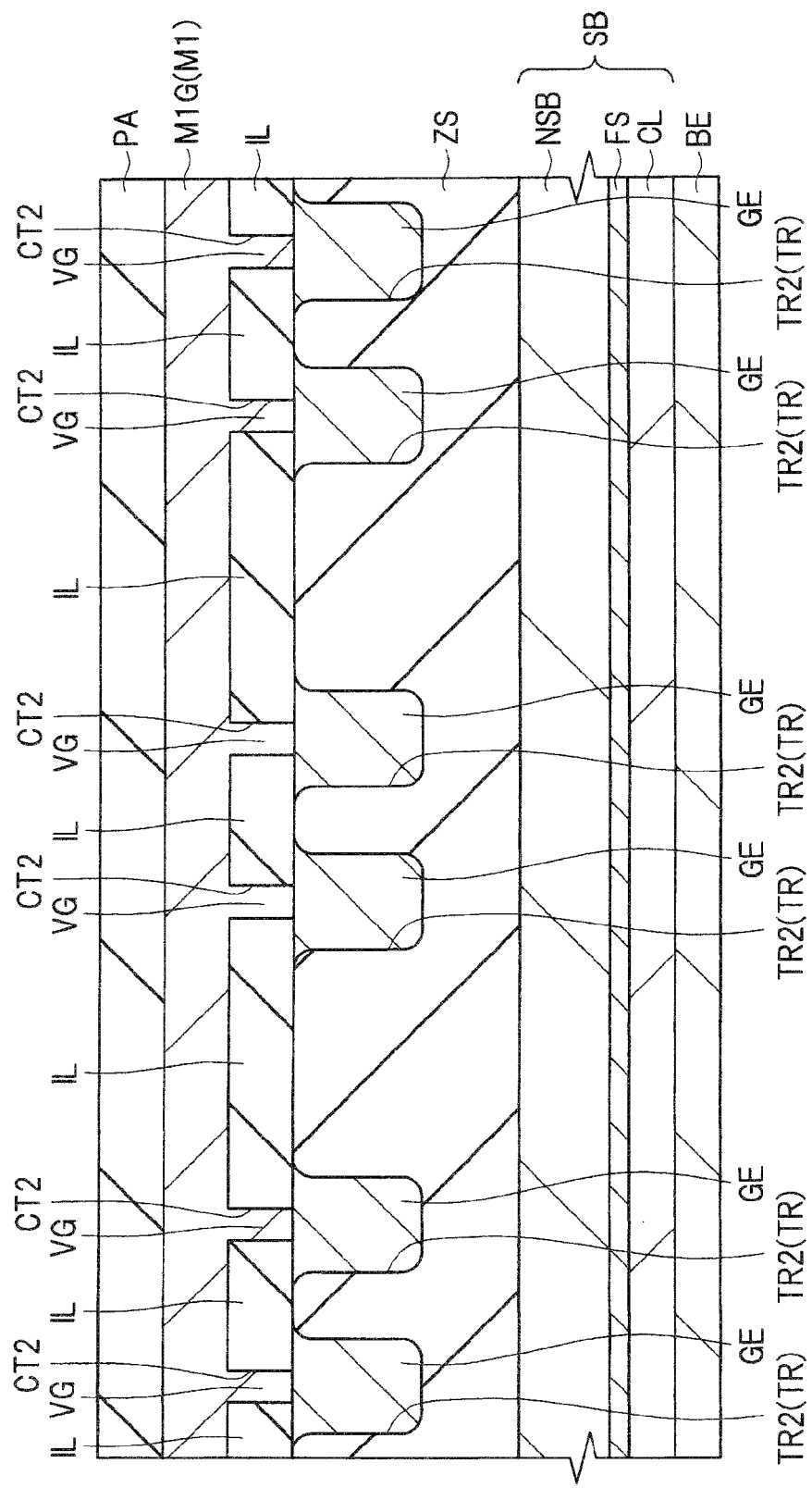
FIG. 5 is a main-portion cross-sectional view of the semiconductor device in the embodiment.
Figure 6:
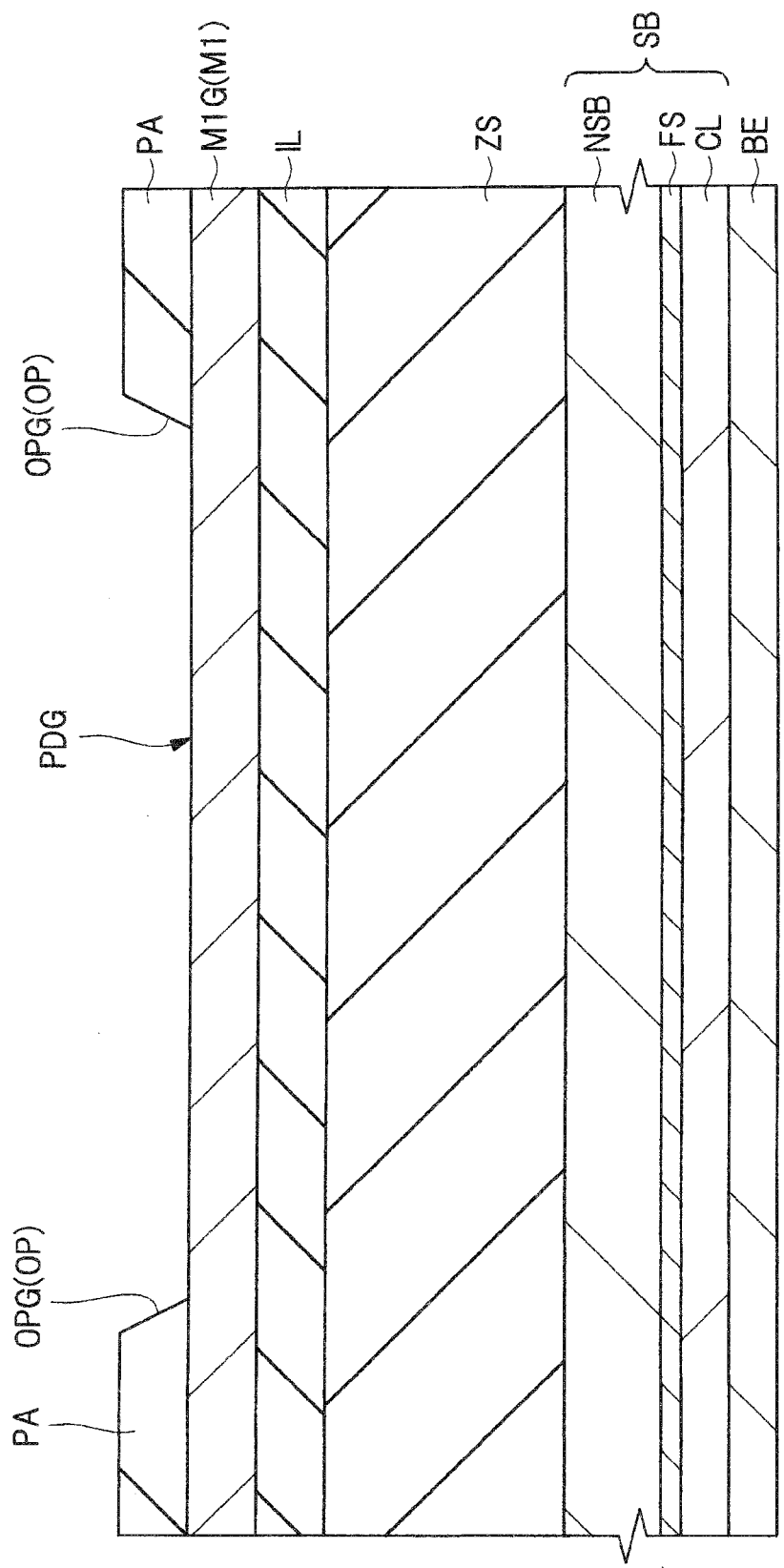
FIG. 6 is a main-portion cross-sectional view of the semiconductor device in the embodiment.
Figure 7:
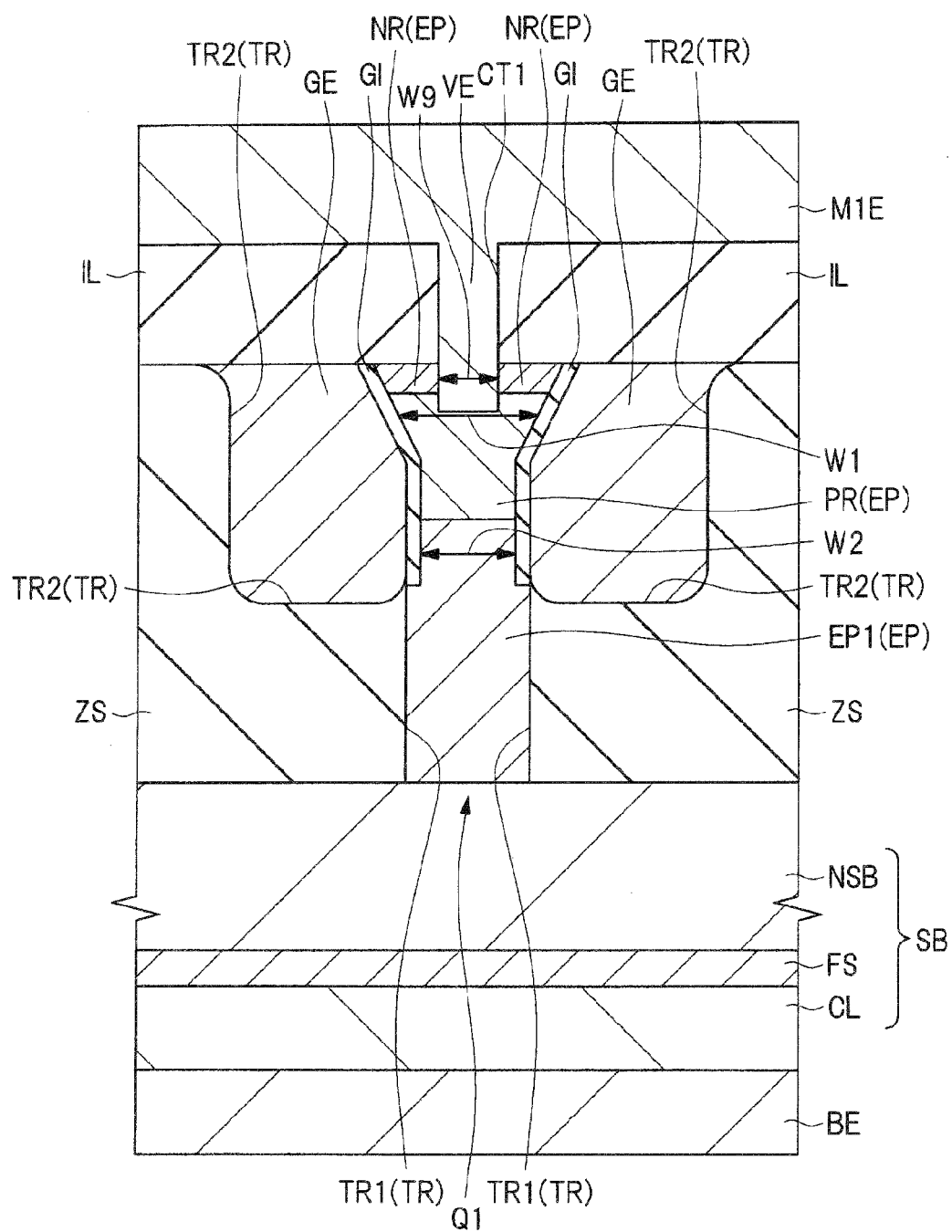
FIG. 7 is a partially enlarged cross-sectional view showing a part of FIG. 4 in enlarged relation.

FIG. 3 is a main-portion plan view of the semiconductor device CP in the present embodiment. FIGS. 4 to 6 are main-portion cross-sectional views of the semiconductor device CP in the present embodiment. FIG. 3 substantially corresponds to a plan view of a region RG1 shown in FIG. 1 described above. FIG. 4 substantially corresponds to a cross-sectional view along the line A-A in FIG. 3. FIG. 5 substantially corresponds to a cross-sectional view along the line B-B in FIG. 3. FIG. 6 corresponds to a cross-sectional view traversing the gate pad PDG. FIG. 7 is a partially enlarged cross-sectional view showing a part of FIG. 4 in enlarged relation and shows a unit transistor Q1. Note that, in FIG. 3, for improved clarity of illustration, an emitter wire M1E is shown by the two-dot-dash line, gate wires M1G are shown by the broken lines, and semiconductor layers EP, gate electrodes GE, and contact holes CT1 and CT2 are shown by the solid lines.

The semiconductor device CP in the present embodiment includes the IGBT (Insulated Gate Bipolar Transistor). Accordingly, in the semiconductor substrate SB included in the semiconductor device CP, the IGBT is formed. The IGBT formed in the semiconductor substrate SB can also be regarded as a power transistor (power semiconductor element). Therefore, it can also be said that the semiconductor device CP is a semiconductor device including the IGBT as the power transistor (power semiconductor element).

As also shown in FIGS. 4 to 7, the semiconductor substrate SB included in the semiconductor device CP is made of n-type monocrystalline silicon into which an n-type impurity such as, e.g., phosphorus (P) has been introduced. As the semiconductor substrate SB, a semiconductor substrate (so-called epitaxial wafer) in which, over a substrate main body made of an n-type or p-type monocrystalline silicon substrate, an epitaxial semiconductor layer made of $n^-$-type monocrystalline silicon having an impurity concentration lower than that of the substrate main body is formed can also be used.

In the main surface of the semiconductor substrate SB, the trench-gate IGBT forming the power transistor (power semiconductor element) is formed. Specifically, in the transistor cell region of the main surface of the semiconductor substrate SB, a unit structure (unit cell structure or repetition unit) UCL shown in FIG. 3 is repeated in an X-direction. Of each of the unit structures UCL, the unit transistor (unit transistor cell) Q1 is formed. Thus, in the transistor cell region of the main surface of the semiconductor substrate SB, the plurality of unit transistors Q1 are formed. The plurality of unit transistors Q1 formed in the semiconductor substrate SB are coupled in parallel to each other to form one power transistor. It is assumed herein that the two-dimensional region of the main surface of the semiconductor substrate SB where the plurality of unit transistors Q1 included in the power transistor are formed (placed) is referred to as the transistor cell region. Each of the unit transistors Q1 is formed of the vertical trench-gate IGBT. Note that the trench-gate IGBT is an IGBT having a trench-gate structure (gate electrode structure embedded in a trench).

At the bottom portion of the semiconductor substrate SB, i.e., on the back side of the semiconductor substrate SB, a p-type semiconductor region (p-type collector layer) CL having a predetermined thickness is formed. The p-type semiconductor region CL is a p-type collector layer (p-type collector region). The p-type semiconductor region CL can be formed over the entire back surface of the semiconductor substrate SB. Over the entire back surface of the semiconductor substrate SB, a back-side electrode (collector electrode or back-side collector electrode) BE is formed so as to come in contact with the p-type semiconductor region CL. The back-side electrode BE is a collector electrode. The back-side electrode BE can also be regarded as a terminal (collector terminal).

On the side of the p-type semiconductor region CL opposite to the side thereof adjacent to the back-side electrode BE, an n-type semiconductor region (field stop layer) FS is formed so as to come in contact with the p-type semiconductor region CL. The n-type semiconductor region FS has an impurity concentration higher than that of the semiconductor substrate SB (n-type substrate region NSB). That is, the p-type semiconductor region CL is adjacent to the back-side electrode BE and is also adjacent to the n-type semiconductor region FS on the side thereof opposite to the side thereof adjacent to the back-side electrode BE. In the semiconductor substrate SB, the laminated structure including the p-type semiconductor region CL, and the n-type semiconductor region FS can be formed over the entire back surface of the semiconductor substrate SB.

The back-side electrode BE can also be formed of a laminated film including, e.g., an aluminum (Al) layer, a titanium (Ti) layer, a nickel (Ni) layer, and a gold (Au) layer which are shown in order of increasing distance from the back surface of the semiconductor substrate SB. Instead of the aluminum (Al) layer, an Al—Si alloy layer can also be used. The back-side electrode BE is in contact with and electrically coupled to the p-type semiconductor region CL.

It is assumed that the main surface of the semiconductor substrate SB opposite to the main surface thereof formed with an insulating layer ZS is referred to as the back surface of the semiconductor substrate SB.

Over the main surface (entire main surface) of the semiconductor substrate SB, the insulating layer (insulating film) ZS is formed. Preferably, the insulating layer ZS is made of a silicon dioxide layer.

In the insulating layer ZS, trenches TR are formed to extend in the thickness direction of the insulating layer ZS. In each of the trenches TR, the semiconductor layer (epitaxial semiconductor layer) ER, the pair of (two) gate electrodes GE formed on both sides of the semiconductor layer EP such that the semiconductor layers EP are interposed therebetween, and gate insulating films GI interposed between the semiconductor layer EP and the pair of gate electrodes GE are formed (embedded).

The semiconductor layers EP are formed over the semiconductor substrate SB exposed at the bottom portions of the trenches TR. That is, each of the semiconductor layers EP is an epitaxial layer (epitaxial semiconductor layer) formed over the semiconductor substrate SB exposed at the bottom portion of the trench TR in the trench TR and made of, e.g., monocrystalline silicon into which an impurity has been introduced.

The trenches TR include trench portions (trenches) TR1 extending through the insulating layer ZS to reach the semiconductor substrate SB, and trench portions (trenches) TR2 located on both sides of the trench portions TR1 (on both sides thereof in the X-direction) and each having a part of the insulating layer ZS remaining immediately thereunder. Consequently, in the trenches TR, the semiconductor substrate SB is exposed at the bottom portions of the trench portions TR1, while the trench portions TR2 on both sides of the trench portions TR1 have not reached the semiconductor substrate SB. Immediately under each of the trench portions TR2, a part of the insulating layer ZS along the thickness thereof remains. That is, the bottom surface of the trench portion TR2 is located above the upper surface of the semiconductor substrate SB and, between the bottom surface of the trench portion TR2 and the semiconductor substrate SB, a part of the insulating layer ZS is interposed.

Since the trench portions TR2 are present on both sides of the trench portions TR1, the bottom surfaces of the trench portions TR2 and the side surfaces (side walls) of the trench portions TR1 are connected. Each of the side surfaces (side walls) and bottom surfaces of the trench portions TR2 is formed of the insulating layer ZS. Each of the side surfaces (side walls) of the trench portions TR1 is formed of the insulating layer ZS. The bottom surfaces of the trench portions TR1 are formed of the top surface (upper surface) of the semiconductor substrate SB.

In the trenches TR, the semiconductor layers EP are formed over the semiconductor substrate SB exposed at the bottom portions of the trench portions TR1. In each of the trench portions TR1, the semiconductor layer EP is embedded, while the upper surface of the semiconductor layer EP (upper surface of the portion of the semiconductor layer EP where the contact hole CT1 is not formed, i.e., the upper surface of an $n^+$-type semiconductor region NR) is at substantially the same height position as that of the upper surface of the portion of the insulating layer ZS where the trench TR is not formed. The gate electrodes GE are formed in the trench portions TR2. In the trenches TR, the gate insulating films GI are interposed between the gate electrodes GE and the semiconductor layers EP.

In each the trenches TR, over the semiconductor substrate SB exposed at the bottom portion of the trench TR (specifically, at the bottom portion of each of the trench portions TR1), the semiconductor layer EP is formed to provide the state where the pair of gate electrodes GE are formed on both sides of the semiconductor layer EP such that the semiconductor layer EP is interposed between the pair of gate electrodes GE. That is, in each of the trenches TR, the semiconductor layer EP and the pair of gate electrodes GE are embedded to provide the state where the semiconductor layer EP is interposed between the pair of gate electrodes GE. That is, since the trench portions TR2 are formed on both sides of each of the trench portions TR1, the semiconductor layer EP is formed in the trench portion TR1, and the gate electrodes GE are formed in the trench portions TR2, the state is provided where the gate electrodes GE are formed on both sides of the semiconductor layer EP. In other words, the pair of trench portions TR2 are disposed on both sides of each of the trench portions TR1 and the trench portion TR1 is connected to the trench portions TR2 on both sides thereof. The portion of each of the trenches TR in which the semiconductor layer EP is formed (embedded) corresponds to the trench portion TR1. The portions of the trench TR in which the gate electrodes GE are formed (embedded) correspond to the trench portions TR2. The upper surface of each of the gate electrodes GE is at substantially the same height position as that of the upper surface of the portion of the insulating layer ZS where the trench TR is not formed. Accordingly, the upper surface of the semiconductor layer EP (the upper surface of the portion of the semiconductor layer EP where the contact hole CT1 is not formed, i.e., the upper surface of the $n^+$-type semiconductor region NR) and the upper surface of each of the pair of gate electrodes GE formed on both sides of the semiconductor layer EP are at substantially the same height positions.

However, the gate electrodes GE and the semiconductor layers EP are not in contact with each other, and the gate insulating films GI are interposed therebetween. That is, over the side surfaces of the portion of the semiconductor layer EP which is adjacent to the gate electrodes GE, the gate insulating films GI each made of a silicon dioxide film or the like are formed to provide the state where, between the gate electrodes GE and the semiconductor layer EP, the gate insulating films GI are interposed. As a result, the state is provided where the gate electrodes GE are adjacent to the semiconductor layer EP via the gate insulating films GI. Each of the gate electrodes GE is made of a conductive film (conductor film) embedded in the trench portion TR2. For example, the gate electrode GE is made of a polycrystalline silicon film (doped silicon film) into which, e.g., an n-type impurity (e.g., phosphorus) has been introduced. The side surfaces of the gate electrodes GE opposite to the side surfaces thereof facing the semiconductor layer EP via the gate insulating films GI are adjacent to the insulating layer ZS.

Since the trench portions TR2 have not reached the semiconductor substrate SB, the gate electrodes GE have not reached the semiconductor substrate SB. Under each of the gate electrodes GE, a part of the insulating layer ZS is present. That is, between the bottom surface (lower surface) of the gate electrode GE and the upper surface of the semiconductor substrate SB, a part of the insulating layer ZS is present. The thickness of the portion of the insulating layer ZS which is present under the gate electrode GE (i.e., the thickness of the insulating layer ZS between the lower surface of the gate electrode GE and the upper surface of the semiconductor substrate SB) is sufficiently larger than the thickness of each of the gate insulating films GI and is, e.g., not less than 10 times the thickness of the gate insulating film GI.

On the other hand, each of the trench portions TR1 has reached the semiconductor substrate SB. Accordingly, the bottom surface (lower surface) of the semiconductor layer EP is in contact with the semiconductor substrate SB and the insulating layer ZS is not interposed between the bottom surface (lower surface) of the semiconductor layer EP and the upper surface of the semiconductor substrate SB. As a result, in the range of the thickness of the insulating layer ZS in which the gate electrodes GE are formed, the semiconductor layer EP is interposed between the pair of gate electrodes GE via the gate insulating films GI and consequently faces the gate electrodes GE via the gate insulating films GI. However, in the region deeper than the bottom surfaces (lower surfaces) of the gate electrodes GE, the semiconductor layer EP is not interposed between the gate electrodes GE. This provides the state where the semiconductor layer EP is not adjacent to the gate electrodes GE and the side surfaces of the semiconductor layer EP are surrounded by (covered with) the insulating layer ZS.

The two-dimensional layout of the semiconductor layers EP and the gate electrodes GE is as follows. Note that the X-direction and a Y-direction are directions parallel with the main surface of the semiconductor substrate SB and crossing each other preferably at right angles.

As shown in FIG. 3, in the transistor cell region, the plurality of semiconductor layers EP extending in the Y-direction are arranged in the X-direction at predetermined intervals (with a predetermined pitch). That is, in the transistor cell region, each of the semiconductor layers EP extends in the Y-direction, and the plurality of semiconductor layers EP extending in the Y-direction are arranged in the X-direction at predetermined intervals (with a predetermined pitch). On both sides of each of the semiconductor layers EP (on both sides thereof in the X-direction) extending in the Y-direction, the gate electrodes GE extending in the Y-direction are disposed. That is, for one of the semiconductor layers EP extending in the Y-direction, the two (pair of) gate electrodes GE extending in the Y-direction are provided. Between the two (pair of) gate electrodes GE each extending in the Y-direction, the semiconductor layer EP extending in the Y-direction is interposed in the X-direction. As a result, a plurality of structures in each of which the semiconductor layer EP extending in the Y-direction is interposed between the two (pair of) gate electrodes GE extending in the X-direction are arranged in the X-direction at predetermined intervals (with a given pitch). Thus, the Y-direction is the extending direction of the semiconductor layer EP and also the extending direction of each of the gate electrodes GE, while the X-direction is the direction in which the semiconductor layer EP is interposed between the pair of gate electrodes GE.

Note that, in the case in FIG. 3, the two (pair of) gate electrodes GE formed on both sides of the semiconductor layer EP such that the semiconductor layer EP extending in the Y-direction is interposed therebetween are not integrally coupled (connected) to each other. However, the two (pair of) gate electrodes GE formed on both sides of the semiconductor layer EP such that the semiconductor layer EP extending in the Y-direction is interposed therebetween are electrically coupled to each other via gate via portions VG and the gate wires M1G.

In another form, the two (pair of) gate electrodes GE formed on both sides of the semiconductor layer EP (on both sides thereof in the X-direction) such that the semiconductor layer EP extending in the Y-direction is interposed therebetween may also be integrally coupled (connected) to each other. In that case, for example, the two (pair of) gate electrodes GE formed on both sides of the semiconductor layer EP such that the semiconductor layer EP extending in the Y-direction is interposed therebetween can be integrally coupled (connected) to each other at the end portions of the gate electrodes GE (end portions thereof in the Y-direction).

As shown in FIGS. 4 and 7, in the upper portion (upper-layer portion) of each of the semiconductor layers EP, a p-type semiconductor region (p-type base layer) PR is formed. Over the p-type semiconductor region PR, the $n^+$-type semiconductor region (n-type emitter layer) NR is formed. That is, in each of the semiconductor layers EP, in the outermost portion of the semiconductor layer EP, the $n^+$-type semiconductor region NR is formed and, under the $n^+$-type semiconductor region NR, the p-type semiconductor region PR is present. The p-type semiconductor region PR is the p-type base layer (p-type base region). The $n^+$-type semiconductor region NR is the n-type emitter layer (n-type emitter region). By the application of a voltage to each of the gate electrodes GE, in the portion of the p-type semiconductor region PR which is located between the n$^+$-type semiconductor region NR and an n-type semiconductor region EP1 to face the gate electrodes GE via the gate insulating films GI, a channel (n-type inversion layer) is formed. Accordingly, the p-type semiconductor region PR can also be regarded as a p-type channel formation layer.

The bottom surface (lower surface) of the p-type semiconductor region PR is shallower than the bottom surface of each of the trench portions TR2 and accordingly shallower than the bottom surface (lower surface) of each of the gate electrodes GE. In other words, the bottom surface of the trench portion TR2 is deeper than the bottom surface of the p-type semiconductor region PR and, accordingly, the bottom surface (lower surface) of the gate electrode GE is deeper than the bottom surface (lower surface) of the p-type semiconductor region PR.

Before the p-type semiconductor region PR and the n$^+$-type semiconductor region NR are formed, the entire semiconductor layer EP is an n-type semiconductor layer. However, by implanting a p-type impurity into the n-type semiconductor layer EP, the p-type semiconductor region PR having a conductivity type opposite to that of the n-type semiconductor layer EP is formed. By further implanting an n-type impurity, the n$^+$-type semiconductor region NR having the same conductivity type as that of the n-type semiconductor layer EP and an impurity concentration higher than that of the n-type semiconductor layer EP is formed. Consequently, the portion of the semiconductor layer EP which is located under the p-type semiconductor region PR has the n-type conductivity type.

It is assumed herein that the portion of the semiconductor layer EP which is located under the p-type semiconductor region PR is referred to as the n-type semiconductor region EP1. Accordingly, the semiconductor layer EP includes the n-type semiconductor region EP1, the p-type semiconductor region PR present over the n-type semiconductor region EP1, and the n$^+$-type semiconductor region NR present over the p-type semiconductor region PR.

Under the n$^+$-type semiconductor region NR, the p-type semiconductor region PR is present. Under the p-type semiconductor region PR, the n-type semiconductor region EP1 is present. Under the n-type semiconductor region EP1, the n-type semiconductor substrate SB (i.e., the n-type substrate region NSB) is present.

The lower surface of the p-type semiconductor region PR (i.e., the interface between the p-type semiconductor region RP and the n-type semiconductor region EP1) is shallower than the lower surfaces of the gate electrodes GE. The gate electrodes GE are adjacent to (face) the n$^+$-type semiconductor region NR, the p-type semiconductor region PR, and a part of the n-type semiconductor region EP1 via the gate insulating films GI.

It is assumed herein that, of the semiconductor substrate SB, the region where an n-type state when the semiconductor substrate SB is formed as an n-type semiconductor substrate is maintained is referred to as the n-type substrate region NSB. As a result, under the n-type substrate region NSB, the n-type semiconductor region (field stop layer) FS having the impurity concentration higher than that of the n-type semiconductor region NSB is present. Under the n-type semiconductor region FS, the p-type semiconductor region (p-type collector layer) CL is present. Since the semiconductor layer EP is formed over the portion of the n-type substrate region NSB which is exposed at the bottom portion of the trench portion TR1, under the n-type semiconductor region EP1, the n-type substrate region NSB is present. The impurity concentration (n-type impurity concentration) of the n-type semiconductor region EP1 is preferably higher than the impurity concentration (n-type impurity concentration) of the n-type substrate region NSB.

The n-type substrate region NSB and the n-type semiconductor region EP1 serve as an n-type base layer (n-type base region). The n-type substrate region NSB can also be regarded as an n-type drift layer. The n-type semiconductor region EP1 can also be regarded as a hole barrier layer. On the other hand, the n-type semiconductor region FS can function as a field stop layer which prevents a depletion layer extending from the top side of the semiconductor substrate SB from reaching the p-type semiconductor region (p-type collector layer) CL.

The "depth" or "depth position" corresponds to a distance (distance in a direction perpendicular to the main surface of the semiconductor substrate SB) from the upper surface of the insulating layer ZS formed over the main surface of the semiconductor substrate SB. Here, the upper surface of the insulating layer ZS as a reference plane for the depth corresponds to the upper surface of the insulating layer ZS before the trenches TR (trenches TR1a and TR2a) are formed. Accordingly, after the trenches TR (TR1a and TR2a) are formed, the extension surface of the upper surface of the region of the insulating layer ZS where the trenches TR (trenches TR1a and TR2a) are not formed serve as the reference plane for the depth. It is assumed that the side of the insulating layer ZS closer to the upper surface thereof is a shallow side and the side of the insulating layer ZS more distant from the upper surface thereof (in other words, the side of the insulating layer ZS closer to the back surface of the semiconductor substrate SB) is a deeper side.

On the other hand, the "height" or "height position" corresponds to a distance (distance in a direction perpendicular to the main surface of the semiconductor substrate SB) from the main surface (main surface over which the insulating layer ZS is formed) of the semiconductor substrate SB serving as the reference surface. It is assumed that the side of the semiconductor substrate SB more distant from the back surface thereof is a higher side and the side of the semiconductor substrate SB closer to the back surface thereof is a lower side. Accordingly, the state where, e.g., "the lower surface of the p-type semiconductor region PR is shallower than the lower surfaces of the gate electrodes GE" is substantially synonymous to the state where "the height position of the lower surface of the p-type semiconductor region PR is higher than the height positions of the lower surfaces of the gate electrodes GE".

Next, a description will be given of a structure of layers located above the insulating layer ZS.

As shown in FIGS. 4 to 7, over the insulating layer ZS, an insulating layer (insulating film or interlayer insulating film) IL is formed so as to cover the gate electrodes GE and the semiconductor layers EP. The insulating layer IL is the interlayer insulating film and made of, e.g., a silicon dioxide layer.

In the insulating layer IL, the contact holes (openings or through holes) CT1 and CT2 are formed.

The contact holes CT1 are emitter contact holes and formed (disposed) over the respective semiconductor layers EP. The contact holes CT1 extend through the insulating layer IL to reach the semiconductor layers EP. As can also be seen from FIGS. 3, 4, and 7, the contact holes CT1 are included in the semiconductor layers EP in plan view.

Note that such wording as "in plan view" or "when viewed in plan view" is used to mean that an object is viewed in a plane parallel with the main surface of the semiconductor substrate SB.

As shown in FIGS. 4 and 7, each of the contact holes CT1 extends through the insulating layer IL to further cut into a part of the semiconductor layer EP. From the contact hole CT1, the $n^+$-type semiconductor region NR and the p-type semiconductor region PR are exposed. That is, the contact hole CT1 extends through the insulating layer IL to further extend through the $n^+$-type semiconductor region NR. The bottom surface of the contact hole CT1 has reached the p-type semiconductor region PR. Consequently, the bottom surface of the contact hole CT1 is located midway of the thickness of the p-type semiconductor region PR. Under the bottom surface of the contact holes CT1, the p-type semiconductor region PR is present. However, the contact hole CT1 has not reached the n-type semiconductor region EP1. Accordingly, the bottom surface of the contact hole CT1 is at a position deeper than the bottom surface of the $n^+$-type semiconductor region NR (i.e., the boundary surface between the $n^+$-type semiconductor region NR and the p-type semiconductor region PR) and shallower than the bottom surface of the p-type semiconductor region PR (i.e., the boundary surface between the p-type semiconductor region PR and the n-type semiconductor region EP1).

The contact holes CT2 are gate contact holes. As can also be seen from FIGS. 3 and 5, the contact holes CT2 are disposed over the gate electrodes GE. Note that the gate contact holes CT2 need to be provided at positions not overlapping the emitter contact holes CT1 and the emitter wire M1E in plan view. Accordingly, as shown in plan view in FIG. 3, in the vicinities of the respective end portions of the gate electrodes GE extending in the Y-direction (end portions thereof in the Y-direction), the gate contact holes CT2 are formed over the gate electrodes GE. As shown in FIG. 5, the contact holes CT2 extend through the insulating layer IL. The bottom surfaces of the contact holes CT2 have reached the gate electrodes GE. Consequently, at the bottom portions of the contact holes CT2, parts of the gate electrodes GE are exposed.

As shown in FIGS. 4 to 7, over the insulating layer IL, wires M1 each made of a conductive film (conductor) are formed. The wires M1 include the emitter wire M1E and the gate wires M1G. The emitter wire M1E and the gate wires M1G are formed in the same layer in the same step. The emitter wire M1E and the gate wires M1G are isolated from each other and are not connected. That is, the emitter wire M1E and the gate wires M1G are not electrically coupled through a conductor.

The emitter wire M1E is formed over the insulating layer IL, while parts of the emitter wire M1E are embedded in the emitter contact holes CT1. It is assumed that, of the emitter wire M1E, the portions embedded in the emitter contact holes CT1 are referred to as emitter via portions VE. The emitter via portions VE can also be regarded as the via portions of the emitter wire M1E. Alternatively, the emitter via portions VE can also be regarded as electrodes (emitter electrodes). That is, in the contact holes CT1, the emitter via portions VE are formed as the emitter electrodes electrically coupled to the $n^+$-type semiconductor region NR and the p-type semiconductor region PR.

The gate wires M1G are formed over the insulating layer IL, while parts of the gate wires M1G are embedded in the gate contact holes CT2. It is assumed that, of the gate wires M1G, the portions embedded in the gate contact holes CT2 are referred to as gate via portions VG. The gate via portions VG can also be regarded as the via portions of the gate wires M1G. Alternatively, the gate via portions VG can also be regarded as electrodes (gate electrodes).

The description has been given heretofore of the case where the emitter via portions VE are formed integrally with the emitter wire M1E and the gate via portions VG are formed integrally with the gate wires M1G. In another form, it is also possible to form the emitter via portions VE (conductive portions embedded in the emitter contact holes CT1) separately from the emitter wire M1E (in another step) and form the gate via portions VG (conductive portions embedded in the gate contact holes CT2) separately from the gate wires M1G (in another step).

The emitter wire M1E is formed in substantially the entire two-dimensional region (transistor cell region) where the plurality of unit transistors Q1 are formed. The emitter contact holes CT1 are formed over the semiconductor layers EP interposed between the gate electrodes GE in plan view in the transistor cell region. The emitter contact holes CT1 extend through the insulating layer IL and the $n^+$-type semiconductor regions NR so that the bottom portions of the contact holes CT1 have reached the p-type semiconductor regions PR. Accordingly, the emitter via portions VE embedded in the emitter contact holes CT1 also extend through the insulating layer IL and the $n^+$-type semiconductor regions NR so that the bottom portions of the emitter via portions VE have reached the p-type semiconductor regions PR.

Since the side surfaces of the lower portions of the emitter via portions VE are in contact with the $n^+$-type semiconductor regions NR, the emitter via portions VE are in contact with and electrically coupled to the $n^+$-type semiconductor regions NR. On the other hand, since the bottom surfaces (lower surfaces) of the emitter via portions VE are in contact with the p-type semiconductor regions PR, the emitter via portions VE are in contact with and electrically coupled to the p-type semiconductor regions PR.

However, the contact holes CT1 have not reached the n-type semiconductor regions EP1 so that the bottom surfaces of the contact holes CT1 are at positions shallower than the lower surfaces of the p-type semiconductor regions PR (i.e., the boundary surfaces between the p-type semiconductor regions PR and the n-type semiconductor regions EP1). As a result, the n-type semiconductor regions EP1 are not exposed from the contact holes CT1 and the emitter via portions VE are not in contact with the n-type semiconductor regions EP1.

Note that, in the case in FIGS. 4 and 7, the emitter via portions VE are in direct contact with the p-type semiconductor regions PR. In another form, it is also possible to provide $p^+$-type semiconductor regions having impurity concentrations higher than those of the p-type semiconductor regions PR at positions in contact with the bottom surfaces of the emitter via portions VE and included in the p-type semiconductor regions PR and electrically couple the emitter via portions VE to the p-type semiconductor regions PR via the $p^+$-type semiconductor regions. In the case where the $p^+$-type semiconductor regions are interposed between the emitter via portions VE and the p-type semiconductor regions PR, the contact resistance of each of the emitter via portions VE can be reduced. This allows low-resistance coupling between the emitter via portions VE and the p-type semiconductor regions PR.

Thus, the via portions of the emitter wire M1E, i.e., the emitter via portions VE are electrically coupled to both of the $n^+$-type semiconductor regions NR and the p-type semiconductor regions PR. Consequently, the emitter wire M1E is electrically coupled to both of the n+-type semiconductor regions NR and the p-type semiconductor regions PR. That is, the n+-type semiconductor regions NR and the p-type semiconductor regions PR are electrically coupled to the emitter wire M1E via the emitter via portions VE.

The emitter contact holes CT1 are formed over the individual semiconductor layers EP in the transistor cell region. Accordingly, the plurality of contact holes CT1 are formed in the transistor cell region. Through the emitter via portions VE embedded in the plurality of contact holes CT1, the n-type emitter regions (n+-type semiconductor regions NR) and the p-type base regions (p-type semiconductor regions PR) of the plurality of unit transistors Q1 provided in the transistor cell region are electrically coupled to the common emitter wire M1E. Thus, through the emitter via portions VE, the emitter wire M1E is electrically coupled to the n-type emitter regions (n+-type semiconductor regions NR) and the p-type base regions (p-type semiconductor regions PR) of the plurality of unit transistors Q1 provided in the transistor cell region.

The gate wires M1G are formed at positions not overlapping the emitter wire M1E in plan view. Consequently, the gate wires M1G are formed around the transistor region in plan view. In the vicinities of the end portions of the individual gate electrodes GE extending in the Y-direction (end portions thereof in the Y-direction), the gate contact holes CT2 are formed over the gate electrodes GE. Accordingly, the gate via portions VG are disposed over the gate electrodes GE to be in contact with and electrically coupled to the gate electrodes GE. As a result, the individual gate electrodes GE are electrically coupled to the gate wires M1G via the gate via portions VG. Thus, the gate wires M1G are electrically coupled to the gate electrodes GE of the plurality of unit transistors Q1 provided in the transistor cell region via the gate via portions VG.

In the present embodiment, around the transistor cell region, the gate contact holes CT2 and the gate via portions VG to be embedded therein are disposed over the gate electrodes GE embedded in the trench portions TR2. Thus, the gate electrodes GE embedded in the trench portions TR2 are coupled to the gate via portions VG. In another embodiment, it is also possible to allow gate lead-out wire portions formed integrally with the gate electrodes GE to extend over the insulating layer ZS outside the trench portions TR2, dispose the gate contact holes CT2 and the gate via portions VG to be embedded therein over the gate lead-out wire portions, and thus couple the gate lead-out wire portions to the gate via portions VG. In that case, the gate electrodes GE are electrically coupled to the gate wires M1G through the gate lead-out wire portions and the gate via portions VG.

Each of the emitter via portions VE and the gate via portions VG is made of a conductor showing metal conduction and can be regarded as an electrode (electrode portion). Specifically, each of the emitter via portions VE can be regarded as an emitter electrode, while each of the gate via portions VG can be regarded as a gate electrode.

The wires M1 (the gate wires M1G and the emitter wire M1E) are covered with the insulating film PA for surface protection. That is, over the insulating layer IL, the insulating film PA is formed so as to cover the wires M1 (the gate wires M1G and the emitter wire M1E). The insulating film PA is a film (insulating film) in the uppermost layer of the semiconductor device CP.

In the insulating film PA, a plurality of openings OP are formed. From the individual openings OP, parts of the wires M1 are exposed. The wires M1 exposed from the openings OP serve as bonding pads (pad electrodes).

That is, the emitter wire M1E exposed from the emitter opening OPE, which is among the openings OP formed in the insulating film PA, forms the emitter pad PDE as an emitter bonding pad. Note that the emitter opening OPE is shown in FIG. 1 described above. The cross-sectional view in FIG. 4 corresponds to a cross-sectional view of the region in the emitter opening OPE.

Also, each of the gate wires M1G exposed from the gate opening OPG, which is among the openings OP formed in the insulating film PA, forms the gate pad PDG as a gate bonding pad. Note that the gate opening OPG is shown in FIGS. 1 and 6 described above.

The emitter opening OPE is an opening for forming the emitter bonding pad (which is the emitter pad PDE herein). The gate opening OPG is an opening for forming the gate bonding pad (which is the gate pad PDG herein).

In the semiconductor device having such a configuration, an operating current in the IGBT flows between the emitter pad PDE (emitter wire M1E) and the back-side electrode BE. That is, the operating current in the IGBT formed in the transistor cell region flows in the thickness direction of the semiconductor substrate SB. Accordingly, the IGBT formed in the transistor cell region is also a vertical transistor (vertical IGBT). The vertical transistor mentioned herein corresponds to a transistor in which an operating current flows in the thickness direction of a semiconductor substrate (direction generally perpendicular to the main surface of the semiconductor substrate). The gate pad PDG is a terminal for controlling electrical conduction between the emitter pad PDE (emitter wire M1E) and the back-side electrode BE.

<About Manufacturing Process of Semiconductor Device>

Figure 8:
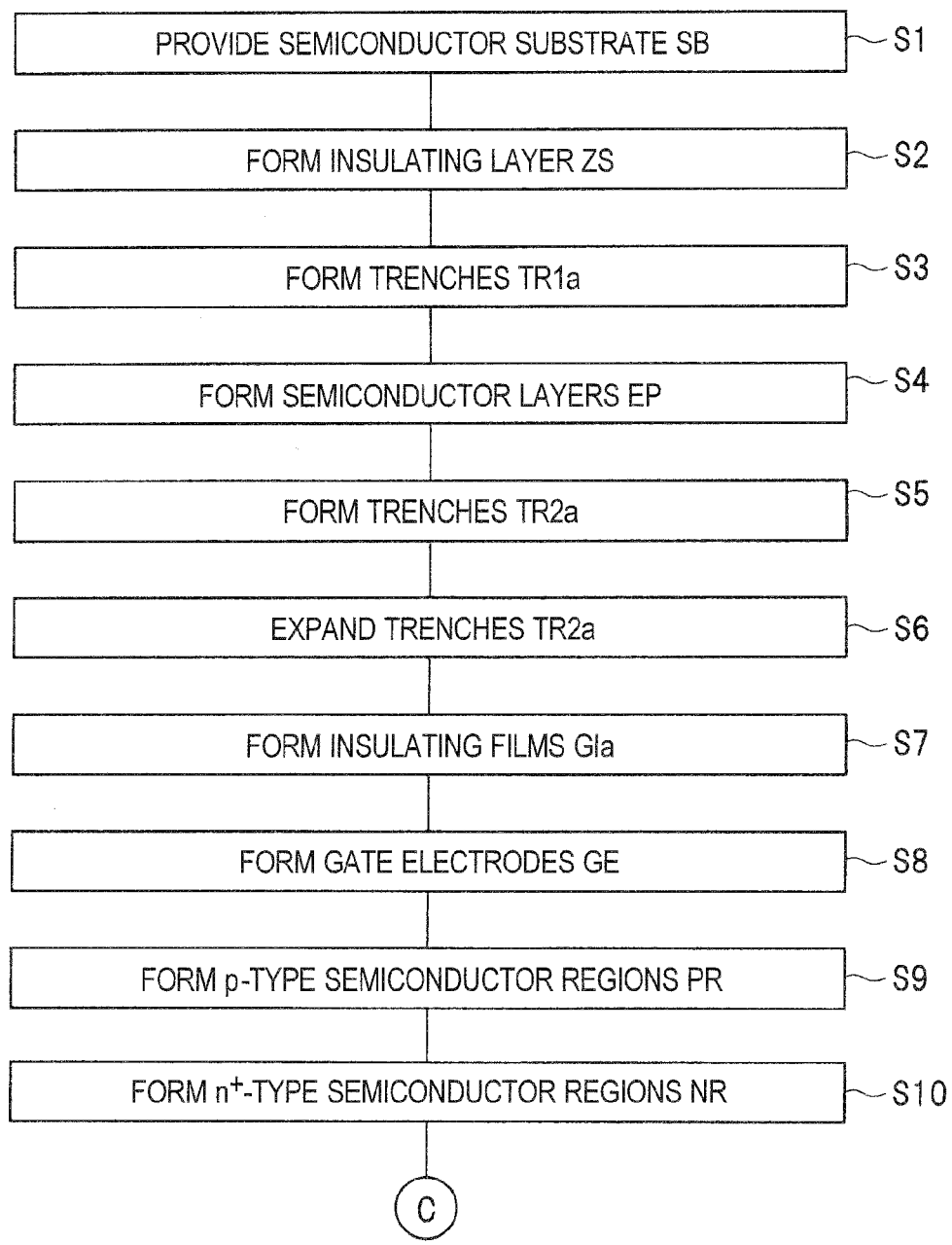
FIG. 8 is a process flow chart showing the manufacturing process of the semiconductor device in the embodiment.
Figure 9:
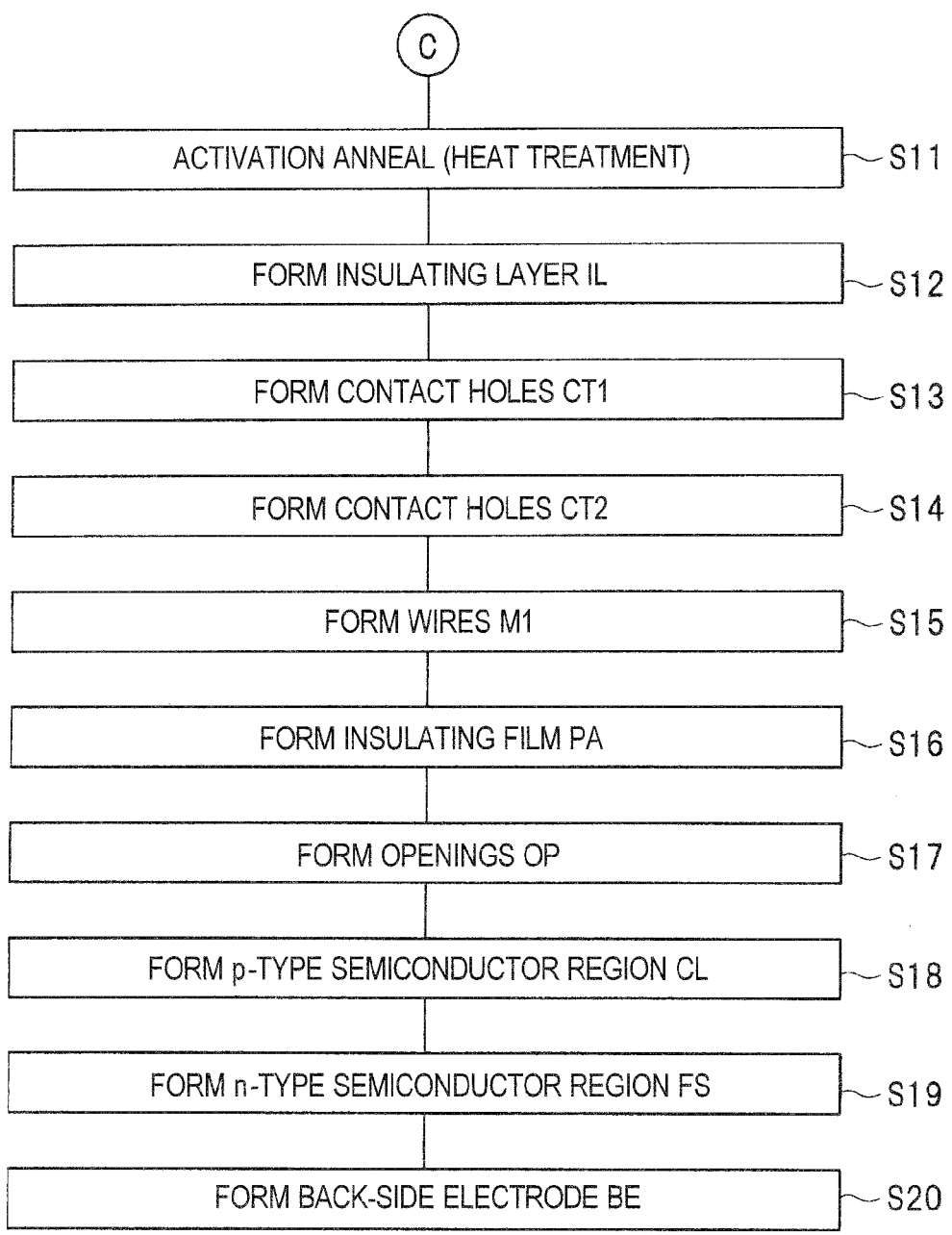
FIG. 9 is a process flow chart showing the manufacturing process of the semiconductor device, which is subsequent to FIG. 8.

Next, a description will be given of the manufacturing process of the semiconductor device in the present embodiment with reference to FIGS. 8 to 25. FIGS. 8 and 9 are process flow charts showing the manufacturing process of the semiconductor device in the present embodiment. FIGS. 10 to 25 are main-portion cross-sectional views of the semiconductor device in the present embodiment during the manufacturing process thereof and show cross-sectional views corresponding to FIG. 4 described above.

Figure 10:
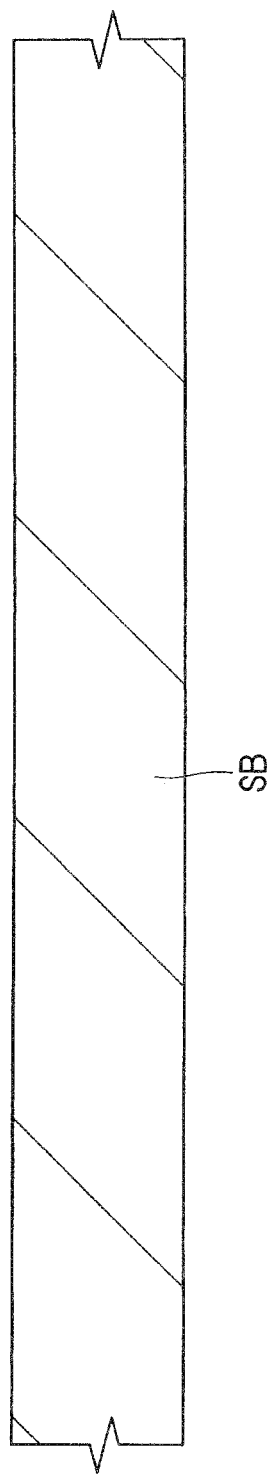
FIG. 10 is a main-portion cross-sectional view of the semiconductor device in the embodiment during the manufacturing process thereof.

To manufacture the semiconductor device, first, as shown in FIG. 10, the n-type semiconductor substrate SB (semiconductor wafer) made of, e.g., n-type monocrystalline silicon or the like is provided (Step S1 in FIG. 8). It is also possible to use, as the semiconductor substrate SB, a semiconductor substrate (so-called epitaxial wafer) in which, over a substrate main body made of an n-type monocrystalline silicon substrate, an epitaxial semiconductor layer made of n⁻-type monocrystalline silicon having an impurity concentration lower that of the substrate main body is formed.

Figure 11:
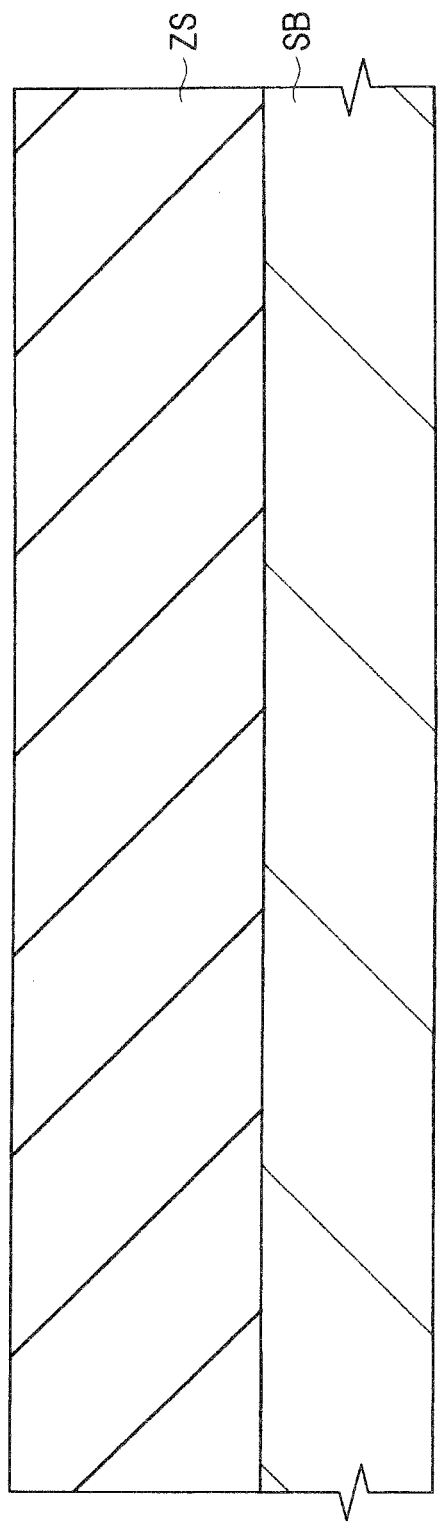
FIG. 11 is a main-portion cross-sectional view of the semiconductor device during the manufacturing process thereof, which is subsequent to FIG. 10.

Next, as shown in FIG. 11, over the main surface (entire main surface) of the semiconductor substrate SB, the insulating layer ZS is formed (Step S2 in FIG. 8). The insulating layer ZS is made of a silicon dioxide film or the like and can be formed using, e.g., a thermal oxidation method or the like. The insulating layer ZS is relatively thick and can have a thickness of, e.g., about 4 μm.

Figure 12:
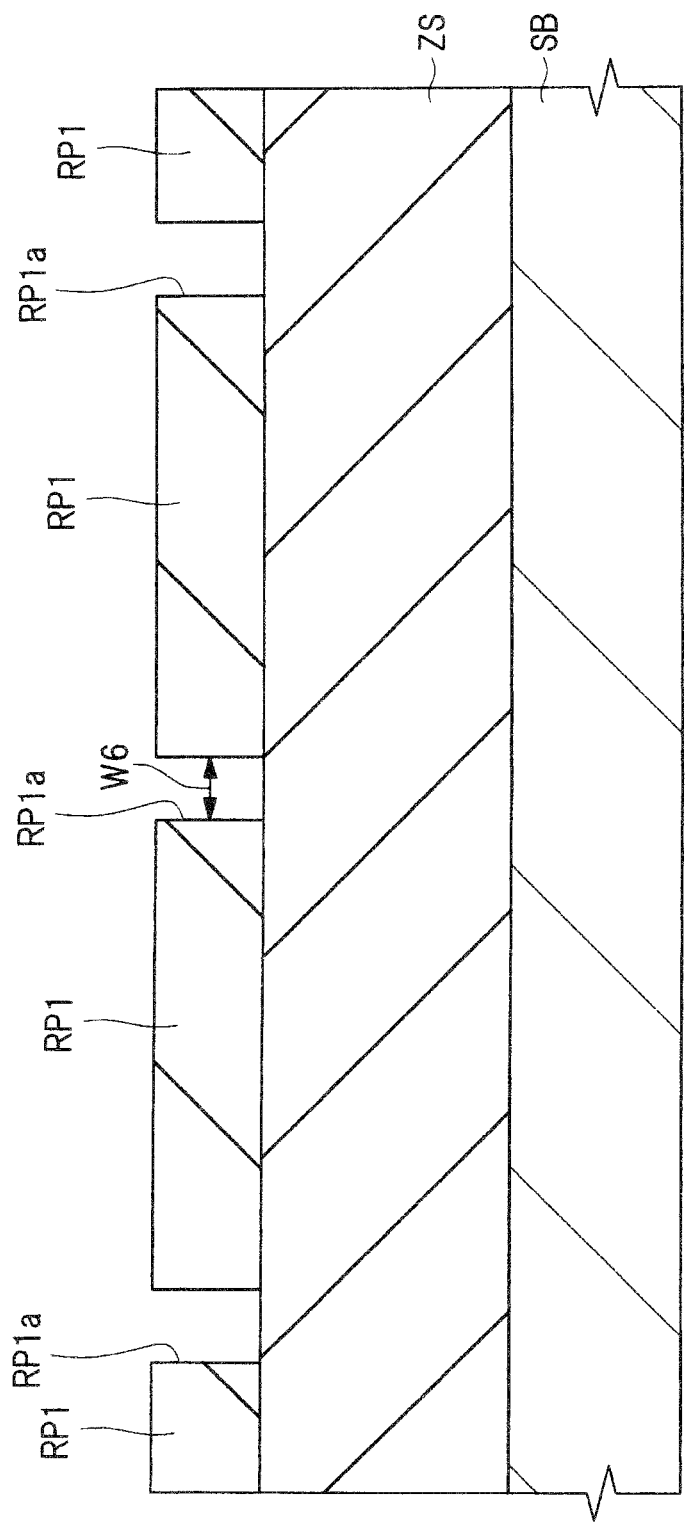
FIG. 12 is a main-portion cross-sectional view of the semiconductor device during the manufacturing process thereof, which is subsequent to FIG. 11.
Figure 13:
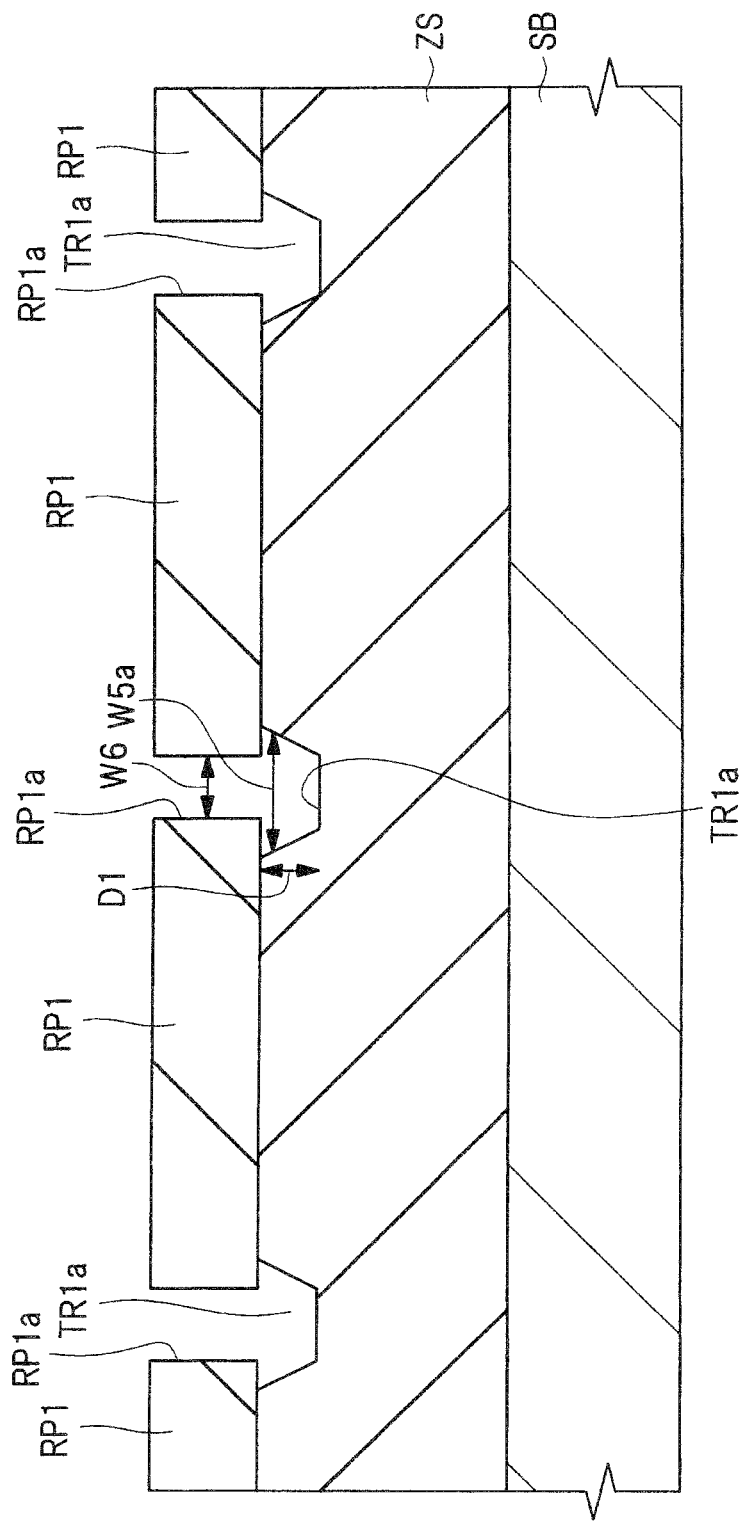
FIG. 13 is a main-portion cross-sectional view of the semiconductor device during the manufacturing process thereof, which is subsequent to FIG. 12.
Figure 14:
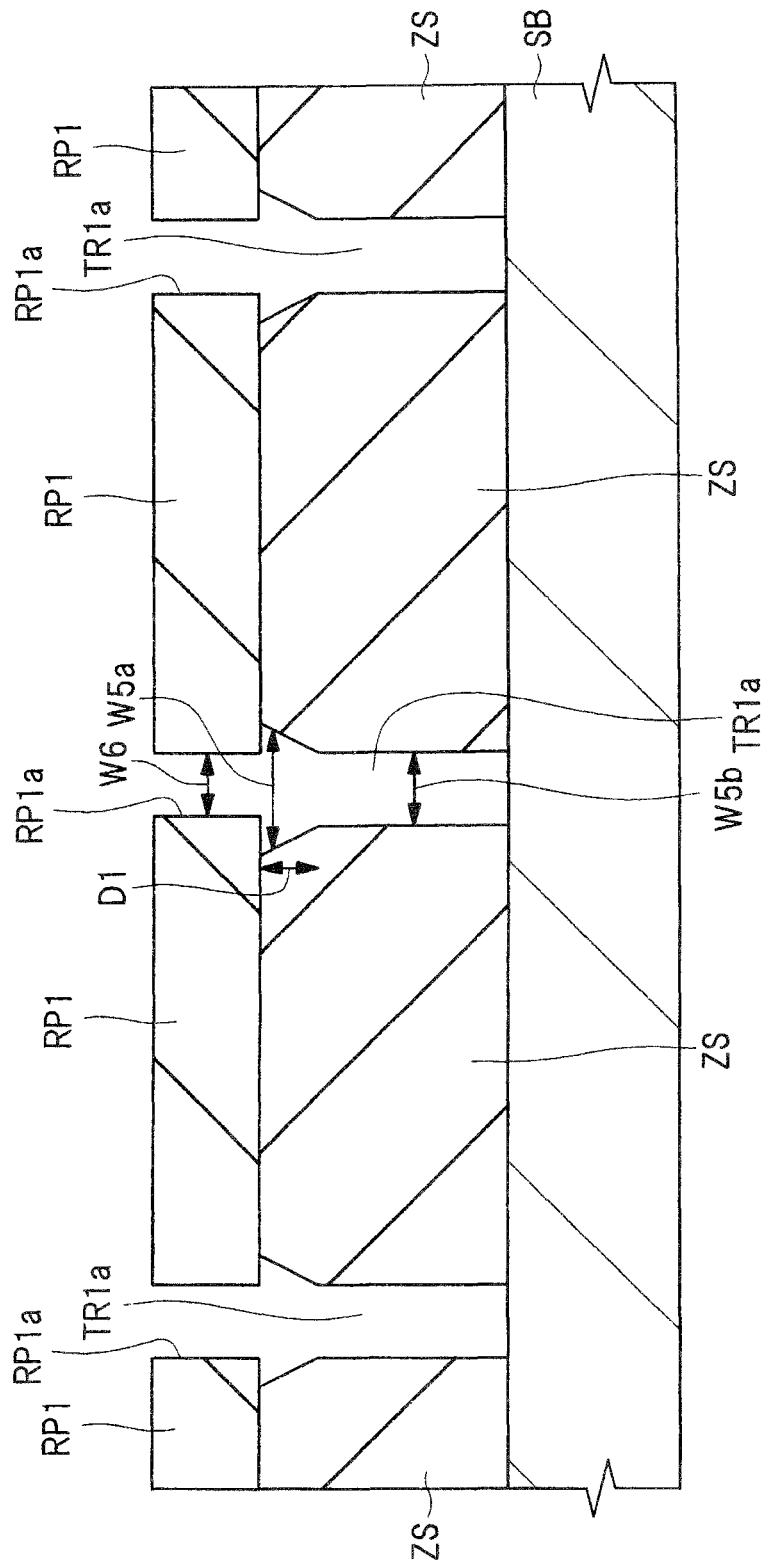
FIG. 14 is a main-portion cross-sectional view of the semiconductor device during the manufacturing process thereof, which is subsequent to FIG. 13.
Figure 15:
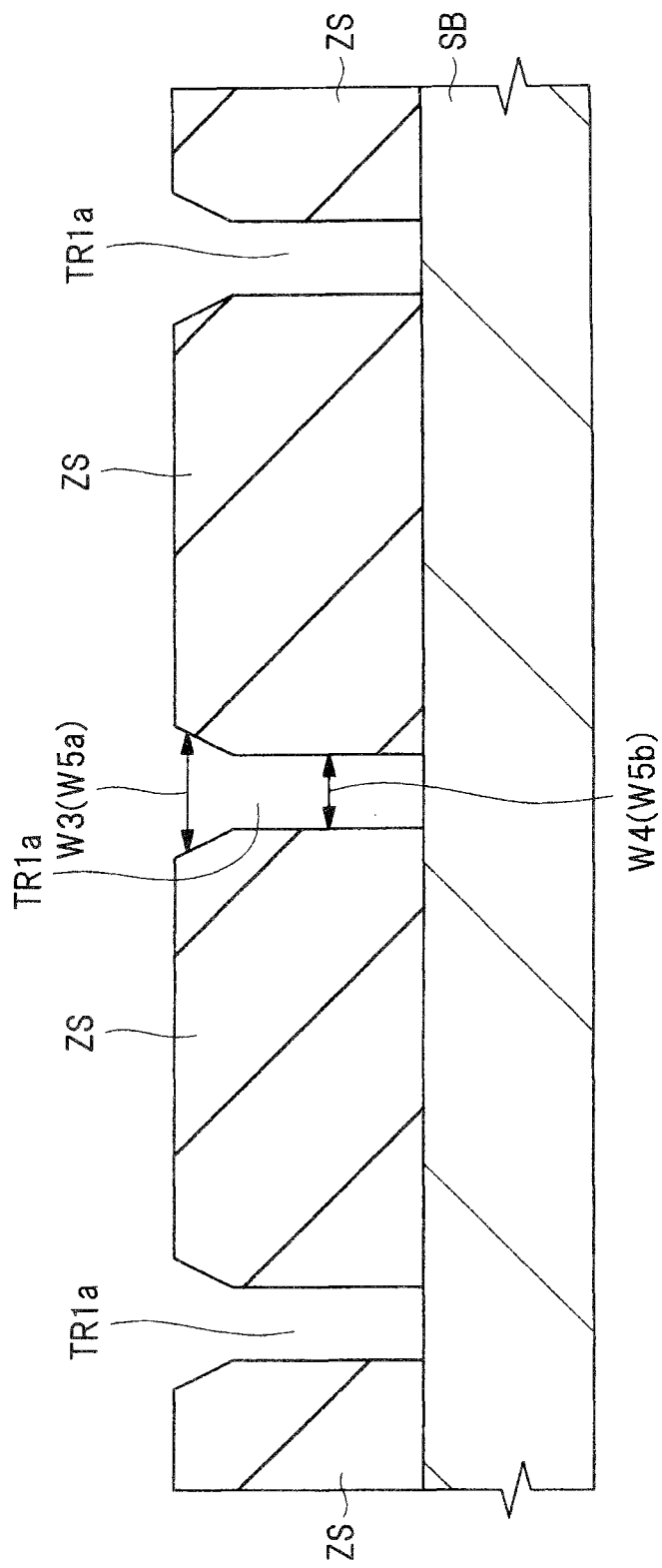
FIG. 15 is a main-portion cross-sectional view of the semiconductor device during the manufacturing process thereof, which is subsequent to FIG. 14.

Next, as shown in FIGS. 12 to 15, in the insulating layer ZS, the trenches TR1a are formed (Step S3 in FIG. 8). The trenches TR1a formed in Step S3 extend through the insulating layer ZS to reach the semiconductor substrate SB so that the semiconductor substrate SB is exposed at the bottom portions of the trenches TR1a. The trenches TR1a can be formed using a photolithographic technique and an etching technique. For example, as shown in FIG. 12, a photoresist pattern RP1 is formed over the insulating layer ZS using a photolithographic technique. Then, as shown in FIGS. 13 and 14, by etching the insulating layer ZS using the photoresist pattern RP1 as an etching mask, the trenches TR1a can be formed in the insulating layer ZS. Thereafter, as shown in FIG. 15, the photoresist pattern RP1 is removed.

Each of the trenches TR1a formed herein in Step S3 has an inventively modified shape. That is, as can also be seen from FIG. 15, the width W3 of the trench TR1a in the upper portion thereof is set larger than the width W4 of the trench TR1a in the lower portion thereof (i.e., W3>W4 is satisfied). From another perspective, in the lower portion of the trench TR1a, the side surface (side wall) of the trench TR1a is substantially perpendicular to the main surface of the semiconductor substrate SB and the width W4 of the trench TR1a is substantially uniform irrespective of a depth position. By contrast, in the upper portion of the trench TR1a, the width W3 of the trench TR1a is larger at a shallower depth position. From still another perspective, in the lower portion of the trench TR1a, the side surface (side wall) of the trench TR1a is substantially perpendicular to the main surface of the semiconductor substrate SB. By contrast, in the upper portion of the trench TR1a, the side surface of the trench TR1a is tapered. Note that each of the widths W3 and W4 is a width (dimension) in the X-direction.

The formation of the trenches TR1a each having such a shape can be accomplished by performing isotropic etching with anisotropic etching in combination in the etching step for forming the trenches TR1a.

For example, when the photoresist pattern RP1 is formed over the insulating layer ZS and then the insulating layer ZS is etched using the photoresist pattern RP1 as an etching mask in Step S3 as shown in FIG. 12, isotropic etching is performed first until the depth of each of the trenches TR1a reaches a predetermined depth D1, as shown in FIG. 13. Thus, as shown in FIG. 13, each of the trenches TR1 is formed to a midpoint of the thickness of the insulating layer ZS, and the depth position of the bottom surface of the trench TR1a corresponds to the depth D1. Note that the depth D1 is smaller than the thickness of the insulating layer ZS. The etching performed at this time is isotropic etching so that the side surface of the trench TR1a undergoes side etching. Consequently, the width W5a of the trench TR1a is slightly larger than the width W6 of each of openings RP1a of the photoresist pattern RP1 (i.e., W5a>W6 is satisfied). As the isotropic etching, dry etching, wet etching, or a combination of dry etching and wet etching can be used. Here, the openings RP1a of the photoresist pattern RP1 are openings for forming the trenches TR1a and the portions of the insulating layer ZS which are exposed from the openings RP1a are etched such that the trenches TR1a are formed therein. Each of the widths W5a and W6 is a width (dimension) in the X-direction.

Then, the isotropic etching switches to anisotropic etching. As shown in FIG. 14, using the photoresist pattern RP1 as an etching mask, the insulating layer ZS is anisotropically etched. The anisotropic etching is performed until the trenches TR1a reach the semiconductor substrate SB. Thus, as shown in FIG. 14, the trenches TR1a extend through the insulating layer ZS and the semiconductor substrate SB is exposed at the bottom portions of the trenches TR1a, whereby the etching step for forming the trenches TR1a is completed. As the anisotropic etching, anisotropic dry etching is used. While the anisotropic etching is performed, the side surfaces of the trenches TR1a scarcely undergoes side etching. Accordingly, in the portion of each of the trenches TR1a which has been formed by the anisotropic etching (i.e., the trench TR1a at the depth position deeper than the depth D1), the width W5b of the trench RT1a is substantially equal to the width W6 of each of the openings RP1a of the photoresist pattern RP1 (i.e., W5b=W6 is satisfied). Note that the width W5b is a width (dimension) in the X-direction.

Consequently, in each of the trenches TR1a thus formed, at a position deeper than the depth D1, the width W5b of the trench TR1a is substantially uniform and the side surface (side wall) of the trench TR1a is substantially perpendicular to the main surface of the semiconductor substrate SB. By contrast, at a position shallower than the depth D1, the width W5a of the trench TR1a is larger than the width W5b of the trench TR1a at a position deeper than the depth D1 (i.e., W5a>W5b is satisfied). At a position shallower than the depth D1, the width W5a of the trench TR1a is larger as the depth position is shallower so that the side surface of the trench TR1a is tapered. The width W5b corresponds to the foregoing width W4. The width W5a corresponds to the foregoing width W3.

The etching step for forming the trenches TR1a in Step S3 involves a case where isotropic etching is ended to temporarily halt etching and then anisotropic etching is initiated and a case where isotropic etching continuously shifts to anisotropic etching. In the latter case, a continuous shift from the isotropic etching to the anisotropic etching can be achieved by performing each of the isotropic etching and the anisotropic etching by dry etching and varying gas species, gas flow rates, or the like.

When a silicon dioxide layer is used as the insulating layer ZS, processing gases used for the etching in Step S3 include, e.g., a fluorocarbon-based gas such as a $CF_4$ gas, a $CHF_3$ gas, a $C_2F_6$ gas, or a $C_3F_6$ gas as an etching gas (reaction gas) and include a $H_2$ gas, an $O_2$ gas, or the like as an additive gas. The processing gases can also include an inert gas, such as an Ar gas or a He gas, as a carrier gas.

When a $H_2$ gas is added as an additive gas to the processing gases (including a fluorocarbon-based etching gas) for the etching in Step S3, a fluorocarbon-based polymer is produced during the etching and deposited over the side walls of the trenches TR1a. As a result, the side walls of the trenches TR1a are less likely to be etched so that anisotropic etching proceeds. The portions of the trenches TR1a which have been formed at this time by the etching have side walls substantially perpendicular to the main surface of the semiconductor substrate SB. On the other hand, when an $O_2$ gas is added as an additive gas to the processing gases (including a fluorocarbon-based etching gas) for the etching in Step S3, the production of the polymer during the etching is suppressed. Consequently, the polymer is less likely to be deposited over the side walls of the trenches TR1a during the etching so that quasi-isotropic etching proceeds. Accordingly, it is possible to, e.g., perform quasi-isotropic etching first in Step S3 using a gas mixture of a $CF_4$ gas and an $O_2$ gas (which may also include an Ar gas) as the processing gases down to the depth D1 and then perform anisotropic etching by switching the processing gases to a gas mixture of a $CF_4$ gas and a $H_2$ gas (which may also include an Ar gas) until the trenches TR1a extend through the insulating layer ZS.

Figure 16:
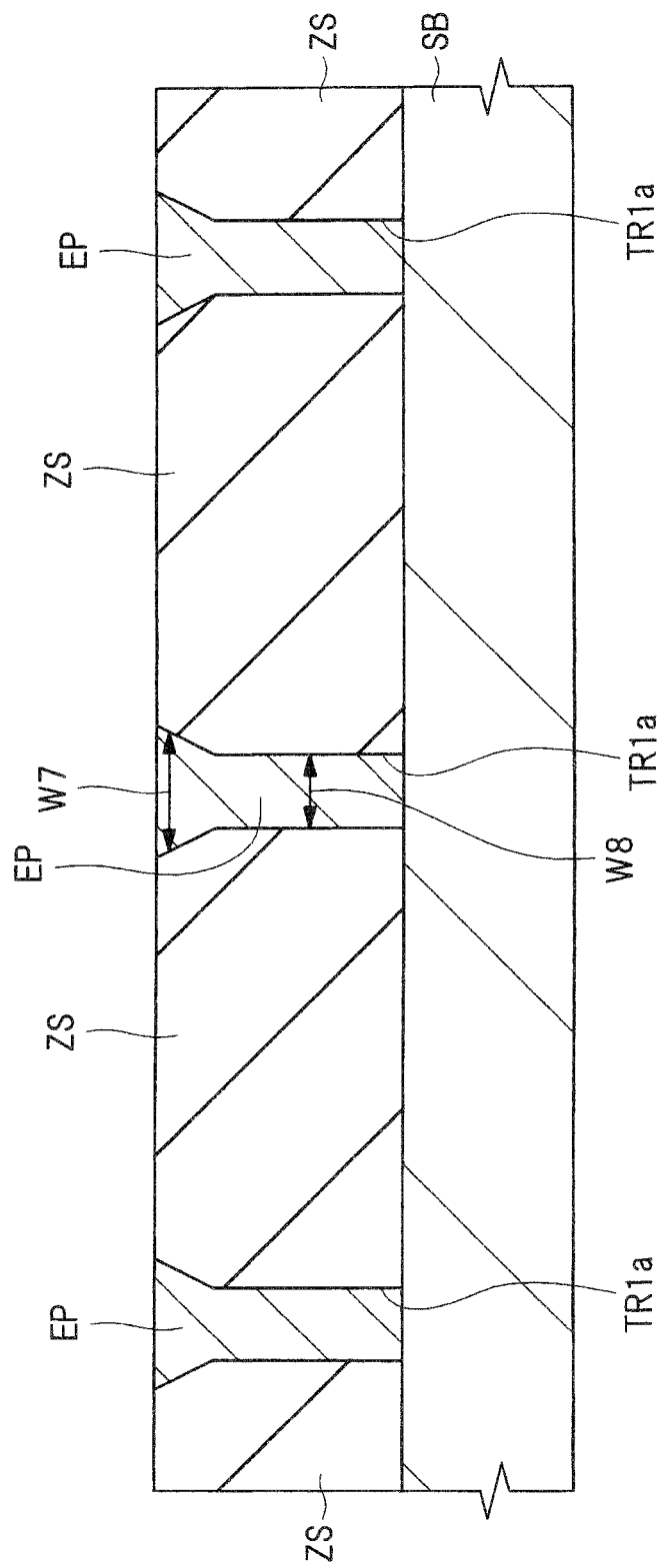
FIG. 16 is a main-portion cross-sectional view of the semiconductor device during the manufacturing process thereof, which is subsequent to FIG. 15.

Next, as shown in FIG. 16, over the semiconductor substrate SB exposed from the trenches TR1a, the semiconductor layers EP are epitaxially grown (Step S4 in FIG. 8). The semiconductor layers EP are made of the same type of semiconductor material as that of the underlying semiconductor substrate SB. Here, the semiconductor layers EP are made of monocrystalline silicon. The semiconductor layers EP are n-type semiconductor layers into which an n-type impurity has been introduced. Since the semiconductor layers EP are selectively grown over the semiconductor substrate SB exposed from the trenches TR1a, when the semiconductor layers EP are grown, the semiconductor layers EP are consequently embedded in the trenches TR1a. The epitaxial growth of the semiconductor layers EP is ended at the stage where the height of upper surfaces of the semiconductor layers EP are substantially equal to the height of main upper surface of the insulating layer ZS. When the semiconductor layer EP are formed, the state is reached where the semiconductor layers EP are embedded in the trenches TR1a. Since the state where the semiconductor layers EP are embedded in the trenches TR1a is reached, the shape of each of the trenches TR1a is substantially the same as the shape of each of the semiconductor layers EP embedded in the trenches TR1a.

Since the trenches TR1a extend in the Y-direction, the semiconductor layers EP also extend in the Y-direction. Note that, since the semiconductor layers EP are embedded in the trenches TR1a, the layout of the trenches TR1a substantially corresponds to the regions where the semiconductor layers EP are formed in FIG. 3 described above. The regions where the semiconductor layers EP are formed in FIG. 3 described above correspond to the regions where the trenches TR1a are formed.

Figure 17:
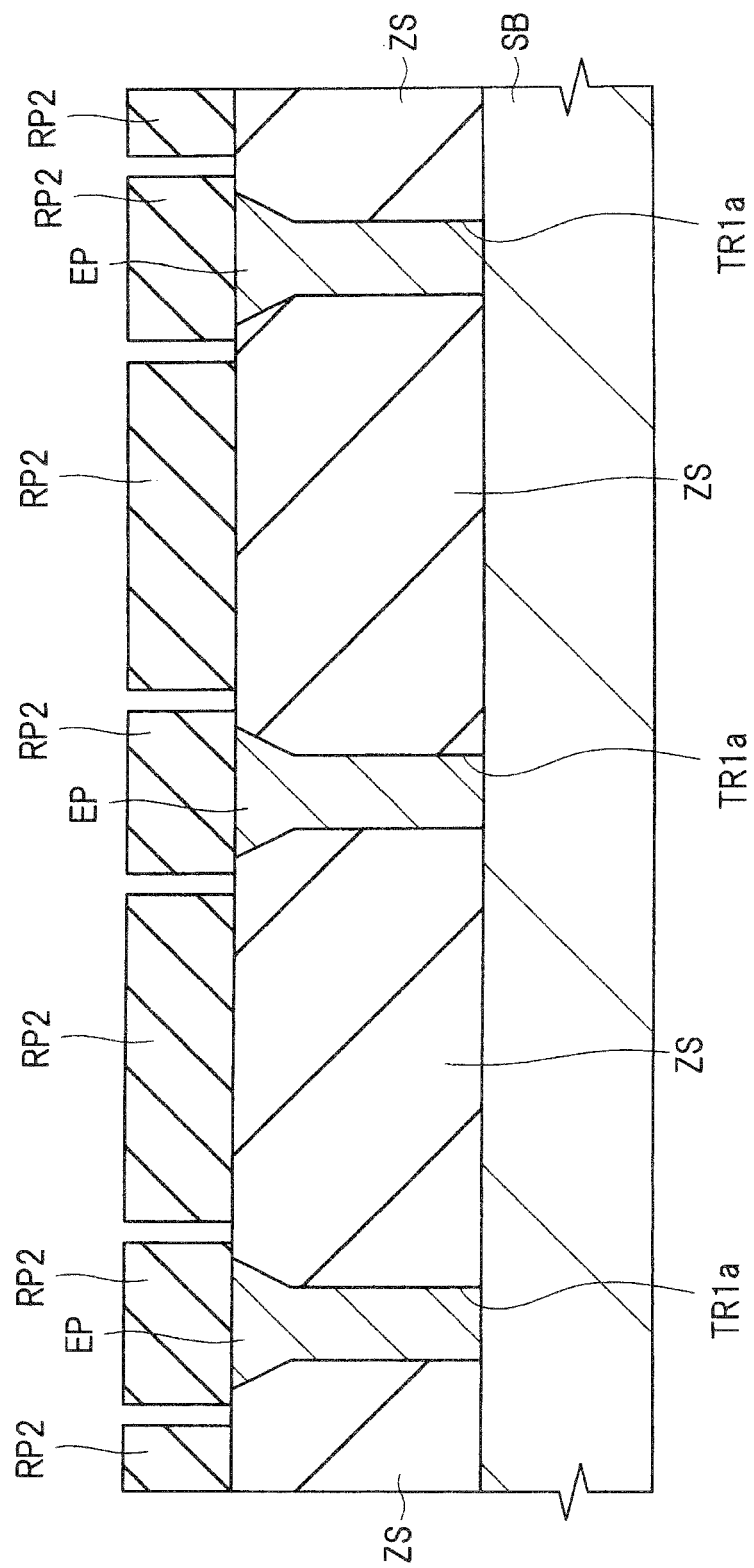
FIG. 17 is a main-portion cross-sectional view of the semiconductor device during the manufacturing process thereof, which is subsequent to FIG. 16.
Figure 18:
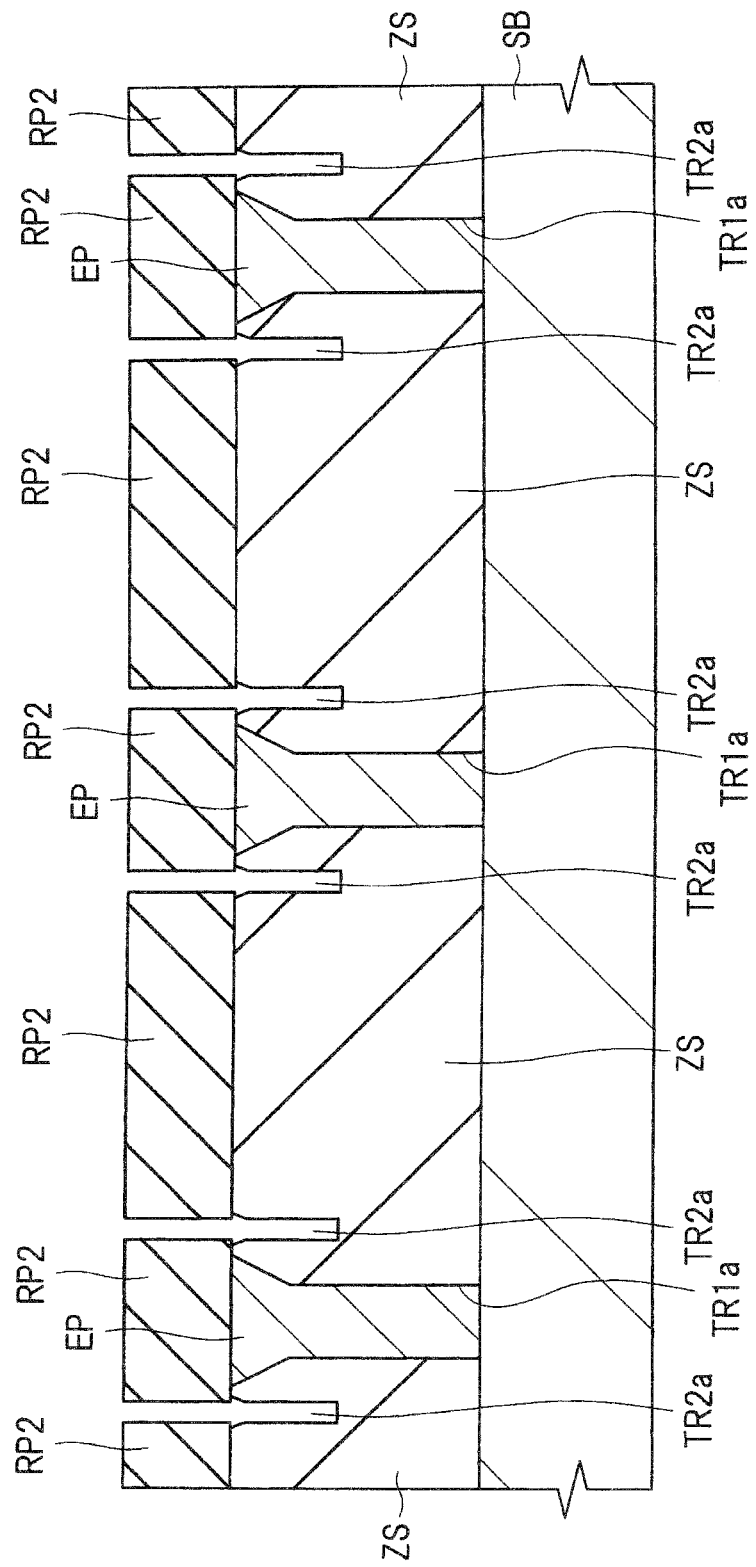
FIG. 18 is a main-portion cross-sectional view of the semiconductor device during the manufacturing process thereof, which is subsequent to FIG. 17.

Next, as shown in FIGS. 17 and 18, in the insulating layer ZS, the trenches TR2a are formed on both sides of the trenches TR1a (Step S5 in FIG. 8).

The trenches TR2a are formed so as not to extend through the insulating layer ZS, but to allow parts of the insulating layer ZS along the thickness thereof to remain under the trenches TR2a. The trenches TR2a can be formed using a photolithographic technique and an etching technique. For example, as shown in FIG. 17, the photoresist pattern RP2 is formed over the insulating layer ZS in which the semiconductor layers EP are embedded using a photolithographic technique. Then, using the photoresist pattern RP2 as an etching mask, the insulating layer ZS is etched to allow the trenches TR2a to be formed in the insulating layer ZS, as shown in FIG. 18. At this time, as the etching, anisotropic etching is preferably used.

When the trenches TR2a are formed in Step S5, the state is established in which, between the pair of trenches TR2a extending in the Y-direction in plan view, the trench TR1a (semiconductor layer EP) extending in the Y-direction is interposed in the X-direction. The Y-direction is shown herein in FIG. 3 described above. In each of FIGS. 4 and 10 to 25, a direction perpendicular to the surface of the paper sheet with the drawing corresponds to the Y-direction. The X-direction is shown in FIG. 3 described above. In each of FIGS. 4 and 10 to 25, a lateral direction parallel with the surface of the paper sheet with the drawing corresponds to the X-direction.

Note that, in plan view, the trenches TR2a are formed to be spaced apart from the trench TR1a. Accordingly, the trenches TR2a are formed to be spaced apart from the semiconductor layer EP embedded in the trench TR1a. As a result, between the trenches TR1 and TR2a, parts of the insulating layer ZS are interposed so that, between the semiconductor layer EP embedded in the trench TR1a and the trenches TR2a, parts of the insulating layer ZS are interposed. Therefore, at the stage where the trenches TR2a are formed in Step S5, the side surfaces of the semiconductor layer EP are not exposed from the trenches TR2a.

Note that, in the same manner as in each of the trenches TR1a formed in Step S3, in each of the trenches TR2a formed in Step S5 also, the width of the trench TR2a in the upper portion thereof can be set larger than the width of the trench TR2a in the lower portion thereof. From another perspective, in the same manner as in the trench TR1a formed in Step S3, in the trench TR2a formed in Step S5 also, the side surfaces (side walls) of the lower portion of the trench TR2a are substantially perpendicular to the main surface of the semiconductor substrate SB. The width of the trench TR2a is substantially uniform irrespective of a depth position. However, the upper portion of the trench TR2a can also have a width which is larger at a shallower depth position. This allows easy entry of an etching solution into the trenches TR2a during etching in Step S6 described later and thus allows easy etching in Step S6 described later. To allow each of the trenches TR2a formed in Step S5 to have a width which is larger in the upper portion thereof than in the lower portion thereof, in the same manner as in the etching in Step S3, in the etching in Step S5 also, the trenches TR2a may be formed appropriately by forming the foregoing photoresist pattern RP2, then performing isotropic etching, and subsequently performing anisotropic etching.

Figure 19:
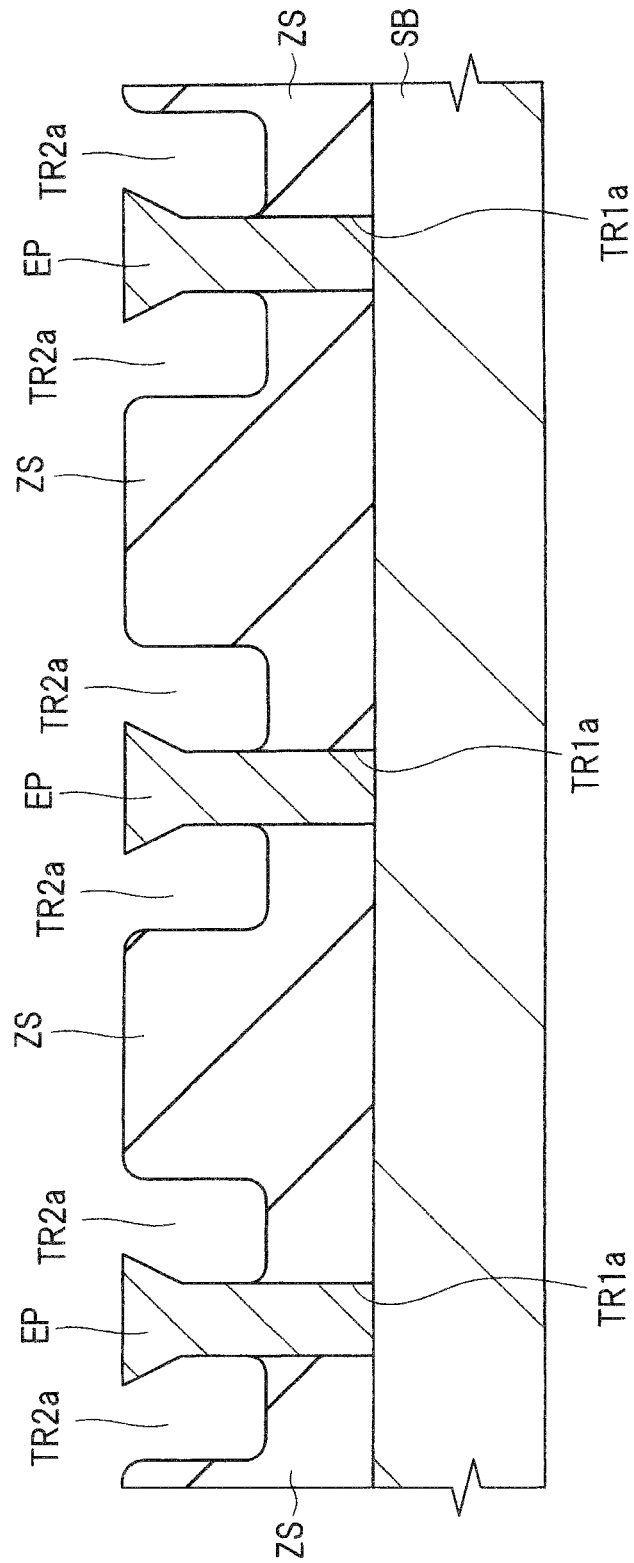
FIG. 19 is a main-portion cross-sectional view of the semiconductor device during the manufacturing process thereof, which is subsequent to FIG. 18.

Next, as shown in FIG. 19, using isotropic etching, the insulating layer ZS is etched at the inner surfaces (side and bottom surfaces) of the trenches TR2a to expand the trenches TR2a (Step S6 in FIG. 8). As the isotropic etching, wet etching is preferred. At this time, the wet etching is preferably performed in the state where the foregoing photoresist pattern RP2 is formed over the insulating layer ZS. This allows the photoresist pattern RP2 to cover the upper surface of the insulating layer ZS and thus inhibit the etching thereof, while an etching solution enters the trenches TR2a to etch the exposed surfaces of the insulating layer ZS forming the inner surfaces of the trenches TR2a. Accordingly, it is possible to etch the insulating layer ZS exposed at the inner surfaces of the trenches TR2a and expand the trenches TR2a, while preventing the etching of the upper surface of the insulating layer ZS. After the etching step in Step S6, the photoresist pattern RP2 is removed. In the etching in Step S6, the trenches TR2a are expanded in lateral, downward, and oblique directions, while the portions of the insulating layer ZS which are interposed between the trenches TR2a and the semiconductor layers EP are also etched and removed. As a result, parts (upper portions) of the side surfaces of the semiconductor layers EP are exposed at the side surfaces (side surfaces corresponding to those of the semiconductor layers EP).

That is, at the stage where the trenches TR2a are formed in Step S5, i.e., at the stage before the etching step for expanding the trenches TR2a is performed in Step S6, the insulating layer ZS is interposed between the trenches TR2a and the semiconductor layers EP so that the semiconductor layers EP are not exposed at the inner surfaces of the trenches TR2a. However, when the etching step for expanding the trenches TR2a is performed in Step S6, the portions of the insulating layer ZS which are interposed between the trenches TR2a and the semiconductor layers EP are also etched and removed. As a result, at the inner surfaces (specifically, the side surfaces corresponding to those of the semiconductor layers EP) of the trenches TR2a, the parts (upper portions) of the side surfaces of the semiconductor layers EP are exposed.

From another perspective, in Step S5, the trenches TR2a need to be formed so as to prevent the side surfaces of the semiconductor layers EP from being exposed at the inner surfaces of the trenches TR2a and, in the etching step for expanding the trenches TR2a in Step S6, the etching needs to be performed so as to expose the side surfaces of the semiconductor layers EP at the inner surfaces (specifically, the side surfaces corresponding to those of the semiconductor layers EP) of the trenches TR2a.

Note that, for the etching step for expanding the trenches TR2a in Step S6, etching conditions under which the semiconductor layers EP are less likely to be etched than the insulating layer ZS, i.e., etching conditions under which the speed of etching the semiconductor layers EP is lower than the speed of etching the insulating layer ZS are preferably used. This can inhibit or prevent the semiconductor layers EP exposed at the inner surfaces of the trenches TR2a from being etched in Step S6. That is, in Step S6, the semiconductor layers EP are allowed to function as an etching stopper. Accordingly, it is desirable that, in the etching step for expanding the trenches TR2a in Step S6, an etching solution which allows the insulating layer ZS to be selectively etched is used. When the insulating layer ZS is a silicon dioxide film and the semiconductor layers EP are monocrystalline silicon layers, as the etching solution used in Step S6, an aqueous solution of, e.g., a hydrofluoric acid or the like can be used appropriately.

The depth of each of the trenches TR2a is larger after the etching step for expanding the trenches TR2a is performed in Step S6 than before the etching step for expanding the trenches TR2a is performed in Step S6. It is arranged that, even when Step S6 is performed, a part of the insulating layer ZS is left under each of the trenches TR2a. This can be achieved by controlling the depth of each of the trenches TR2a formed in Step S5 and the amount of etching in Step S6.

In the etching step for expanding the trenches TR2a in Step S6, isotropic etching is performed. Accordingly, when the etching step for expanding the trenches TR2a is performed, the corner portions of the inner surfaces of the trenches TR2a may be rounded off to have round shapes.

The thickness of the insulating layer ZS formed in Step S2 described above can be set to, e.g., about 4 μm. The depth of each of the trenches TR2a at the stage where Step S6 (step of expanding the trenches TR2a) has been ended can be set to, e.g., about 0.7 to 2 μm. In this case, at the stage where Step S6 (step of expanding the trenches TR2a) has been ended, the thicknesses of the portions of the insulating layer ZS which are located immediately under the trenches TR2a are about 2 to 3.3 μm. In this case, when the gate electrodes GE are formed in Step S8 described later, the thicknesses of the portions of the insulating layer ZS which are located immediately under the gate electrodes GE are approximately not less than half the thickness of the insulating layer ZS (substantially corresponding to the thickness of the insulating film ZS formed in Step S2) in the region where the trenches TR1a and TR2a are not formed.

There is a case where, due to the misalignment of a photomask or the like, the positions where the trenches TR2a are formed in Step S5 are rather displaced from design positions. In such a case also, by presetting the amount of etching in Step S6 such that the side surfaces of the semiconductor layer EP are exposed in Step S6 and allowing each of the semiconductor layers EP to function as an etching stopper, even when the positions where the trenches TR2a are formed in Step S5 are rather displaced from the design positions, it is possible to expose the semiconductor layers EP from the trenches TR2a in Step S6.

Figure 20:
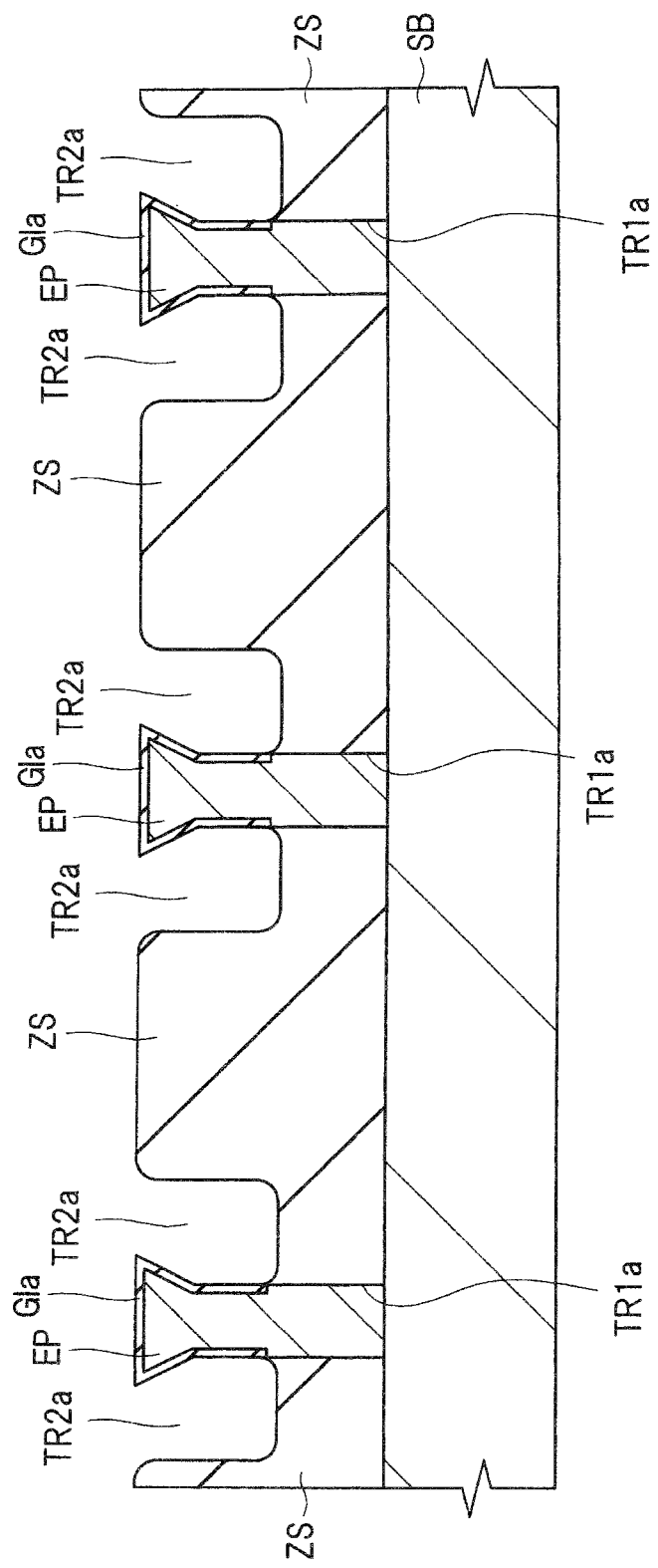
FIG. 20 is a main-portion cross-sectional view of the semiconductor device during the manufacturing process thereof, which is subsequent to FIG. 19.

Next, as shown in FIG. 20, by oxidizing the exposed surfaces of the semiconductor layers EP using a thermal oxidation method or the like, insulating films GIa for gate insulating films are formed over the exposed surfaces of the semiconductor layers EP (Step S7 in FIG. 8). The insulating films GIa are each made of a silicon dioxide film or the like and formed over the side surfaces of the semiconductor layers EP exposed from the trenches TR2a and over the upper surfaces of the semiconductor layers EP.

Note that the step of forming the insulating films GI1a in Step S7 is performed to form the insulating films GIa over the side surfaces of the semiconductor layers EP exposed from the trenches TR2a. Therefore, it is important to oxidize the side surfaces of the semiconductor layers EP exposed from the trenches TR2a (i.e., form oxide films over the side surfaces of the semiconductor layers EP exposed from the trenches TR2a). The upper surfaces of the semiconductor layers EP may or may not be oxidized. Accordingly, the step of forming the insulating films GIa in Step S7 can be regarded as the step of forming the insulating films GIa for gate insulating films over the side surfaces of the semiconductor layers EP exposed from the trenches TR2a. However, as shown in FIG. 20, when not only the side surfaces of the semiconductor layers EP exposed from the trenches TR2a, but also the upper surfaces of the semiconductor layers EP are oxidized, a mask layer resistant to oxidation need not be formed over the semiconductor layers EP so that the manufacturing process is simplified.

Figure 21:
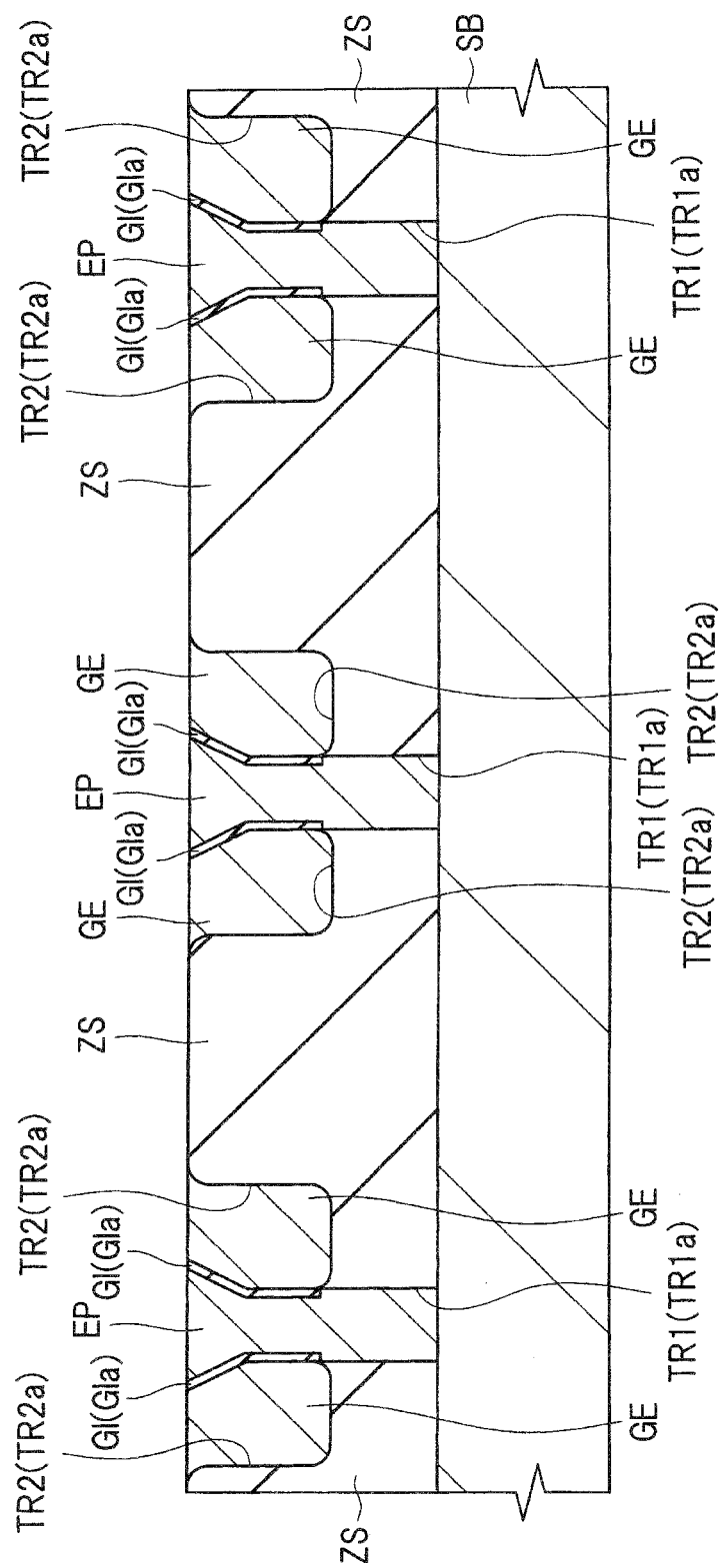
FIG. 21 is a main-portion cross-sectional view of the semiconductor device during the manufacturing process thereof, which is subsequent to FIG. 20.

Next, as shown in FIG. 21, the gate electrodes GE are formed in the trenches TR2 (Step S8 in FIG. 8).

In Step S8, the gate electrodes GE can be formed as follows. That is, first, over the insulating layer ZS, a gate electrode conductive film is formed so as to be embedded in the trenches TR2a. The gate electrode conductive film is made of, e.g., a polycrystalline silicon film (doped polysilicon film) having a low resistivity due to the impurity (e.g., n-type impurity) introduced therein. The gate electrode conductive film can be formed using a CVD (Chemical Vapor Deposition) method or the like. Then, by etching back (etching or anisotropically etching) the gate electrode conductive film, the gate electrode conductive film is left in the trenches TR2a, while the gate electrode conductive film outside the trenches TR2a is removed. Of the gate electrode conductive film remaining in the trenches TR2a, the gate electrodes GE are formed. The remaining insulating films GIa interposed between the gate electrodes GE and the semiconductor layers EP serve as the gate insulating films GI. The insulating films GIa over the upper surfaces of the semiconductor layers EP may be removed by the step of etching back the gate electrode conductive film or left.

Thus, as shown in FIG. 21, the gate electrodes GE each made of the conductive film embedded in the trenches TR2a are formed. Between the gate electrodes GE and the semiconductor layers EP, the gate insulating films GI (insulating films GIa) are interposed. Under the gate electrodes GE, parts of the insulating layer ZS are present. By allowing the parts of the insulating layer ZS to be left under the trenches TR2a in Step S6 described above, when the gate electrodes GE are formed in Step S8, the structure in which the parts of the insulating layer ZS are present under the gate electrodes GE can be obtained.

Since the trenches TR2a extend in the Y-direction, the gate electrodes GE also extend in the Y-direction. Note that, since the gate electrodes GE are embedded in the trenches TR2a, the layout of the trenches TR2a substantially corresponds to the regions where the gate electrodes GE are formed in FIG. 3 described above, and the regions where the gate electrodes GE are formed in FIG. 3 described above correspond to the regions where the trenches 2a are formed.

Note that, at the stage where the trenches TR2a are formed in Step S5, the trenches TR2a are spaced apart from the trenches TR1a. Since parts of the insulating layer ZS are interposed between the trenches TR2a and the trenches TR1a, the side surfaces of the semiconductor layers EP embedded in the trenches TR1 are not exposed from the trenches TR2a. However, when the trenches TR2a are expanded in Step S6, the portions of the insulating layer ZS which are interposed between the trenches TR2a and TR1a are removed by etching. Consequently, the trenches TR2a are connected to the trenches TR1a so that the side surfaces of the portions of the semiconductor layers EP which are shallower than the bottom surfaces of the trenches TR2a are exposed from the trenches TR2a. Thus, the trenches TR1a become the foregoing trench portions TR1, and the trenches TR2a become the foregoing trench portions TR2. The trenches TR1 and TR2 form the foregoing trenches TR.

Figure 22:
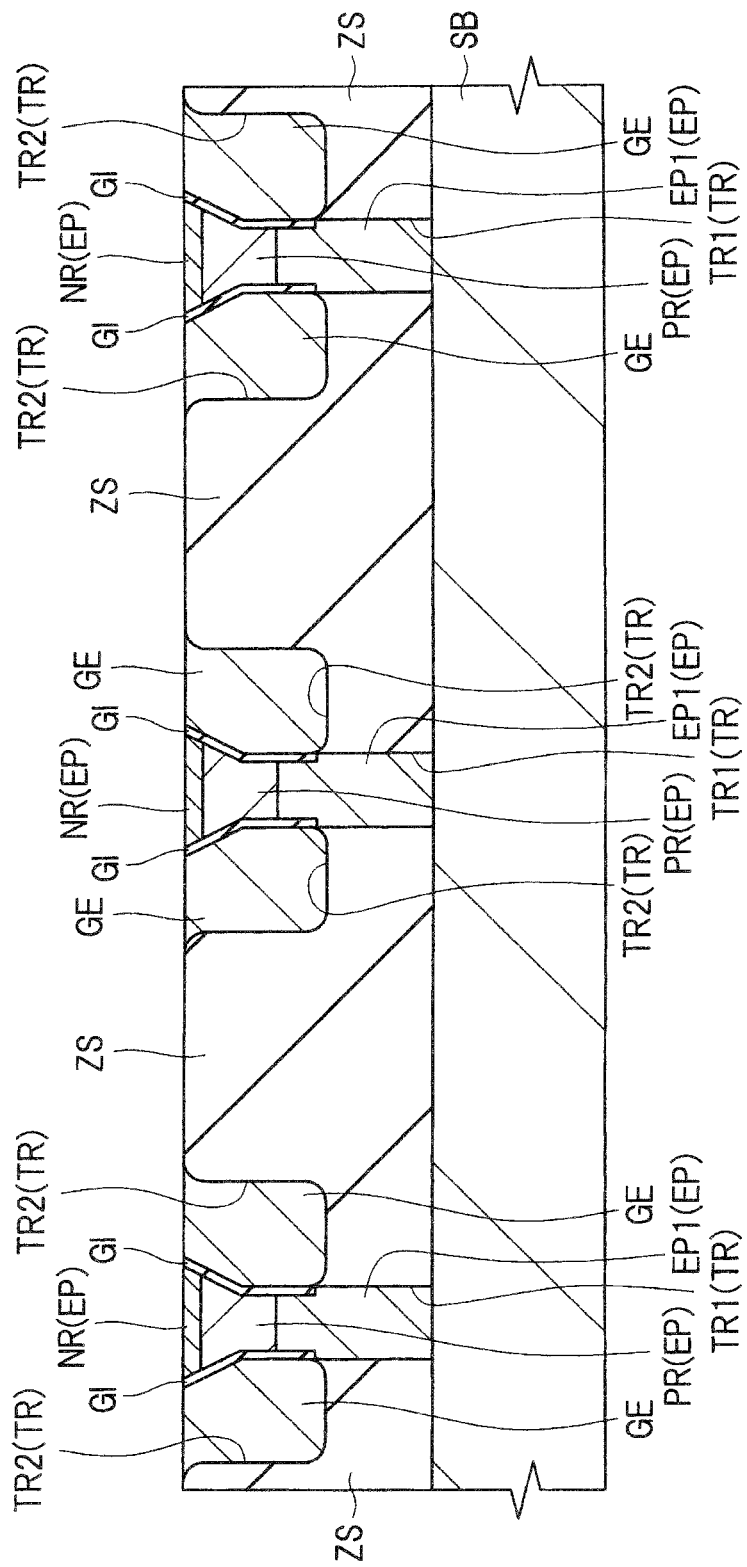
FIG. 22 is a main-portion cross-sectional view of the semiconductor device during the manufacturing process thereof, which is subsequent to FIG. 21.

Next, as shown in FIG. 22, by the ion implantation of a p-type impurity (e.g., boron (B)) into the upper portions (upper-layer portions) of the semiconductor layers EP or the like, the p-type semiconductor regions PR are formed in the upper portions of the semiconductor layers EP (Step S9 in FIG. 8).

Next, by the ion implantation of an n-type impurity (e.g., arsenic (As)) into the upper portions (upper-layer portions) of the semiconductor layers EP or the like, the $n^+$-type semiconductor regions NR are formed (Step S10 in FIG. 9).

The depths (depth positions of the bottom portions) of the $n^+$-type semiconductor regions NR are shallower than the depths (depth positions of the bottom portions) of the p-type semiconductor regions PR. This provides the state where the p-type semiconductor regions PR and the $n^+$-type semiconductor regions NR are formed in the upper-layer portions (top-layer portions) of the semiconductor layers EP, the $n^+$-type semiconductor regions NR are formed over the p-type semiconductor regions PR, and the p-type semiconductor regions PR are present under the $n^+$-type semiconductor regions NR, while the $n^+$-type semiconductor regions NR are present over the p-type semiconductor regions PR. Under the p-type semiconductor regions PR, the semiconductor layers EP retaining the n-type conductivity, i.e., the n-type semiconductor regions EP1 are present.

Note that the $n^+$-type semiconductor regions NR and the p-type semiconductor region PR are formed shallower than the bottom surfaces (lower surfaces) of the gate electrodes GE. Accordingly, the interfaces between the $n^+$-type semiconductor regions NR and the p-type semiconductor regions PR are at positions shallower than the bottom surfaces (lower surfaces) of the gate electrodes GE, and the interfaces between the p-type semiconductor regions PR and the n-type semiconductor regions EP1 are also present at positions shallower than the bottom surfaces (lower surfaces) of the gate electrodes GE.

The description has been given heretofore of the case where the p-type semiconductor regions PR are formed first, and then the $n^+$-type semiconductor regions NR are formed. However, in another form, it is also possible to form the $n^+$-type semiconductor regions NR first, and then form the p-type semiconductor regions PR. That is, the order of Steps S9 and S10 can be reversed.

Next, activation anneal as heat treatment for activating the introduced impurities is performed (Step S11 in FIG. 9). The active anneal can be performed at, e.g., about 800 to 1000° C. Thus, the impurities introduced into the individual semiconductor regions (such as the p-type semiconductor regions CL and PR and the $n^+$-type semiconductor regions NR) formed in the semiconductor substrate SB and the semiconductor layers EP can be activated.

Figure 23:
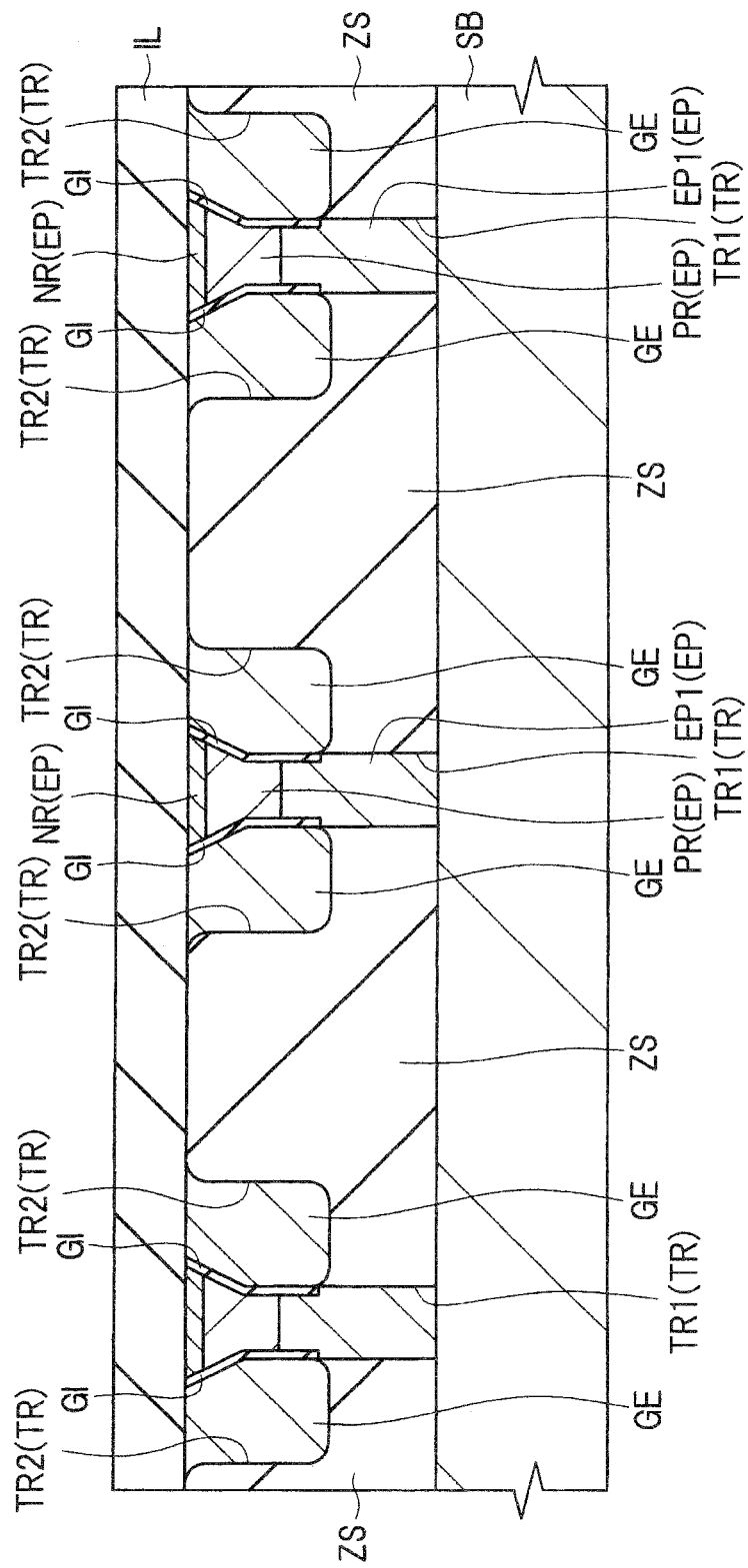
FIG. 23 is a main-portion cross-sectional view of the semiconductor device during the manufacturing process thereof, which is subsequent to FIG. 22.

Next, as shown in FIG. 23, over the insulating layer ZS, the insulating layer (insulating film) IL is formed as the interlayer insulating film so as to cover the gate electrodes GE and the semiconductor layers EP (Step S12 in FIG. 9). The insulating layer IL is made of, e.g., a silicon dioxide film or the like and can be formed using a CVD method or the like. As the insulating layer IL, a laminated insulating film can also be used. After the formation of the insulating layer IL, it is also possible to polish the upper surface of the insulating layer IL by a CMP (Chemical Mechanical Polishing) method and thus enhance the planarity of the insulating layer IL.

Figure 24:
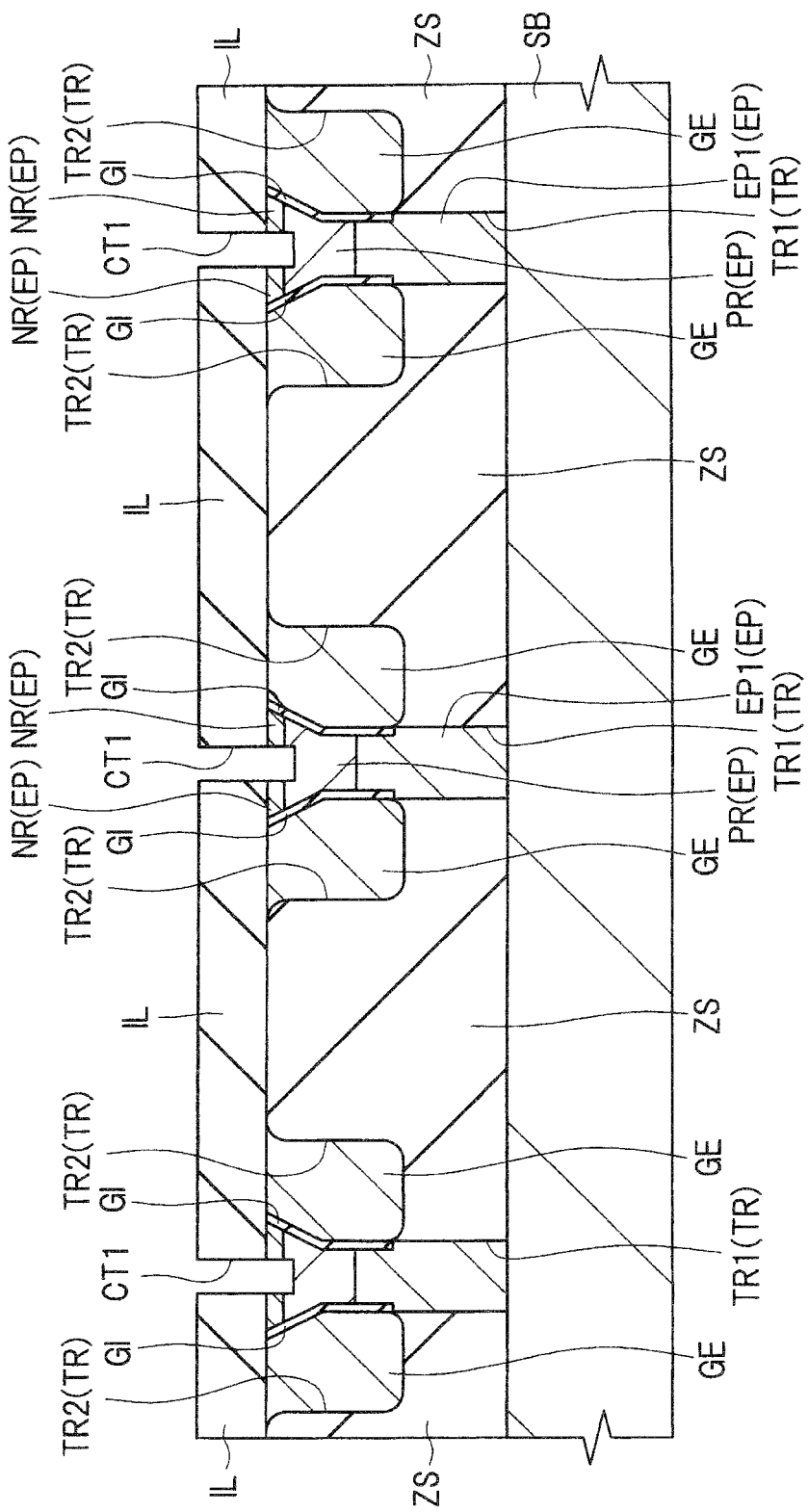
FIG. 24 is a main-portion cross-sectional view of the semiconductor device during the manufacturing process thereof, which is subsequent to FIG. 23.

Next, as shown in FIG. 24, using a photoresist pattern (not shown) formed over the insulating layer IL using a photolithographic method as an etching mask, the insulating layer IL is etched (preferably dry-etched). By further etching (preferably, dry-etching) the semiconductor layers EP, the contact holes CT1 are formed (Step S13 in FIG. 9).

The contact holes CT1 are formed so as to be included in the semiconductor layers EP in plan view. The contact holes CT1 extend through the insulating layer IL and the $n^+$-type semiconductor regions NR so that the bottom portions of the contact holes CT1 have reached the p-type semiconductor regions PR. As a result, at the bottom surfaces of the contact holes CT1, the p-type semiconductor regions PR are exposed and, at the lower portions of the side surfaces of the contact holes CT1, the $n^+$-type semiconductor regions NR are exposed.

Next, as shown in FIG. 5 described above but not shown in FIG. 24, using another photoresist pattern (not shown) formed over the insulating layer IL using a photolithographic method as an etching mask, the insulating layer IL is etched (preferably, dry-etched) so that the contact holes CT2 are formed therein (Step S14 in FIG. 9). The contact holes CT2 are formed over the gate electrodes GE and, at the bottom portions of the contact holes CT2, the gate electrodes GE are exposed. The contact holes CT2 may also be formed in the same step of forming the contact holes CT1.

Figure 25:
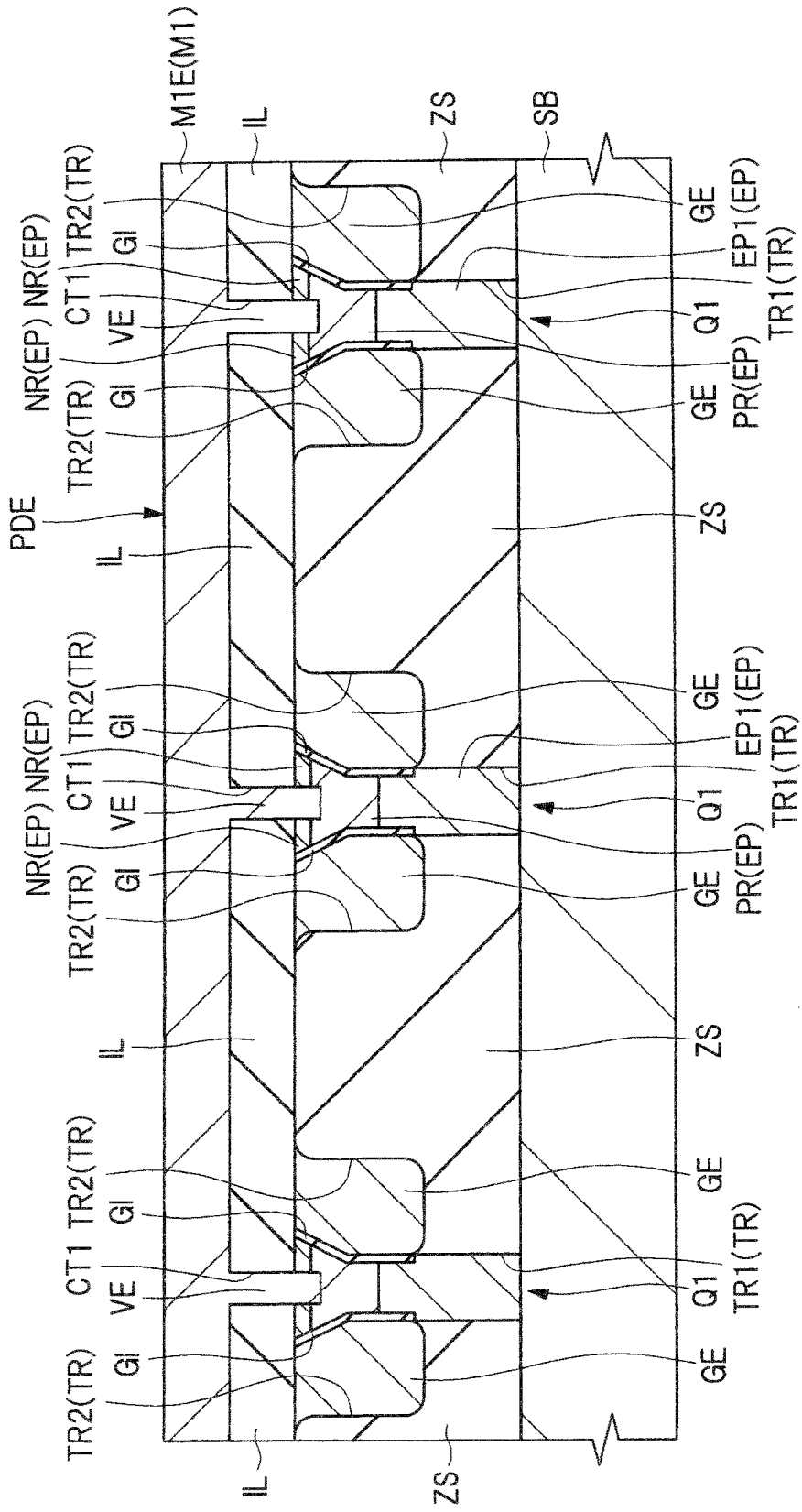
FIG. 25 is a main-portion cross-sectional view of the semiconductor device during the manufacturing process thereof, which is subsequent to FIG. 24.

Next, as shown in FIG. 25, over the insulating layer IL, the wires M1 are formed (Step S15 in FIG. 9). For example, the wires M1 can be formed as follows. First, over the insulating layer IL including the portions thereof in the contact holes CT1 and CT2, a conductive film for forming the wires M1 is formed. The conductive film for forming the wires M1 is made of a metal film formed mainly of, e.g., an aluminum film or an aluminum alloy film. Then, by patterning the conductive film for forming the wires M1 using a photolithographic technique and a dry etching technique, the wires M1 each made of the patterned conductive film can be formed. As described above, the wires M1 include the emitter wire M1E and the gate wires M1G. Note that the gate wires M1G are not shown in FIG. 25, but are shown in FIGS. 5 and 6 described above.

The emitter via portions VE as the via portions (portions embedded in the emitter contact holes CT1) of the emitter wire M1E are formed integrally with the emitter wire M1E. The gate via portions VG as the via portions (portions embedded in the gate contact holes CT2) of the gate wires M1G are formed integrally with the gate wires M1G. The emitter via portions VE are in contact with and electrically coupled to the $n^+$-type semiconductor regions NR and the p-type semiconductor regions PR in the vicinities of the bottom portions of the contact holes CT1. The gate via portions VG are in contact with and electrically coupled to the gate electrodes GE at the bottom portions of the contact holes CT2.

In another embodiment, it is also possible to form the emitter via portions VE (conductive portions embedded in the emitter contact holes CT1) separately from (in another step other than the step of forming) the emitter wire M1E and form the gate via portions VG (conductive portions embedded in the gate contact holes CT2) separately from (in another step other than the step of forming) the gate wires M1G. In that case, after the contact holes CT1 and CT2 are formed, over the insulating layer IL, a conductive film for forming plugs is formed so as to be embedded in the contact holes CT1 and CT2. Then, using a CMP method or the like, the conductive film (conductive film for forming plugs) located outside the contact holes CT1 and CT2 is removed to form conductive plugs embedded in the contact holes CT1 and CT2. The conductive plugs embedded in the contact holes CT2 correspond to the gate via portions VG. The conductive plugs embedded in the contact holes CT1 correspond to the emitter via portions VE. Thereafter, over the insulating layer IL in which the conductive plugs are embedded, the conductive film for forming the wires M1 is formed. Then, by patterning the conductive film for forming the wires M1 using a photolithographic technique and an etching technique, the wires M1 (the emitter wire M1E and the gate wires M1G) may be formed appropriately.

Next, as shown in FIGS. 1 and 4 to 6, over the insulating layer IL, the insulating film PA is formed so as to cover the wires M1 (the emitter wire M1E and the gate wires M1G) (Step S16 in FIG. 9). Then, the openings OP are formed in the insulating film PA (Step S17 in FIG. 9). The insulating film PA is made of a resin film such as, e.g., a polyimide-based resin and allowed to have a surface protecting function. At the stage where the insulating film PA is formed, the entire wires M1 are covered with the insulating film PA.

For example, the openings OP can be formed as follows. That is, the insulating film PA is formed as a photosensitive resin film. Over the insulating film PA made of a photosensitive resin, using a photolithographic technique, a photoresist pattern (not shown) is formed. Then, using the photoresist pattern as a mask, the insulating film PA made of the photosensitive resin is exposed to light. Thus, the portion of the insulating film PA which is uncovered with the photoresist pattern and exposed is exposed to light. Thereafter, the photoresist pattern is removed, and then the insulating film PA made of the photosensitive resin is subjected to development treatment such that the exposed portion of the insulating film PA is removed. By the exposure and the development treatment, the portions of the insulating film PA which correspond to the openings OP are selectively removed, and the openings OP can thus be formed in the insulating film PA. It is also possible to subsequently perform heat treatment and cure the insulating film PA. The openings OP are formed so as to extend through the insulating film PA and, from the openings OP, parts of the wires M1 are exposed.

In another form, it is also possible to etch (e.g., dry-etch) the insulating film PA using a photoresist pattern formed over the insulating film PA using a photolithographic technique as an etching mask and thus form the openings OP in the insulating film PA. In that case, the insulating film PA need not be a photosensitive insulating film.

The openings OP include the emitter opening OPE and the gate opening OPG. The emitter opening OPE and the gate opening OPG are not connected to each other, but are spaced apart from each other. The emitter opening OPE is formed over the emitter wire M1E to expose a part of the emitter wire M1E. Consequently, the emitter opening OPE is included in the emitter wire M1E in plan view. The emitter wire M1E exposed from the opening OPE of the insulating film PA forms the emitter pad PDE as an emitter bonding pad. The gate opening OPG is formed over each of the gate wires M1G to expose a part of the gate wire M1G. Consequently, the gate opening OPG is included in the gate wire M1G in plan view. The gate wire M1G exposed from the opening OPG of the insulating film PA forms the gate pad PDG as the gate bonding pad.

Over the top surfaces of the wires M1 exposed from the openings OP (i.e., over the top surfaces of the bonding pads), metal layers (not shown) may also be further formed by a plating method or the like. Each of the metal layers is made of a laminated film including a nickel (Ni) film and a gold (Au) film which are formed in ascending order or the like. By forming the metal layers, it is possible to inhibit or prevent the top surface of the underlying aluminum (wires M1) from being oxidized.

Next, as necessary, the back surface of the semiconductor substrate SB (main surface opposite to the main surface thereof over which the insulating layer ZS is formed) is ground or polished to reduce the thickness of the semiconductor substrate SB.

Next, as shown in FIGS. 4 to 6 described above, over the back surface side of the semiconductor substrate SB, the p-type semiconductor region CL is formed using an ion implantation method or the like (Step S18 in FIG. 9), and the n-type semiconductor region FS is further formed using an ion implantation method or the like (Step S19 in FIG. 9). The order of Step S18 (step of forming the p-type semiconductor region CL) and Step S19 (step of forming the n-type semiconductor region FS) can also be reversed. In another form, it is also possible to perform Step S18 (step of forming the p-type semiconductor region CL) and Step S19 (step of forming the n-type semiconductor region FS) prior to Step S2 (step of forming the insulating layer ZS) described above.

Then, as shown in FIGS. 4 to 6 described above, the back-side electrode BE is formed over the entire back surface of the semiconductor substrate SB (Step S20 in FIG. 9). The back-side electrode BE is made of a laminated metal film including an aluminum (Al) film, a titanium (Ti) film, a nickel (Ni) film, and a gold (Au) film which are shown in order of increasing distance from the back surface of the semiconductor substrate SB and can be formed using, e.g., a vapor deposition method or the like.

Thus, the semiconductor device in the present embodiment is manufactured. Then, by dividing (splitting or cutting) the semiconductor substrate SB and the structure over the semiconductor substrate SB by dicing or the like, individual semiconductor chips (semiconductor devices CP) are obtained from the semiconductor substrate SB.

<About Configuration and Operation of IGBT>

Figure 26:
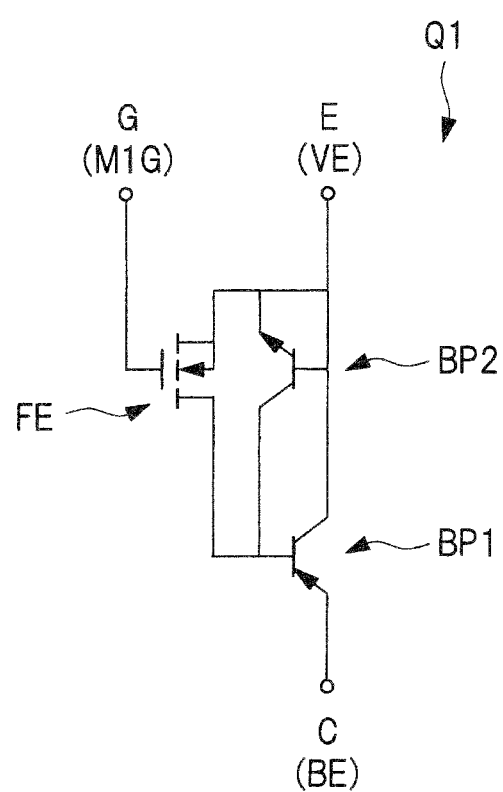
FIG. 26 is an equivalent circuit diagram of an IGBT included in a unit transistor.

FIG. 26 is an equivalent circuit diagram of the IGBT included in the foregoing unit transistor Q1 formed in the transistor cell region of the semiconductor substrate SB.

The circuit configuration of the IGBT formed in the semiconductor substrate SB will be described with reference to FIG. 26 and FIG. 7 described above. The reference letter E in FIG. 26 designates an emitter electrode, and the foregoing emitter via portion VE corresponds to an emitter electrode E. The reference letter C in FIG. 26 designates a collector electrode, and the foregoing back-side electrode BE corresponds to a collector electrode C. The reference letter G in FIG. 26 designates a gate electrode, and the foregoing gate via portion VG corresponds to an electrode for gate G.

As shown in FIG. 26, the IGBT included in the unit transistor Q1 formed in the unit transistor Q1 formed in the transistor cell region of the semiconductor substrate SB includes a pnp bipolar transistor BP1, an npn bipolar transistor BP2, and a field effect transistor FE. Here, the pnp bipolar transistor BP1 and the field effect transistor FE form the IGBT, while the npn bipolar transistor BP2 is a parasitic transistor formed parasitically in terms of a device structure. That is, the main components of the IGBT are the pnp bipolar transistor BP1 and the field effect transistor FE, while the npn bipolar transistor is a parasitic component.

The pnp bipolar transistor BP1 includes the p-type semiconductor region PR, the n-type region (the n-type semiconductor region EP1, the n-type substrate region NSB, and the n-type semiconductor region FS), and the p-type semiconductor region CL. The npn bipolar transistor BP2 as the parasitic component includes the $n^+$-type semiconductor region NR, the p-type semiconductor region PR, and the n-type region (the n-type semiconductor region EP1, the n-type substrate region SNB, and the n-type semiconductor region FS). The field effect transistor FE includes the $n^+$-type semiconductor region NR serving as the source region, the n-type region (the n-type semiconductor region EP1, the n-type substrate region SNB, and the n-type semiconductor region FS) serving as the drain region, the gate electrodes GE, and the gate insulating films GI. The p-type semiconductor region PR located between the $n^+$-type semiconductor region NR and the n-type semiconductor region EP1 and facing the gate electrodes GE via the gate insulating films GI serves as the channel formation region of the field effect transistor FR.

Next, a description will be given of the coupling relationships between the pnp bipolar transistor BPR1, the npn bipolar transistor BP2, and the field effect transistor FE. Between the emitter electrode E (corresponding to the emitter via portion VE) and the collector electrode C (corresponding to the back-side electrode BE), the pnp bipolar transistor BP1 is coupled. The base (the n-type semiconductor region EP1, the n-type substrate region NSB, and the n-type semiconductor region FS) of the pnp bipolar transistor BP1 is coupled to the drain region (the n-type semiconductor region EP1, the n-type substrate region NSB, and the n-type semiconductor region FS) of the field effect transistor FE. The source region (the $n^+$-type semiconductor region NR) of the field effect transistor FE is coupled to the emitter electrode E (the emitter via portion VE). At this time, the collector (the n-type semiconductor region EP1, the n-type substrate region NSB, and the n-type semiconductor region FS) of the parasitically formed npn bipolar transistor BR2 is coupled to the base (the n-type semiconductor region EP1, the n-type substrate region NSB, and the n-type semiconductor region FS) of the pnp bipolar transistor BP1. The emitter (the $n^+$-type semiconductor region NR) of the npn bipolar transistor BP2 is coupled to the emitter electrode E (the emitter via portion VE). The base (the p-type semiconductor region PR) of the parasitically formed npn bipolar transistor BP2 is coupled to the emitter electrode E (the emitter via portion VE).

Next, a description will be given of the operation of the IGBT with reference to FIGS. 7 and 26.

In the state where a potential higher than that of the emitter electrode E (the emitter via portion VE) is applied to the collector electrode C (the back-side electrode BE), a gate voltage of not less than the threshold voltage of each of the gate electrodes GE of the field effect transistor FE is applied to the gate electrode GE via the electrode for gate G (the gate via portion VG). This turns ON the field effect transistor FE so that a base current flows from the pnp bipolar transistor BP1. As a result, a current flows between the collector electrode C (the back-side electrode GE) coupled to the pnp bipolar transistor BP1 and the emitter electrode E (the emitter via portion VE). In short, the pnp bipolar transistor BP1 is turned ON (electrical conduction is achieved therein). Thus, the IGBT is turned ON (electrical conduction is achieved therein). Subsequently, to each of the gate electrodes GE of the field effect transistor FE, a gate voltage of not more than the threshold voltage of the gate electrode GE is applied. This turns OFF the field effect transistor FE and the base current no longer flows from the pnp bipolar transistor BP1. As a result, the current flowing between the collector electrode C (the back-side electrode BE) and the emitter electrode E (the emitter via portion VE) on the basis of the base current no longer flows. In short, the pnp bipolar BP1 is turned OFF so that the IGBT is turned OFF. Thus, in the IGBT, by controlling the ON/OFF state of the field effect transistor FE, the supply and interruption of the base current from the pnp bipolar transistor BP1 is controlled. The supply and interruption of the base current from the pnp bipolar transistor BP1 consequently controls the supply and interruption of a collector current from the pnp bipolar transistor BP1 to control the ON/OFF state of the IGBT. Accordingly, the IGBT is a semiconductor element having each of the high-speed switching property and voltage-driven property of the field effect transistor FE and the low-ON-voltage property of the pnp bipolar transistor BP1.

Next, an operation in the device structure will be described with reference to FIG. 7. In the state where a potential higher than that of the emitter via portion VE (the emitter electrode E) is applied to the back-side electrode GE (the collector electrode C), a gate voltage of not less than the threshold voltage of each of the gate electrodes GE is applied to the gate electrode GE via the gate via portion VG. As a result, in the p-type channel formation region (the p-type semiconductor region PR) facing the gate electrodes GE via the gate insulating films GI, an inversion layer (channel) made of an n-type semiconductor layer is formed. Consequently, the $n^+$-type semiconductor region NR and the n-type semiconductor region EP1 are electrically coupled to each other by the inversion layer (channel) so that electrons flow from the $n^+$-type semiconductor region NR into the n-type base region (the n-type semiconductor regions EP1, the n-type substrate region NSB, and the n-type semiconductor region FS) via the inversion layer. On the other hand, the junction between the n-type base region (the n-type semiconductor regions EP1, the n-type substrate region NSB, and the n-type semiconductor region FS) and the p-type collector region (the p-type semiconductor region CL) is forwardly biased. As a result, positive holes (holes) are implanted from the p-type collector region (the p-type semiconductor region CL) into the n-type base region (the n-type semiconductor region FS, the n-type substrate region NSB, and the n-type semiconductor region EP1). Accordingly, in the n-type base region (the n-type semiconductor region FS, the n-type substrate region NSB, and the n-type semiconductor region EP1), holes are stored. Positive charges resulting from the stored holes attract electrons so that a large number of electrons flow into the n-type base region (the n-type semiconductor region EP1, the n-type substrate region NSB, and the n-type semiconductor region FS). This reduces the resistance of the n-type base region (the n-type semiconductor region EP1, the n-type substrate region NSB, and the n-type semiconductor region FS). This phenomenon is so-called conductivity modulation and, by the conductivity modulation, the ON voltage of the IGBT is reduced. Then, the holes that have flown into the n-type base region (the n-type semiconductor region FS, the n-type substrate region NSB, and the n-type semiconductor region EP1) flow out into the emitter via portion VE (emitter electrode E) via the p-type semiconductor region PR. Thus, a current flows from the back-side electrode BE (collector electrode C) into the emitter via portion VE (emitter electrode E) to turn ON the IGBT. It can be considered that, at this time, the holes injected from the p-type collector region (the p-type semiconductor region CL) into the n-type base region (the n-type semiconductor region FS, the n-type substrate region NSB, and the n-type semiconductor region EP1) are recombined with the electrons present in the n-type base region (the n-type semiconductor region FS, the n-type substrate region NSB, and the n-type semiconductor region EP1). However, a semiconductor material containing silicon as a main component has a property such that the recombination between an electron and a hole is less likely to occur than in a semiconductor material containing a compound semiconductor as a main component. Accordingly, the majority of the holes injected into the n-type base region (the n-type semiconductor region FS, the n-type substrate region NSB, and the n-type semiconductor region EP1) are stored without being recombined with the electrons present in the n-type base region (the n-type semiconductor region FS, the n-type substrate region NSB, and the n-type semiconductor region EP1). As a result, the holes are stored in the n-type base region (the n-type semiconductor region FS, the n-type substrate region NSB, and the n-type semiconductor region EP1), and the electrons that have flown from the $n^+$-type semiconductor region NR in such a manner as to be attracted by the stored holes are stored in the n-type base region (the n-type semiconductor region FS, the n-type substrate region NSB, and the n-type semiconductor region EP1) to cause conductivity modulation. Accordingly, the IGBT has a property such that the ON voltage (voltage during the ON period) is reduced by the conductivity modulation.

The unit transistor Q1 forming such an IGBT is formed between the emitter via portion VE (the emitter electrode E) and the back-side electrode BE (the collector electrode C). A plurality of the unit transistors Q1 are formed in the transistor cell region of the semiconductor substrate SB to be regularly arranged (aligned). Since the individual emitter via portions VE (emitter electrodes E) are coupled to the common emitter wire M1E, the state is provided in which, between the emitter wire M1E and the back-side electrode BE, the plurality of unit transistors Q1 (unit IGBTs) are coupled in parallel. The gate electrodes GE of the plurality of unit transistors Q1 (unit IGBTs) are electrically coupled to each other via the gate wires M1G and electrically coupled to the common gate pad PDG through the gate wires M1G. The plurality of unit transistors Q1 (unit IGBTs) coupled in parallel form one power transistor (power IGBT) between the emitter wire M1E and the back-side electrode BE and consequently between the emitter pad PDE and the back-side electrode BE.

<About Studied Example>

Next, a description will be given of a semiconductor device in a studied example studied by the present inventors.

FIGS. 27 to 33 are main-portion cross-sectional views of the semiconductor device in the studied example studied by the present inventors during the manufacturing process thereof. The semiconductor device in the studied example is also a semiconductor device including an IGBT.

Figure 27:
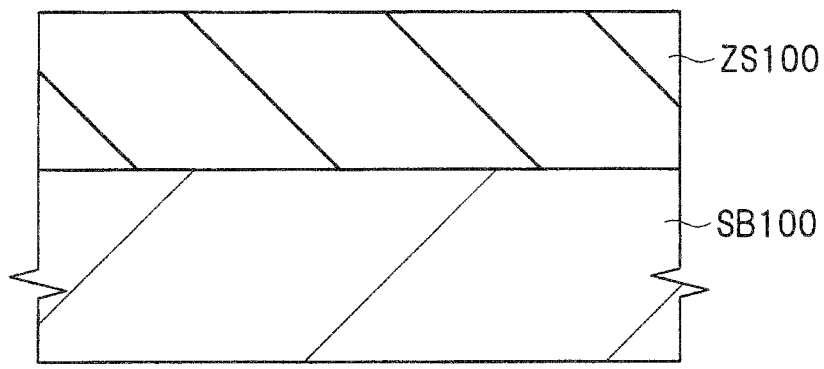
FIG. 27 is a main-portion cross-sectional view of a semiconductor device in a studied example during the manufacturing process thereof.
Figure 28:
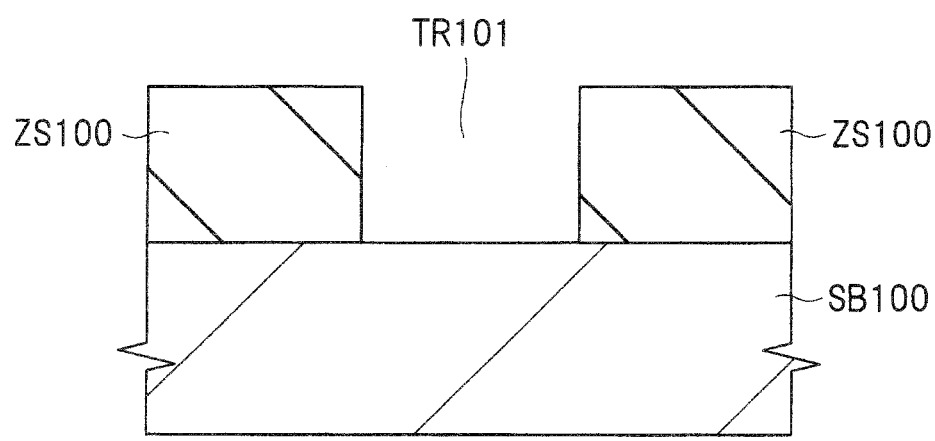
FIG. 28 is a main-portion cross-sectional view of the semiconductor device in the studied example during the manufacturing process thereof, which is subsequent to FIG. 27.
Figure 29:
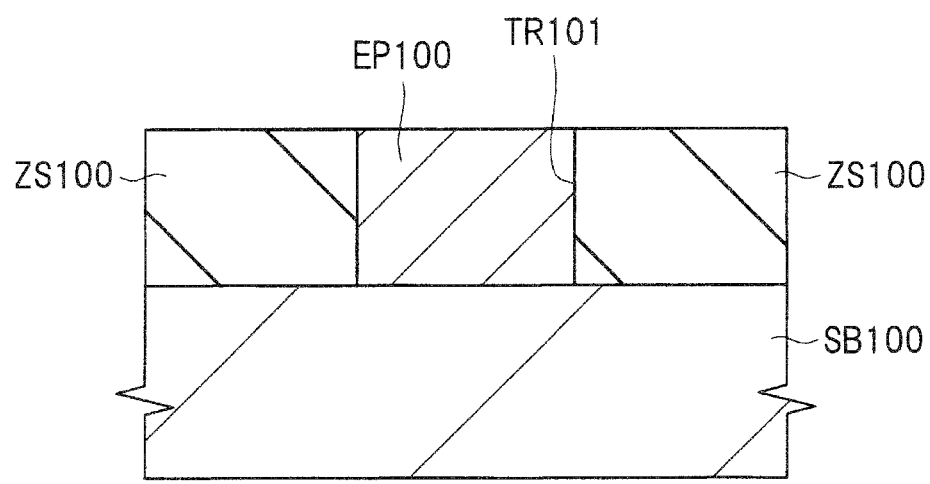
FIG. 29 is a main-portion cross-sectional view of the semiconductor device in the studied example during the manufacturing process thereof, which is subsequent to FIG. 28.

To manufacture the semiconductor device in the studied example, first, as shown in FIG. 27, an insulating layer ZS100 is formed over the entire main surface of an n-type semiconductor substrate SB100. Then, as shown in FIG. 28, using a photolithographic technique and an etching technique, a trench TR101 is formed in the insulating layer ZS100. The trench TR101 extends through the insulating layer ZS100 so that, at the bottom portion of the trench TR101, a part of the semiconductor substrate SB100 is exposed. Then, as shown in FIG. 29, over the semiconductor substrate SB100 exposed at the bottom portion of the trench TR101, an n-type semiconductor layer EP100 is formed by epitaxial growth. When the n-type semiconductor layer EP100 is formed, the state is reached in which the n-type semiconductor layer EP100 is embedded in the trench TR101.

Figure 30:
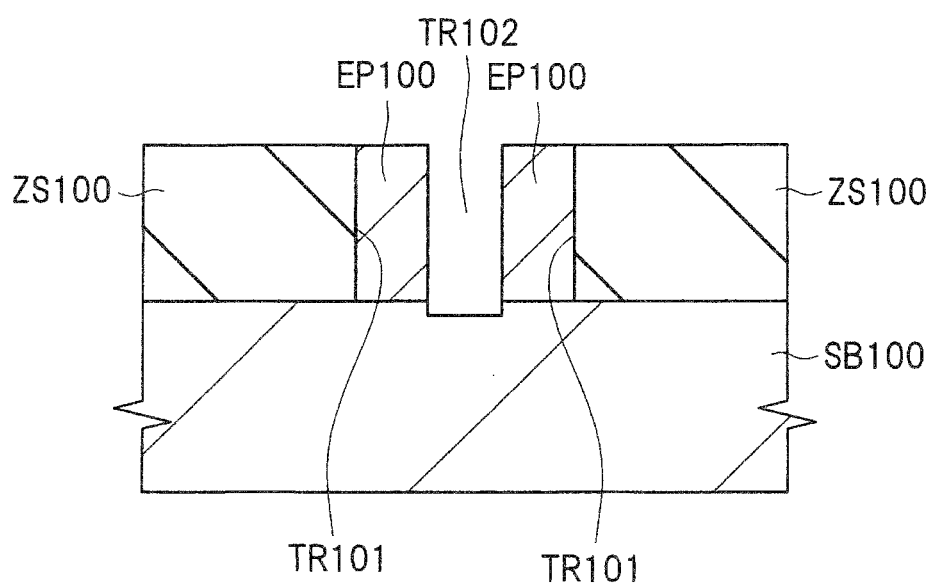
FIG. 30 is a main-portion cross-sectional view of the semiconductor device in the studied example during the manufacturing process thereof, which is subsequent to FIG. 29.
Figure 31:
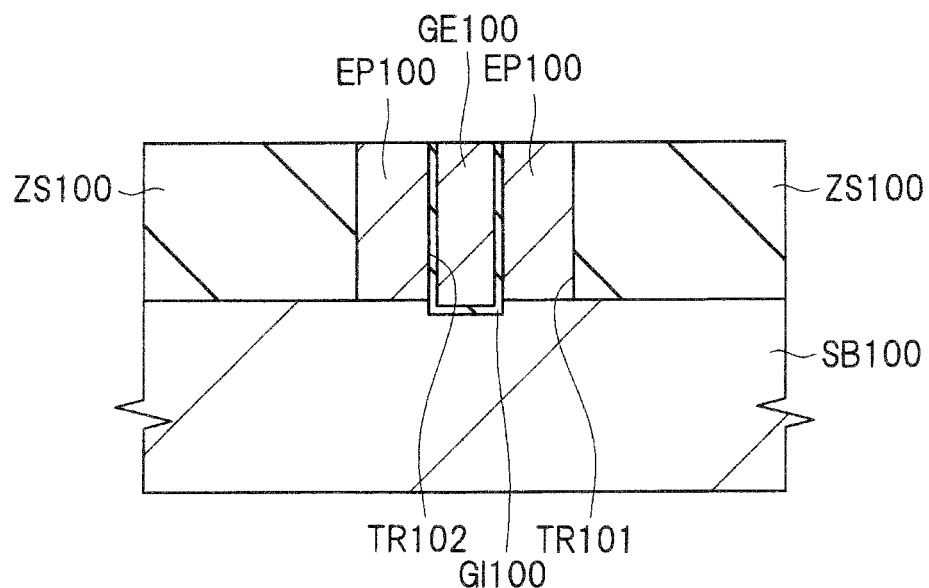
FIG. 31 is a main-portion cross-sectional view of the semiconductor device in the studied example during the manufacturing process thereof, which is subsequent to FIG. 30.
Figure 32:
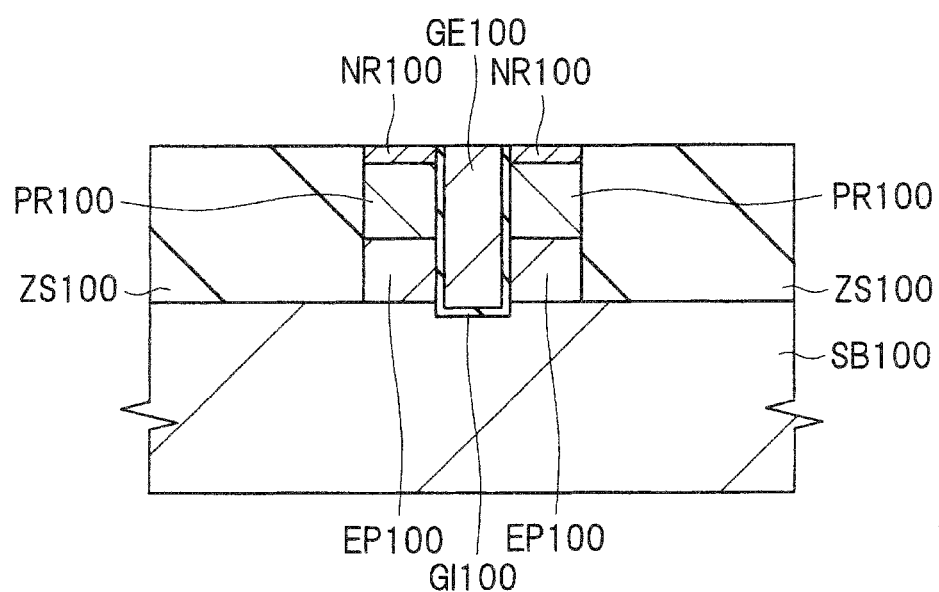
FIG. 32 is a main-portion cross-sectional view of the semiconductor device in the studied example during the manufacturing process thereof, which is subsequent to FIG. 31.

Then, as shown in FIG. 30, using a photolithographic technique and an etching technique, a trench TR102 is formed in the semiconductor layer EP100. Then, as shown in FIG. 31, in the trench TR102, a gate electrode GE100 is formed via a gate insulating film GI100. For example, after the gate insulating film GI100 is formed over the exposed surface of the semiconductor layer EP100, a gate electrode conductive film is formed over the semiconductor layer EP100 and the insulating layer ZS100 so as to be embedded in the trench TR102. Then, by removing the gate electrode conductive film located outside the trench TR102, the gate electrode GE100 can be formed to be embedded in the trench TR102 via the gate insulating film GI100. Then, as shown in FIG. 32, in the upper portion of the semiconductor layer EP, a p-type base layer PR100 is formed by ion implantation and, in the upper portion of the p-type base layer PR100, an n-type emitter layer NR100 is formed by ion implantation.

Figure 33:
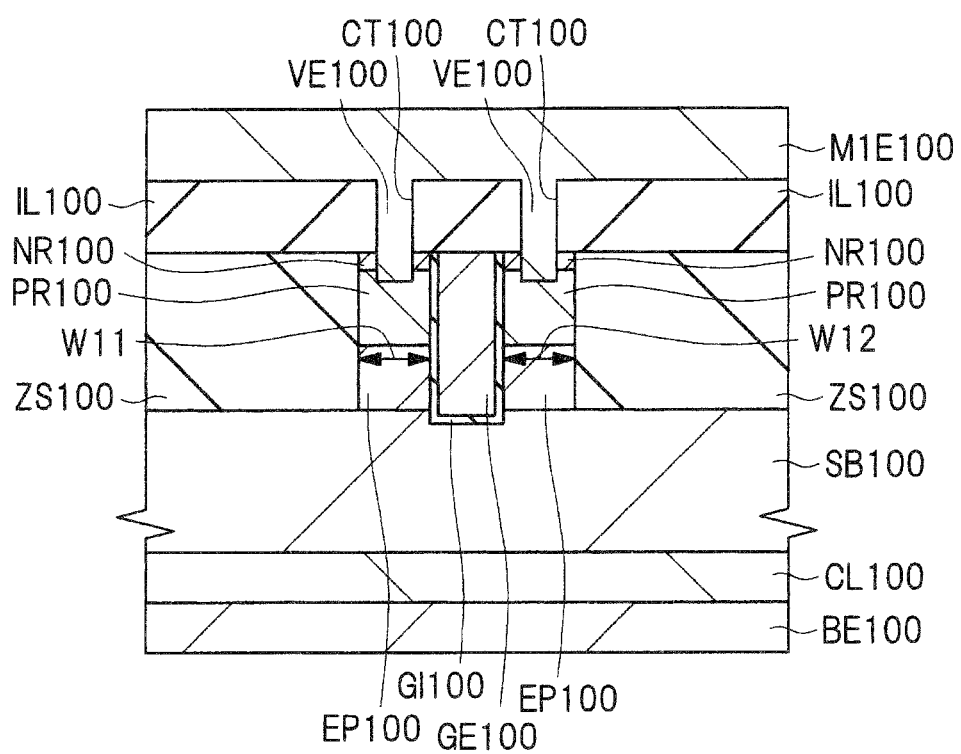
FIG. 33 is a main-portion cross-sectional view of the semiconductor device in the studied example during the manufacturing process thereof, which is subsequent to FIG. 32.

Then, as shown in FIG. 33, over the insulating layer ZS100, an insulating layer ID 00 is formed so as to cover the semiconductor layer EP100 and the gate electrode GE100. Subsequently, contact holes CT100 are formed to extend through the insulating layer ID 00 and the n-type emitter layer NR100 and reach the p-type base layer PR100. Then, over the insulating layer ID 00, a conductive film is formed so as to be embedded in the contact holes CT100. Then, using a photolithographic technique and an etching technique, the conductive film is patterned to form an emitter wire M1E100 and emitter via portions VE100. The emitter via portions VE100 are formed integrally with the emitter wire M1E100 to be embedded in the contact holes CT100. The emitter via portions VE100 are in contact with and electrically coupled to both of the p-type base layer PR100 and the n-type emitter layer NR100. Thereafter, a protective film corresponding to the foregoing insulating film PA is formed, and a p-type collector layer CL100 is further formed on the back side of the semiconductor substrate SB100. Then, a back-side collector electrode GE100 is formed to come in contact with the p-type collector layer CL100.

In the semiconductor device in the studied example shown in FIGS. 27 to 33, in the trench TR101 of the insulating layer ZS100, the n-type semiconductor layer EP100 is embedded, the trench TR102 is formed in the semiconductor layer EP100, and the gate electrode GE100 is embedded in the trench TR102 via the gate insulating film GI100. Consequently, in the studied example, a structure is provided in which, on either side of the gate electrode GE100, the semiconductor layer EP100 including the n-type emitter layer NR100 and the p-type base layer PR100 is present and, outside the semiconductor layer EP100 (on the side away from the gate electrode GE100), the insulating layer ZS100 is present. Accordingly, it is possible to reduce the widths W11 and W12 of the portions of the n-type semiconductor layer EP100 which are located under the p-type base layer PR100 and interposed between the insulating layer ZS100 and the gate electrode GE100. As a result, a hole current flowing from the collector side toward the p-type base layer PR100 is localized to the n-type semiconductor layer EP100 having the narrow widths W11 and W12. This can enhance the density of carriers (density of holes)

stored in the n-type semiconductor layer EP100. Therefore, it is possible to enhance an IE (Injection Enhancement) effect and promote the ON voltage reduction by the conductivity modulation.

However, as a result of conducting study, the present inventors have found that, in the semiconductor device in the studied example shown in FIGS. 27 to 33, such a problem as shown below arises.

In the semiconductor device in the studied example shown in FIGS. 27 to 33, the n-type semiconductor layer EP100 is embedded in the trench TR101 of the insulating layer ZS100, the trench TR102 is formed in the semiconductor layer 100, and the gate electrode GE100 is embedded in the trench TR102 via the gate insulating film GI100. Since the trenches TR101 and TR102 are formed in different steps, in terms of the relative positional relationship between the trenches TR101 and TR102, it is not easy to form the trenches TR101 and TR102 exactly as designed. For example, due to misalignment in the photolithographic technique used when the trench TR101 is formed and misalignment in the photolithographic technique used when the trench TR102 is formed, the position where the trench TR102 is formed relative to the position where the trench TR101 is formed may be displaced from the design position. The displacement of the position where the trench TR102 is formed relative to the position where the trench TR101 is formed from the design position leads to the deviation of the widths W11 and W12 of the n-type semiconductor layer EP100 from design values. Here, the width of the semiconductor layer EP100 on one (left side in FIG. 33) of both sides of the gate electrode GE100 corresponds to the width W11, and the width of the semiconductor layer EP100 on the other (right side in FIG. 33) of both sides of the gate electrode GE100 corresponds to the width W12.

For example, in the case where, in FIG. 33, the trench TR102 should be formed at the middle of the trench TR101 in design, when the trench TR102 is formed at a position displaced leftward from the middle of the trench TR101, the width W11 is smaller than the design value, while the width W12 is larger than the design value. On the other hand, in the case where, in FIG. 33, the trench TR102 should be formed at the middle of the trench TR101 in design, when the trench TR102 is formed at a position displaced rightward from the middle of the trench TR101, the width W11 is larger than the design value, while the width W12 is smaller than the design value.

The values of the widths W11 and W12 are important in determining the electric characteristics of the IGBT. When the values of the widths W11 and W12 are deviated from the design values, characteristic variations or the like occur to degrade the performance of the semiconductor device and consequently degrade the reliability of the semiconductor device. In particular, an attempt to reduce the design values of the widths W11 and W12 for further enhancement of the IE effect results in larger characteristic variations when the values of the widths W11 and W12 are deviated from the design values.

In the semiconductor device in the studied example shown in FIG. 33, immediately under the lower surface of the gate electrode GE100, the thin gate insulating film GI100 is present to serve as a capacitive insulating film and undesirably increase a parasitic capacitance resulting from the gate electrode GE100, e.g., a gate-collector parasitic capacitance. The increased gate-collector parasitic capacitance leads to a reduction in the switching speed of the IGBT, and consequently to the degradation of the performance of the semiconductor device.

Also, in the semiconductor device in the studied example shown in FIG. 33, over the both side surfaces and lower surface of the gate electrode GE100, the gate insulating film GI100 is formed. This increases the total area of the gate insulating film GI100 formed over the surfaces of the gate electrode GE100. The gate insulating film GI100 is a relatively thin insulating film. When a dielectric breakdown occurs even in one portion of the gate insulating film GI100, the IGBT will be completely destructed. Accordingly, to maximally enhance the reliability of the semiconductor device, the total area of the gate insulating film GI100 is preferably minimized.

Also, in the semiconductor device in the studied example shown in FIG. 33, the width of the semiconductor layer EP100 is uniform irrespective of a depth position. That is, the width of the semiconductor layer EP100 in the upper portion thereof is the same as the width of the semiconductor layer EP100 in the lower portion thereof. Accordingly, an attempt to reduce the design values of the widths W11 and W12 for further enhancement of the IE effect reduces the ease of forming the contact hole CT100 over the semiconductor layer EP100. The attempt to reduce the design values of the widths W11 and W12 also reduces the possibility of successfully forming, in the upper portion of the semiconductor layer EP100, the structure in which the emitter via portion VE100 is coupled to both of the n-type emitter layer NR100 and the p-type base layer PR100 and the n-type emitter layer NR100 functioning also as the source region faces the gate electrode GE100 via the gate insulating film GI100. When the design values of the widths W11 and W12 are increased to avoid this situation, the IE effect deteriorates.

<About Main Characteristic Features and Effects>

The semiconductor device in the present embodiment includes the n-type semiconductor substrate SB, the insulating layer ZS formed over the main surface of the semiconductor substrate SB, the trench TR formed in the insulating layer ZS, the semiconductor layer EP formed over the semiconductor substrate SB exposed at the bottom portion of the trench TR in the trench TR, and the pair of gate electrodes GE formed on both sides of the semiconductor layer EP in the trench TR such that the semiconductor layer EP is interposed therebetween. The semiconductor device in the present embodiment further includes the gate insulating films GI interposed between the semiconductor layer EP and the pair of gate electrodes GE in the trench TR, the insulating layer IL formed over the insulating layer ZS so as to cover the semiconductor layer EP and the pair of gate electrodes GE, and the contact hole CT1 formed over the semiconductor layer EP to extend through the insulating layer IL and reach the semiconductor layer EP. The semiconductor device in the present embodiment further includes the emitter via portion VE (electrode portion or emitter electrode) formed in the contact hole CT1, the p-type semiconductor region CL formed on the back surface side of the semiconductor substrate SB opposite to the side thereof where the insulating layer ZS is formed, and the back-side electrode GE formed over the back surface of the semiconductor substrate SB and electrically coupled to the p-type semiconductor region CL. In the upper portion of the semiconductor layer EP, the p-type semiconductor region PR and the $n^+$-type semiconductor region NR over the p-type semiconductor region PR are formed. The portion of the semiconductor layer EP which is located under the p-type semiconductor region PR has the n-type conductivity type. The emitter via portion VE (electrode portion or emitter electrode) is electrically coupled to the p-type semiconductor region PR and the n$^+$-type semiconductor region NR. Under the pair of gate electrodes GE formed on both sides of the semiconductor layer EP, parts of the insulating layer ZS are present. The side surfaces of the pair of gate electrodes GE which are opposite to those thereof facing the semiconductor layer EP via the gate insulating films GI are adjacent to the insulating layer ZS.

One of the main characteristic features of the semiconductor device in the present embodiment is that, in the trench TR of the insulating layer ZS formed over the main surface of the semiconductor substrate SB, the semiconductor layer EP formed over the semiconductor substrate SB exposed at the bottom portion of the trench TR and the pair of gate electrodes GE formed on both sides of the semiconductor layer EP such that the semiconductor layer EP is interposed therebetween are formed. In the trench TR, between the semiconductor layer EP and the pair of gate electrodes GE, the gate insulating films GI are interposed. Under the pair of gate electrodes GE formed on both sides of the semiconductor layer EP, parts of the insulating layer ZS are present. The side surfaces of the pair of gate electrodes GE which are opposite to those thereof facing the semiconductor layer EP via the gate insulating films GI are adjacent to the insulating layer ZS.

In the semiconductor device in the present embodiment, in the trench TR of the insulating layer ZS, the semiconductor layer EP formed over the semiconductor substrate SB and the pair of gate electrodes GE formed on both sides of the semiconductor layer EP are formed and, in the semiconductor layer EP, the p-type semiconductor region PR and the n$^+$-type semiconductor region NR are formed. Accordingly, it is possible to reduce the width (width in the X-direction) of the portion of the semiconductor layer EP (n-type semiconductor region EP1) which is located under the p-type semiconductor region PR. As a result, the hole current flowing from the collector side toward the p-type base layer (p-type base region PR) is localized to the n-type semiconductor layer EP (n-type semiconductor layer EP1) having a narrow width. This can enhance the density of carriers (density of holes) stored in the n-type semiconductor layer EP (n-type semiconductor layer EP1). Therefore, it is possible to enhance the IE (Injection Enhancement) effect, promote a reduction in ON voltage (voltage during the ON period), and consequently reduce ON voltage (voltage during the ON period) reduction. This allows an improvement in the performance of the semiconductor device.

In the structure of the semiconductor device in the studied example shown in FIG. 33 described above, in the trench TR101 of the insulating layer ZS100 formed over the main surface of the semiconductor substrate SB100, the semiconductor layer EP100 and the gate electrode GE100 are formed. However, the gate electrode GE100 is not provided on both sides of the semiconductor layer EP100, but the semiconductor layer EP100 is provided on either side of the gate electrode GE100. As a result, the thin gate insulating film GI100 immediately under the lower surface of the gate electrode GE100 serves as the capacitive insulating film to undesirably increase the parasitic capacitance resulting from the gate electrode GE100, e.g., the gate-collector parasitic capacitance. Also, in the semiconductor device in the studied example shown in FIG. 33 described above, the gate insulating film GI100 is formed over the both side surfaces and lower surface of the gate electrode GE100. This undesirably increases the total area of the gate insulating film GI100.

By contrast, in the present embodiment, in the trench TR of the insulating layer ZS formed over the main surface of the semiconductor substrate SB, the semiconductor layer EP and the pair of gate electrodes Ge formed on both sides of the semiconductor layer EP are formed. Under the pair of gate electrodes GE, parts of the insulating layer ZS are present. The side surfaces of the pair of gate electrodes GE opposite to those thereof facing the semiconductor layer EP via the gate insulating films GI are adjacent to the insulating layer ZS.

In the present embodiment, under the gate electrodes GE, parts of the insulating layer ZS are present. In the structure in the present embodiment, the lower surfaces of the gate electrodes GE do not face a semiconductor or a semiconductor region via the thin gate insulating films GI. Accordingly, it is possible to suppress the parasitic capacitance resulting from the gate electrodes GE, e.g., the gate-collector parasitic capacitance. This allows an improvement in the performance of the semiconductor device. For example, an increase in the gate-collector parasitic capacitance leads to a reduction in the switching speed of the IGBT. However, in the present embodiment, it is possible to suppress the gate-collector parasitic capacitance and therefore improve the switching speed of the IGBT.

Also, in the present embodiment, under the gate electrodes GE, parts of the insulating layer ZS is present, and the side surfaces of the gate electrodes GE opposite to those thereof facing the semiconductor layer EP via the gate insulating films GI are adjacent to the insulating layer ZS. Accordingly, the gate electrodes GE are adjacent to the semiconductor region via the thin gate insulating films IG only at the side surfaces thereof facing the semiconductor layer EP via the gate insulating films GI. The side surfaces of the gate electrodes GE opposite to those thereof facing the semiconductor layer EP via the gate insulating films GI and the lower surfaces of the gate electrodes GE are not adjacent to the semiconductor region via the thin gate insulating films GI, but are adjacent to the insulating layer ZS. This allows a reduction in the total area of the gate insulating films GI in contact with the gate electrodes GE. Each of the gate insulating films GI is a relatively thin insulating film and, when a dielectric breakdown occurs even in one portion of the gate insulating film GI, the IGBT will be completely destructed. However, in the present embodiment, it is possible to reduce the total area of the gate insulating films GI and thus reduce the probability of the occurrence of a dielectric breakdown in the gate insulating film GI. Therefore, it is possible to improve the reliability of the semiconductor device.

In the manufacturing process of the semiconductor device in the present embodiment, in Step S1, the n-type semiconductor substrate SB for the n-type base region is provided. In Step S2, the insulating layer ZS is formed over the main surface of the semiconductor substrate SB. In Step S3, the trench TR1a is formed in the insulating layer ZS to extend therethrough and expose a part of the semiconductor substrate SB. Then, in Step S4, over the semiconductor substrate SB exposed at the bottom portion of the trench TR1a, the n-type semiconductor layer EP is formed so as to be embedded in the trench TR1a. Then, in Step S5, in the insulating layer ZS, on both sides of the trench TR1a, the pair of trenches TR2a are formed such that the trench TR1a is interposed therebetween. In Step S6, the pair of trenches TR2 are expanded to expose parts of the side surfaces of the semiconductor layer EP. Note that, in Step S5, the side surfaces of the semiconductor layer EP are not exposed from the pair of trenches TR2a, and the pair of trenches TR2a have not reached the semiconductor substrate SB. Then, in Step S7, over the side surfaces of the semiconductor layer EP exposed from the pair of trenches TR2a, the insulating films GIa for gate insulating films are formed. In Step S8, in the pair of trenches TR2a, the respective gate electrodes GE are formed. In Steps S9 and S10, in the upper portion of the semiconductor layer EP, the p-type base region (p-type semiconductor region PR) and the n-type emitter region (n+-type semiconductor region NR) are formed.

In the studied example shown in FIGS. 27 to 33 described above, in the semiconductor layer EP100 embedded in the trench TR101, the trench TR102 is formed and, in the trench TR102, the gate electrode GE100 is embedded via the gate insulating film GI100. As a result, when the position where the trench TR102 is formed relative to the position where the trench TR101 is formed is displaced from the design position as described above, the widths W11 and W12 of the n-type semiconductor layer EP100 are deviated from the design values to cause characteristic variations or the like and degrade the performance of the semiconductor device.

By contrast, in the present embodiment, the trenches TR2a are not formed in the semiconductor layer EP embedded in the trench TR1a, but are formed on both sides of the trench TR1a in the insulating layer ZS in Step S5. At this stage, the side surfaces of the semiconductor layer EP are not exposed from the trenches TR2a. Then, in Step S6, the trenches TR2a are expanded to expose parts of the side surfaces of the semiconductor layer EP. Consequently, the width (width in the X-direction) of the semiconductor layer EP is defined by the width (width in the X-direction) of the trench TR1a formed in Step S3. Even when the position where the trench TR2a is formed in Step S5 is displaced from the design position, it is possible to inhibit or prevent the width (width in the X-direction) of the semiconductor layer EP from being deviated from the design value. The deviation of the width (width in the X-direction) of the semiconductor layer EP may cause characteristic variations. However, in the present embodiment, it is possible to inhibit or prevent the width (width in the X-direction) of the semiconductor layer EP from being deviated from the design value. This can inhibit or prevent characteristic variations and improve the performance of the semiconductor device. This can also improve the reliability of the semiconductor device.

In the present embodiment, at the stage where the trenches TR2a are formed in Step S5, the side surfaces of the semiconductor layer EP have not been exposed from the trenches TR2a. By expanding the trenches TR2a in Step S6, parts of the side surfaces of the semiconductor layer EP are exposed from the trenches TR2a. This is because, since the trenches TR2a are formed in Step S5 to be spaced apart from the trench TR1a, i.e., spaced apart from the semiconductor layer EP embedded in the trench TR1a, the side surfaces of the semiconductor layer EP are not exposed from the trenches TR2a at the stage where the trenches TR2a are formed in Step S5 and, by expanding the trenches TR2a in Step S6, the side surfaces of the semiconductor layer EP are exposed from the trenches TR2a. As a result, even when the positions where the trenches TR2a are formed in Step S5 are rather displaced from the design positions, by expanding the trenches TR2a in Step S6, parts of the side surfaces of the semiconductor layer EP can be exposed from the trenches TR2a. Therefore, by Steps S5 and S6, the trenches TR2a can be formed by self-alignment at positions located on both sides of the semiconductor layer EP and adjacent to the semiconductor layer EP.

Thus, in the present embodiment, even when the positions where the trenches TR2a are formed in Step S5 relative to the position where the trench TR1a is formed in Step S3 are rather displaced from the design positions, at the stage where Step S6 is ended, the width of the semiconductor device EP can have a dimension which is substantially the same as the design value. In addition, the trenches TR2a can be formed by self-alignment at positions located on both sides of the semiconductor layer EP and adjacent to the semiconductor layer EP. Then, in Step S7, the insulating films IG1a for gate insulating films are formed over the side surfaces of the semiconductor layer EP exposed from the trenches TR2a and, in Step S8, the gate electrodes GE are formed in the trenches TR2a. As a result, even when the positions where the trenches TR2a are formed in Step S5 relative to the position where the trench TR1a is formed in Step S3 are rather displaced from the design positions, at the stage where Step S8 is ended, the width of the semiconductor layer EP can have a dimension which is substantially the same as the design value. In addition, the gate electrodes GE can be formed at positions located on both sides of the semiconductor layer EP and adjacent to the semiconductor layer EP via the insulating film GI1a (gate insulating films GI). Since it is possible to inhibit or prevent the width of the semiconductor layer EP from being deviated from the design value, it is possible to inhibit or prevent characteristic variations and improve the performance of the semiconductor device. It is also possible to improve the reliability of the semiconductor device. Moreover, since it is possible to allow the positions where the trenches TR2a are formed in Step S5 relative to the position where the TR1a is formed in Step S3 to be rather displaced from the design positions, the manufacturing process of the semiconductor device can easily be performed. This allows an improvement in the manufacturing yield of the semiconductor device. This also allows easy control of the manufacturing process.

When any pattern (e.g., trench) is formed using a photolithographic step, due to the misalignment of a photomask or the like, the position where the pattern (e.g., trench) is formed may be displaced from the design position. However, the dimensions of the pattern (e.g., trench) scarcely vary and the pattern (e.g., trench) can be formed to have substantially the same dimensions as design values. Since the width of the semiconductor layer EP in the manufactured semiconductor device is mainly defined by the width of the trench TR1a formed in Step S3, it is possible to inhibit or prevent the width of the semiconductor layer EP from being deviated from the design value. Therefore, it is possible to inhibit or prevent characteristic variations resulting from variations in the width of the semiconductor layer EP and improve the performance of the semiconductor device. In addition, it is possible to improve the reliability of the semiconductor device.

It is also possible to maintain the width (width in the X-direction) of the semiconductor layer EP substantially uniform irrespective of a depth position. However, as shown in FIG. 7 described above, the width (width in the X-direction) of the semiconductor layer EP is preferably set relatively large in the upper portion of the semiconductor layer EP.

Specifically, in the semiconductor device in the present embodiment, it is preferable that the width W1 of the semiconductor layer EP at the depth position of the bottom surface of the contact hole CT1 and the width W2 of the portion of the semiconductor layer EP which is located under the p-type semiconductor region PR and interposed between the gate electrodes GE satisfy a relationship represented by W1>W2. That is, it is preferable that the width W1 is larger than the width W2. In other words, it is preferable that the width W2 is smaller than the width W1. Note that the widths W1 and W2 are shown in FIG. 7 described above. Each of the widths W1 and W2 is a width (dimension) in the X-direction. The width W1 is the width of the semiconductor layer EP at the depth position of the bottom surface of the contact hole CT1. Since the depth position of the bottom surface of the contact hole CT1 is substantially the same as the depth position of the bottom surface (lower surface) of the emitter via portion VE, the width W1 can also be regarded as the width of the semiconductor layer EP at the depth position of the bottom surface (lower surface) of the emitter via portion VE. The width W2 is the width of the portion of the semiconductor layer EP which is located under the p-type semiconductor region PR and interposed between the gate electrodes GE. The width W2 can also be regarded as the width of the semiconductor layer EP at a position deeper than the p-type semiconductor region PR and shallower than the lower surface of each of the gate electrodes GE.

Next, a description will be given of the reason why it is preferable to satisfy the relationship represented by W1>W2.

To enhance the IE effect, it is effective to reduce the width W2 of the semiconductor layer EP (n-type semiconductor region EP1) under the p-type semiconductor region PR. By reducing the width W2, it is possible to enhance the density of carriers (density of holes) stored in the n-type semiconductor layer EP (n-type semiconductor region EP1) under the p-type semiconductor region PR and therefore enhance the IE effect.

On the other hand, the width W1 of the semiconductor layer EP at the depth position of the bottom surface of the contact hole CT1 is preferably increased to a degree. When the width W1 is small, the contact hole CT1 is hard to form. For example, in the case where the width W1 is small, when the position where the contact hole CT1 is formed is displaced from the design position, the contact hole CT1 overlaps the gate electrode GE, and the emitter via portion VE formed in the contact hole CT1 may be short-circuited to the gate electrode GE. When the width (width in the X-direction) W9 of the contact hole CT1 is further reduced to prevent such a short circuit, the contact resistance of the emitter via portion VE formed in the contact hole CT1 undesirably increases. When the contact resistance of the emitter via portion VE has increased, the npn bipolar transistor BR2 as the parasitic bipolar transistor described above is more likely to be turned ON. Therefore, the contact resistance of the emitter via portion VE is preferably reduced. Accordingly, it is preferable to increase the width W9 of the contact hole CT1 to a degree. The width W9 of the contact hole CT1, which is shown in FIG. 7 described above, is a width (dimension) in the X-direction. To allow the n$^+$-type semiconductor region NR to be present at a position adjacent to the gate electrodes GE via the gate insulating films GI when the contact hole CT1 is formed, the width W9 of the contact hole CT1 is smaller than the width W1 of the semiconductor layer EP at the depth position of the bottom surface of the contact hole CT1 (W9<W1).

Accordingly, in the present embodiment, the width W1 of the semiconductor layer EP at the depth position of the bottom surface of the contact hole CT1 is set larger than the width W2 of the portion of the semiconductor layer EP which is located under the p-type semiconductor region PR and interposed between the gate electrodes GE (W1>W2). By thus reducing the width W2, it is possible to enhance the IE effect and further reduce the ON voltage and, by thus increasing the width W1, the contact hole CT1 is more easily formed. That is, by satisfying W1>W2, it is possible to simultaneously improve the IE effect and allow easy formation of the contact hole CT1. In addition, by increasing the width W1, a structure in which the emitter via portion VE in the contact hole CT1 is coupled to both of the n-type emitter layer (n$^+$-type semiconductor region NR) and the p-type base layer (p-type semiconductor region PR) and the n-type emitter layer (n$^+$-type semiconductor region NR) functioning as a source region faces the gate electrodes GE via the gate insulating films GI is more easily formed in the upper portion of the semiconductor layer EP. By thus reducing the width W2 to achieve an improvement in the performance of the semiconductor device and also increasing the width W1, the manufacturing process of the semiconductor device is more easily performed and the manufacturing yield of the semiconductor device can be improved. Since the increased width W1 allows the width W9 of the contact hole CT1 to be increased, the contact resistance of the emitter via portion VE can be reduced. In terms of this point also, the performance of the semiconductor device can be improved.

When W1=W2 is satisfied, the width W9 of the contact hole CT1 cannot be set larger than the width W2 of the semiconductor layer EP under the p-type semiconductor region PR (W9>W2 cannot be satisfied). However, by satisfying W1>W2, the width W9 of the contact hole CT1 can be set larger than the width W2 of the semiconductor layer EP under the p-type semiconductor region PR (W9>W2 can be satisfied). As a result, in the present embodiment, it is also possible to set the width W9 larger than the width W2 (satisfy W9>W2) and set the width W1 larger than the width W9 (satisfy W1>W9). That is, it is also possible to satisfy W1>W9>W2. In this case, by satisfying W9>W2 and thus reducing the width W2, it is possible to enhance the IE effect and further reduce the ON resistance and, by increasing the width W9 of the contact hole CT1, it is possible to reduce the contact resistance of the emitter via portion VE. By satisfying W1>W9, even when the contact hole CT1 is formed, it is possible to allow the n$^+$-type semiconductor region NR to be present at a position adjacent to the gate electrodes GE via the gate insulating films GI.

To satisfy the relationship represented by W1>W2 in the manufactured semiconductor device, it may be appropriate to inventively modify the shape of the trench TR1a formed in Step S3. That is, in the trench TR1a formed in Step S3, the width W3 of the upper portion of the trench TR1a is set larger than the width W4 of the lower portion of the trench TR1a (W3>W4). From another perspective, in the lower portion of the trench TR1a, the side surface (side wall) of the trench TR1a is substantially perpendicular to the main surface of the semiconductor substrate SB and the width W4 of the trench TR1a is substantially uniform irrespective of a depth position while, in the upper portion of the trench TR1a, the width W3 of the trench TR1a is set larger at a shallower depth position. From still another perspective, in the lower portion of the trench TR1a, the side surface (side wall) of the trench TR1a is substantially perpendicular to the main surface of the semiconductor substrate SB while, in the upper portion of the trench TR1a, the side surface of the trench TR1a is tapered. Note that the widths W3 and W4 are shown in FIG. 15 described above. Each of the widths W3 and W4 is a width (dimension) in the X-direction. The foregoing widths W5a, W5b, and W6 described in relation to FIGS. 13 to 15 described above are also widths (dimensions) in the X-direction.

Consequently, in the semiconductor layer EP formed in the trench TR1a in Step S4, the width W7 of the upper portion of the semiconductor layer EP is larger than the width W8 of the lower portion of the semiconductor layer EP (W7>W8). From another perspective, in the lower portion of the semiconductor layer EP, the side surface (side wall) of the semiconductor layer EP is substantially perpendicular to the main surface of the semiconductor substrate SB and the width W8 of the semiconductor layer EP is substantially uniform irrespective of a depth position while, in the upper portion of the semiconductor layer EP, the width W7 of the semiconductor layer EP is larger at a shallower depth position. From another perspective, in the lower portion of the semiconductor layer EP, the side surface (side wall) of the semiconductor layer EP is substantially perpendicular to the main surface of the semiconductor substrate SB while, in the upper portion of the semiconductor layer EP, the side surface of the semiconductor layer EP is tapered. Note that the widths W7 and W8 are shown in FIG. 16 described above. Each of the widths W7 and W8 is a width (dimension) in the X-direction. Since the semiconductor layer EP is formed so as to be embedded in the trench TR1a, the side surface of the semiconductor layer EP substantially coincides with the inner surface of the trench TR1a. Accordingly, the width W7 is substantially the same as the foregoing width W3, and the width W8 is substantially the same as the foregoing width W4.

By thus inventively modifying the shape of the trench TR1a formed in Step S3 and thereby inventively modifying the shape of the semiconductor layer EP formed in Step S4, it is possible to satisfy the relationship represented by W1>W2 described above and enjoy the effects described above.

Embodiment 2

Figure 34:
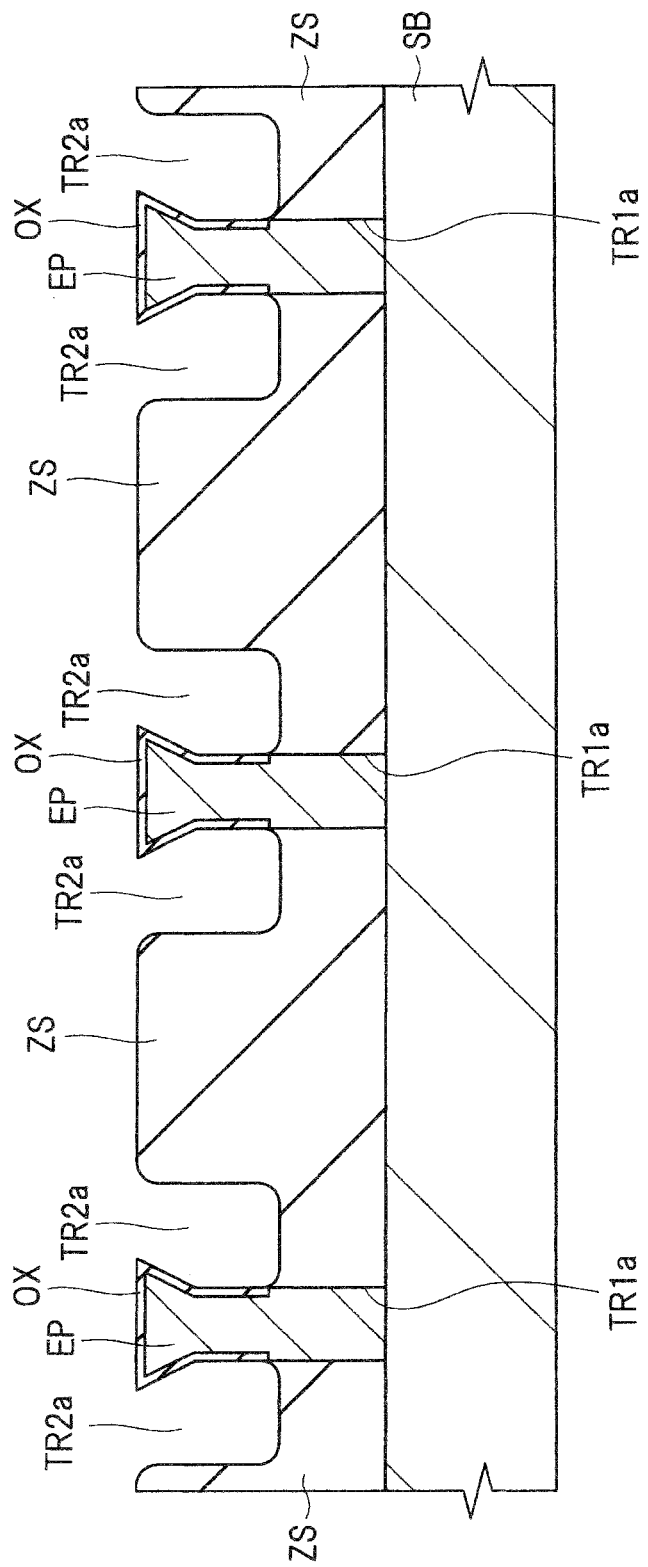
FIG. 34 is a main-portion cross-sectional view of a semiconductor device in another embodiment during the manufacturing process thereof.
Figure 35:
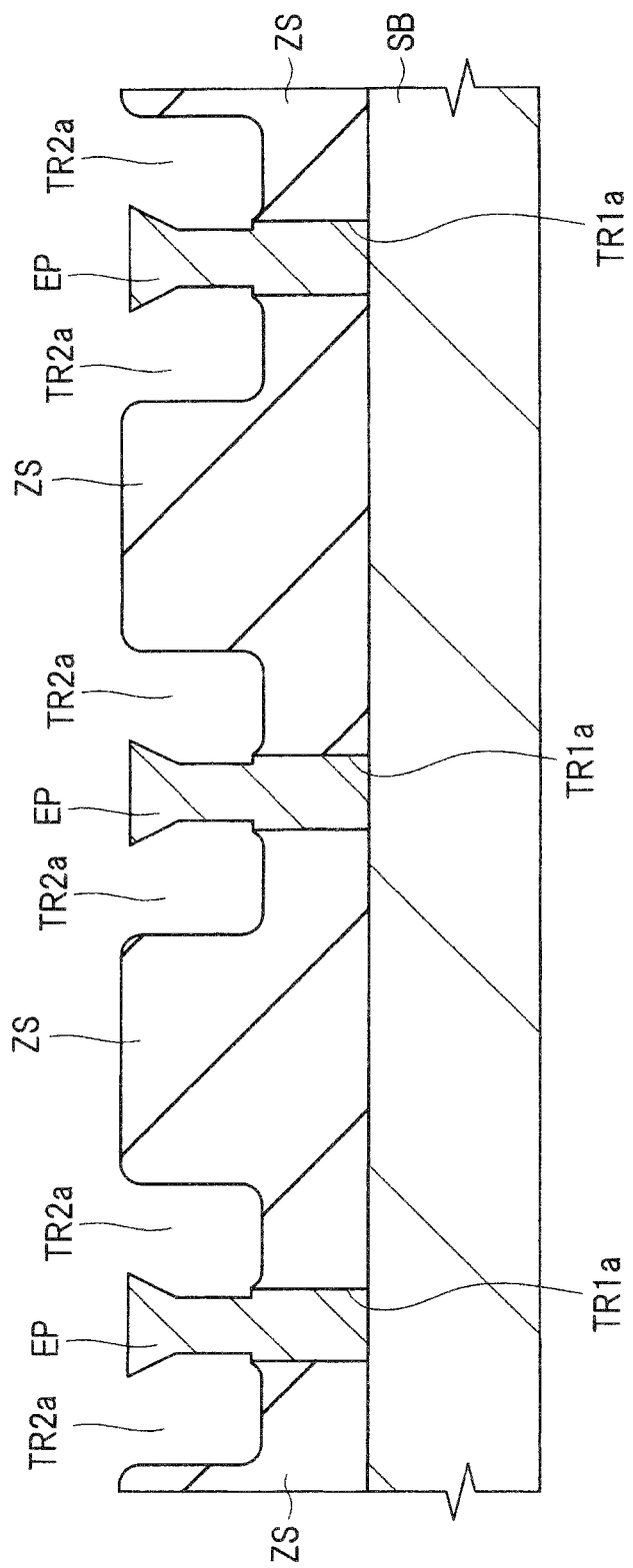
FIG. 35 is a main-portion cross-sectional view of the semiconductor device during the manufacturing process thereof, which is subsequent to FIG. 34.

FIGS. 34 and 35 are main-portion cross-sectional views of a semiconductor device in Embodiment 2 during the manufacturing process thereof.

The manufacturing process in Embodiment 2 is the same as the manufacturing process in Embodiment 1 described above until the structure in FIG. 19 described above is obtained by performing Step S6 described above. Accordingly, a repeated description thereof is omitted herein and a description will be given of the process steps subsequent to Step S6 described above.

After the structure in FIG. 19 described above is obtained by performing the process including Step S6 and the steps prior thereto in the same manner as in the foregoing embodiment, in Embodiment 2, as shown in FIG. 34, the exposed surfaces of the semiconductor layers EP are oxidized to form oxide films (sacrificial oxide films) OX over the exposed surfaces of the semiconductor layers EP. As an oxidation method, a thermal oxidation method is preferred. The oxide films OX are sacrificial oxide films. When the semiconductor layers EP are silicon layers, the oxide films OX are silicon dioxide films. The oxide films OX are formed over the side surfaces of the semiconductor layers EP exposed from the trenches TR2a and over the upper surfaces of the semiconductor layers EP.

Note that the oxidation step (step of forming the oxide films OX) in FIG. 34 is performed to reduce the widths (widths in the X-direction) of the portions of the semiconductor layers EP which are exposed from the trenches TR2a. Therefore, it is important to oxidize the side surfaces of the semiconductor layers EP exposed from the trenches TR2a (i.e., form the oxide films OX over the side surfaces of the semiconductor layer EP exposed from the trenches TR2a). The upper surfaces of the semiconductor layers EP may or may not be oxidized. Accordingly, the oxidation step (step of forming the oxide films OX) can be regarded as the step of oxidizing the side surfaces of the semiconductor layers EP exposed from the trenches TR2a. However, as shown in FIG. 34, when not only the side surfaces of the semiconductor layers EP exposed from the trenches TR2a, but also the upper surfaces of the semiconductor layers EP are oxidized, a mask layer for resistance to oxidation need not be formed over the semiconductor layers EP so that the manufacturing process is simplified.

Then, as shown in FIG. 35, the oxide films OX are removed by etching. The step of removing the oxide films OX can be performed by, e.g., wet etching. For the etching step for removing the oxide films OX, etching conditions under which the semiconductor layers EP are less likely to be etched than the oxide films OX, i.e., etching conditions under which the speed of etching the semiconductor layers EP is lower than the speed of etching the oxide films OX are preferably used. This can inhibit or prevent the semiconductor layers EP exposed as a result of removing the oxide films OX from being etched. As an etching solution used in the etching step for removing the oxide films OX, an aqueous solution of, e.g., a hydrofluoric acid or the like can be used appropriately.

Thereafter, the process including Step S7 (step of forming the insulating films GIa for gate insulating films) and the steps subsequent thereto in Embodiment 1 described above is performed, but the illustration and a repeated description thereof is omitted herein.

That is, the manufacturing process in Embodiment 1 described above in which the step of forming the oxide films OX and the step of removing the oxide films OX are additionally provided between Steps S6 and S7 described above corresponds to the manufacturing process in Embodiment 2. The description has been given heretofore of the case where, between Steps S6 and S7 described above, the step of forming the oxide films OX (step of forming the sacrificial oxide films) and the step of removing the oxide films OX (step of removing the sacrificial oxide films) are performed in one cycle. However, between Steps S6 and S7 described above, the step of forming the oxide films OX (step of forming the sacrificial oxide films) and the step of removing the oxide films OX (step of removing the sacrificial oxide films) can also be performed in two or more cycles. For example, when the step of forming the oxide films OX (step of forming the sacrificial oxide films) and the step of removing the oxide films OX (step of removing the sacrificial oxide films) are performed in two cycles, it may be appropriate to oxidize, after Step S6 described above, the exposed surfaces of the semiconductor layers EP to form the oxide films OX, then remove the oxide films OX by etching, oxidize again the exposed surfaces of the semiconductor layers EP exposed as a result of removing the oxidation films OX to form the same oxide films (sacrificial oxide films) as the oxide films OX, then remove the oxide films by etching, and then perform Step S7 described above.

In Embodiment 2, between Steps S6 and S7 described above, the step of forming the oxide films OX (step of forming the sacrificial oxide films) and the step of removing the oxide films OX (step of removing the sacrificial oxide films) are performed in one or more cycles to allow reductions in the widths (widths in the X-direction) of the portions of the semiconductor layers EP which are exposed from the trenches TR2a. That is, the widths (widths in the X-direction) of the portions of the semiconductor layers EP which are exposed from the trenches TR2a are smaller in FIG. 35 in which the step of forming the oxide films OX and the step of removing the oxide films OX have been performed than at the stage in FIG. 19 described above. This can reduce the foregoing width W2 and therefore further improve the IE effect.

When the foregoing width W4 (W5b) of the trench TR1a is reduced, the foregoing width W2 can be reduced and therefore the IE effect described above can be enhanced. However, when the foregoing width W4 (W5b) of the trench TR1a is excessively reduced, it may be difficult to allow the semiconductor layers EP to be embedded in the trenches TR1a in Step S4 described above. By contrast, in the case to which Embodiment 2 is applied, the foregoing width W4 is ensured for each of the trenches TR1a to allow the semiconductor layers EP to be easily embedded in the trenches TR1a in Step S4 described above, and also the step of forming the oxide films OX and the step of removing the oxide films OX are performed in one or more cycles. This can reduce the widths (widths in the X-direction) of the portions of the semiconductor layers EP which are exposed from the trenches TR2a and thus enhance the IE effect described above.

The limit to which the width W4 of each of the trenches TR1a is reduced depends on the accuracy of processing using photolithography. However, the application of Embodiment 2 allows the widths (widths in the X-direction) of the portions of the semiconductor layers EP which are exposed from the trenches TR2a to be further reduced beyond the limit.

Embodiment 3

Figure 36:
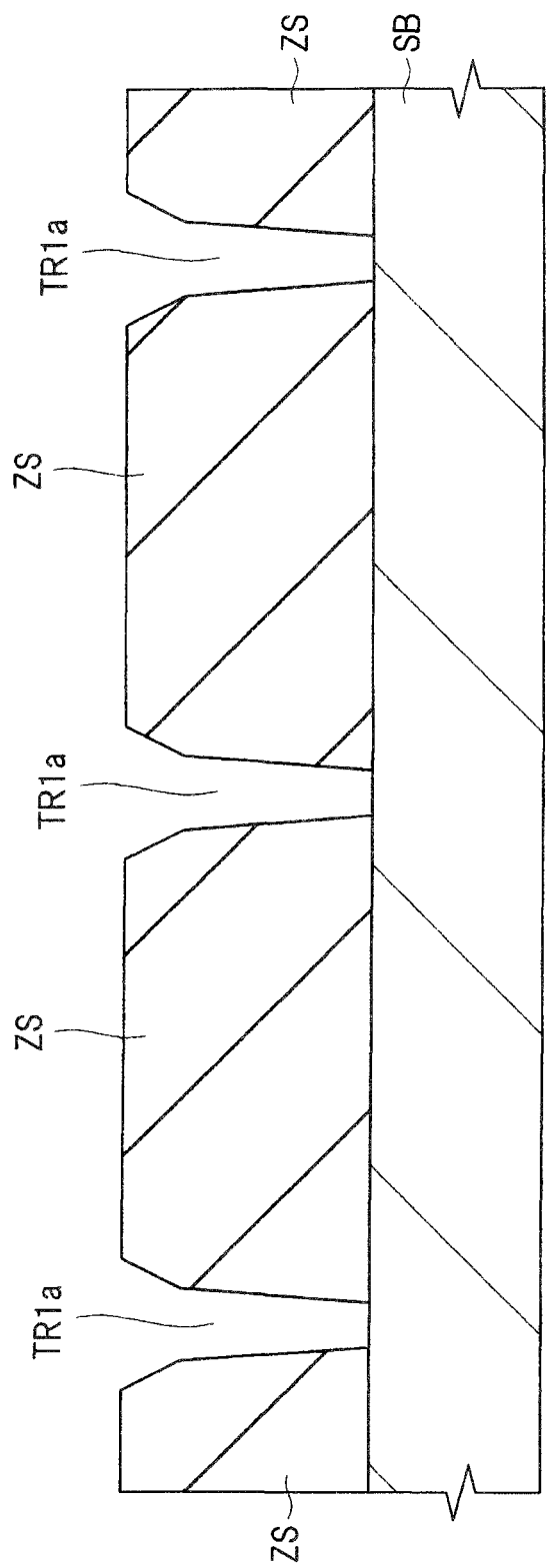
FIG. 36 is a main-portion cross-sectional view of a semiconductor device in still another embodiment during the manufacturing process thereof.
Figure 37:
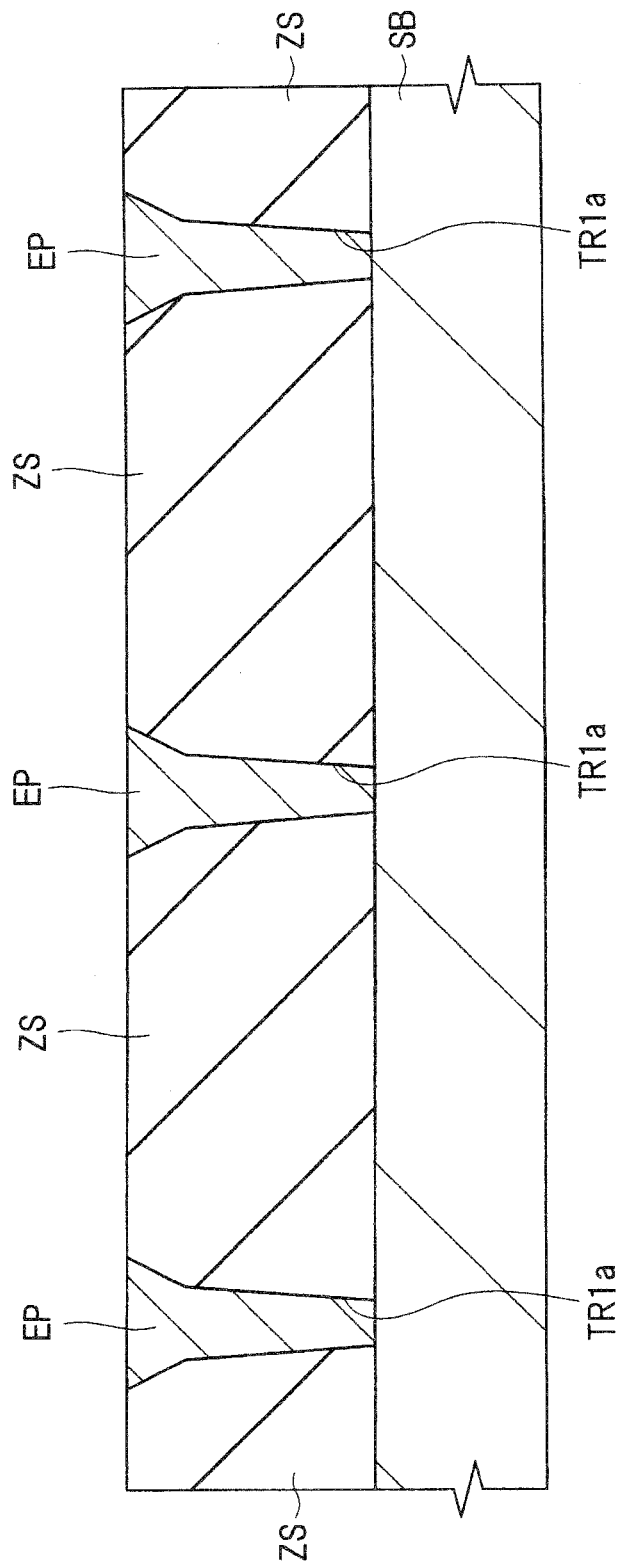
FIG. 37 is a main-portion cross-sectional view of the semiconductor device during the manufacturing process thereof, which is subsequent to FIG. 36.

FIGS. 36 and 37 are main-portion cross-sectional views of a semiconductor device in Embodiment 3 during the manufacturing process thereof.

The manufacturing process in Embodiment 3 is the same as the manufacturing process in Embodiment 1 described above until the structure in FIG. 11 described above is obtained by performing Step S2 described above. Accordingly, a repeated description thereof is omitted herein and a description will be given of the process steps subsequent to Step S2 described above.

After the structure in FIG. 11 described above is obtained by performing the process including Step S2 and the steps prior thereto in the same manner as in the foregoing embodiment, in Step S3 in Embodiment 3, as shown in FIG. 36, the trenches TR1a are formed in the insulating layer ZS. The trenches TR1a extend through the insulating layer ZS to reach the semiconductor substrate SB. At the bottom portions of the trenches TR1a, the semiconductor substrate SB is exposed. In Embodiment 3, the trenches TR1a formed in Step S3 are tapered.

The subsequent process steps are basically the same in each of Embodiment 3 and Embodiment 1 described above. That is, in the same manner as in Embodiment 1 described above, in Embodiment 3 also, the semiconductor layers EP are epitaxially grown over the semiconductor substrate SB exposed from the trenches TR1a in Step S4, as shown in FIG. 37. When the semiconductor layers EP have been grown, the semiconductor layers EP are embedded in the trenches TR1a. Then, the process including Step S5 described above and the steps subsequent thereto is performed, but the illustration and a repeated description thereof is omitted herein.

The trenches TR1a in Embodiment 3 are different from the trenches TR1a in Embodiment 1 described above in that, in the case in Embodiment 3, the trenches TR1a formed in Step S3 are tapered.

That is, in the case in Embodiment 1 described above, in the lower portion of each of the trenches TR1a, the side surface (side wall) of the trench TR1a is substantially perpendicular to the main surface of the semiconductor substrate SB.

By contrast, in the case in Embodiment 3, in the lower portion of each of the trenches TR1a also, the side surface (side wall) of the trench TR1a is inclined from a plane perpendicular to the main surface of the semiconductor substrate SB, and the width (width in the X-direction) of the trench TR1a is larger at a shallower depth position.

Note that the inclination angle (inclination angle from the plane perpendicular to the main surface of the semiconductor substrate SB) of the side surface (side wall) of the trench TR1a is preferably larger in the upper portion of the trench TR1a than in the lower portion of the trench TR1a. That is, the side surface (side wall) of the trench TR1a is preferably more nearly perpendicular to the main surface of the semiconductor substrate SB in the lower portion of the trench TR1a than in the upper portion of the trench TR1a. This can satisfy the relationship represented by W1>W2 described above and also increase the difference (i.e., W1−W2) between the foregoing widths W1 and W2. Accordingly, it is possible to more reliably achieve an improvement in the IE effect described above and an improvement in the ease of forming the contact holes CT1.

The inclination angle of the side surface (side wall) of each of the trenches TR1a mentioned herein corresponds to the angle of inclination with respect to a plane perpendicular to the main surface of the semiconductor substrate SB and parallel with the Y-direction. For example, when the side surface of the trench TR1a is inclined 10° with respect to a plane perpendicular to the main surface of the semiconductor substrate SB and parallel with the Y-direction, it follows that the inclination angle of the side surface of the trench TR1a is 10°.

The lower portion of each of the trenches TR1a corresponds to the trench portion TR1 shown in FIGS. 4 and 7 described above. Accordingly, in Embodiment 1 described above, the side surface (side wall) of the foregoing trench portion TR1 is substantially perpendicular to the main surface of the semiconductor substrate SB. On the other hand, in the case to which Embodiment 3 is applied, the tapered trench TR1a results in the tapered trench portion TR1 described above. As the side surface (side wall) of the foregoing trench portion TR1 is more inclined from the plane perpendicular to the main surface of the semiconductor substrate SB and the depth position is shallower, the width (width in the X-direction) of the trench portion TR1 is larger.

Embodiment 3 is otherwise basically the same as Embodiment 1 described above.

In Embodiment 3, in addition to the effects obtained in Embodiment 1 described above, the following effects can further be obtained.

That is, in embodiment 3, the trenches TR1a formed in Step S3 are tapered. As a result, the advantage of allowing the semiconductor layers EP to be easily embedded in the trenches TR1a in Step S4 can be obtained.

Embodiment 3 can also be combined with Embodiment 2 described above.

Embodiment 4

Figure 38:
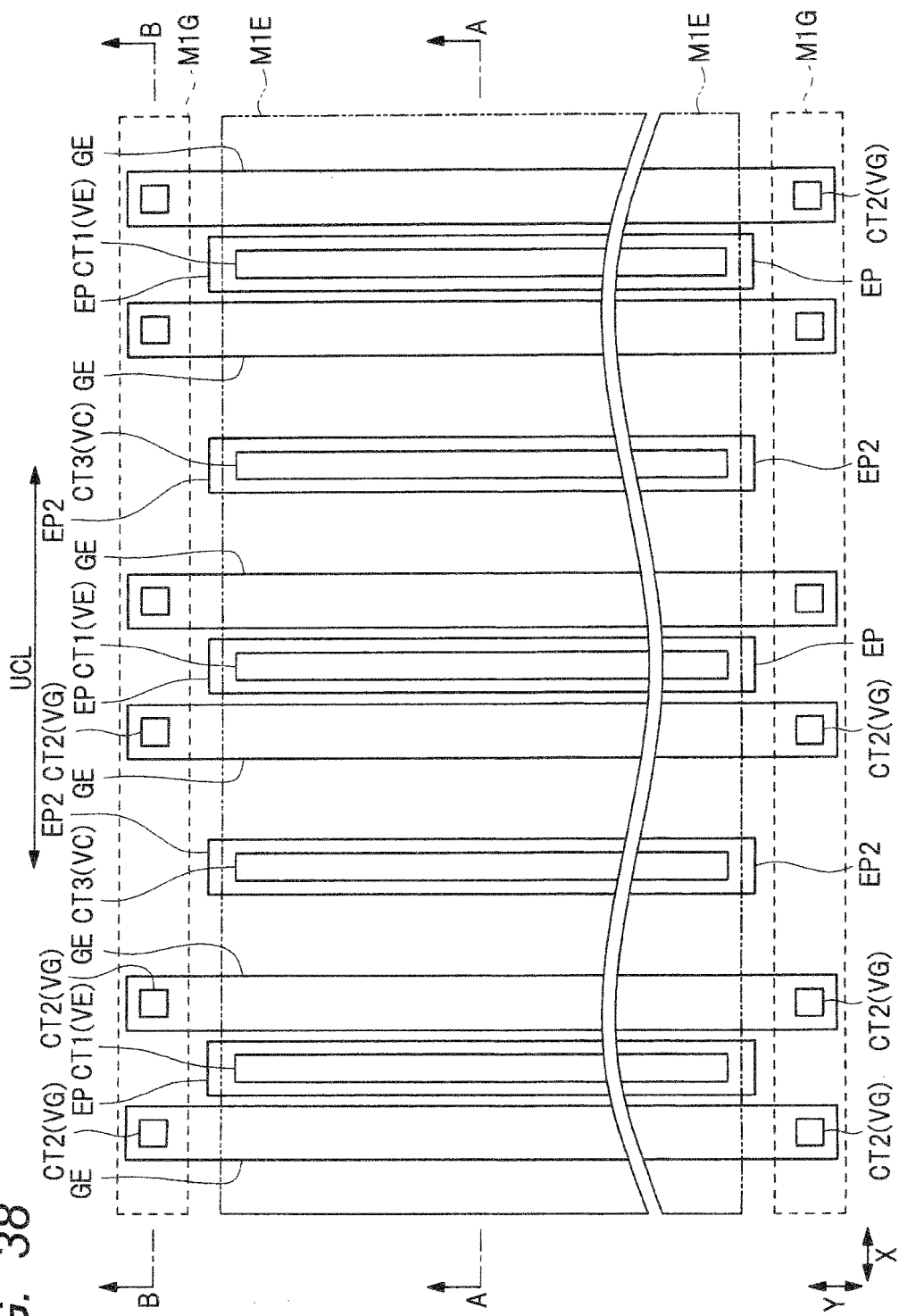
FIG. 38 is a main-portion plan view of a semiconductor device in yet another embodiment.
Figure 39:
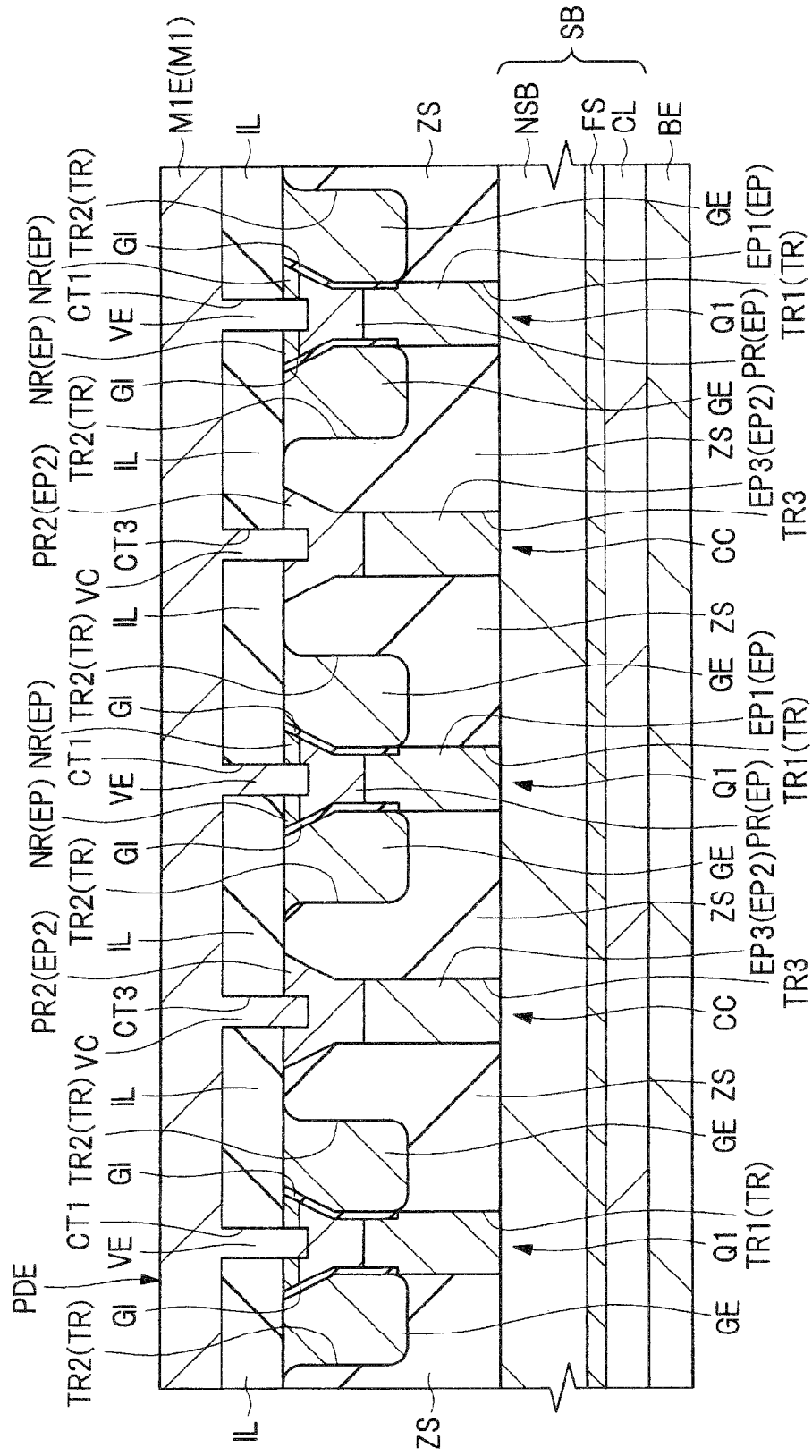
FIG. 39 is a main-portion cross-sectional view of the semiconductor device in the yet other embodiment.

FIG. 38 is a main-portion plan view of a semiconductor device in Embodiment 4 and corresponds to FIG. 3 described above in Embodiment 1 described above. FIG. 39 is a main-portion cross-sectional view of the semiconductor device in Embodiment 4 and corresponds to FIG. 4 described above in Embodiment 1 described above. FIG. 39 substantially corresponds to a cross-sectional view along the line A-A in FIG. 38.

The semiconductor device in Embodiment 4 is different from the semiconductor device in Embodiment 1 described above in that, in Embodiment 4, carrier discharge cells CC are provided and is otherwise basically the same as the semiconductor device in Embodiment 1 described above. Accordingly, a description will be given herein with a focus on the difference from Embodiment 1 described above. A repeated description of the same portions as in Embodiment 1 described above is omitted.

As shown in FIGS. 38 and 39, in Embodiment 4, in the insulating layer ZS over the semiconductor substrate SB, trenches TR3 are formed. Over the semiconductor substrate SB exposed at the bottom portions of the trenches TR3, semiconductor layers EP2 are formed so as to be embedded in the trenches TR3. The semiconductor layers EP2 form the carrier discharge cells CC.

The trenches TR3 are formed to be spaced apart from the trenches TR. Since the trenches TR3 extend in the Y-direction, the semiconductor layers EP2 in the trenches TR3 also extend in the Y-direction. In the case in FIGS. 38 and 39, each of the trenches TR and TR3 extends in the Y-direction. The trenches TR3 are disposed between the trenches TR adjacent to each other in the X-direction. That is, structures in each of which the semiconductor layer EP is interposed between the pair of gate electrodes GE (between the semiconductor layer EP and the gate electrodes GE, the gate insulating films GI are interposed) extend in the Y-direction and, between the structures extending in the Y-direction and adjacent to each other in the X-direction, the semiconductor layers EP2 extending in the Y-direction are disposed.

On both sides of the semiconductor layers EP2, the insulating layer ZS is present. That is, the entire side surfaces of the semiconductor layers EP2 are in contact with (covered with) the insulating layer ZS. Gate electrodes adjacent to the semiconductor layers EP2 are not formed.

The carrier discharge cells CC and the unit transistors (unit transistor cells) Q1 are spaced apart from each other in the X-direction, and the insulating layer ZS is interposed therebetween. Accordingly, the semiconductor layers EP2 forming the carrier discharge cells CC and the structures (structures in each of which the semiconductor layer EP is interposed between the pair of gate electrodes GE) forming the unit transistors Q1 are spaced apart from each other in the X-direction, and the insulating layer ZS is interposed therebetween. Consequently, between the semiconductor layers EP2 forming the carrier discharge cells CC and the gate electrodes GE of the unit transistors Q1 adjacent to the carrier discharge cells CC in the X-direction, the insulating layer ZS is interposed. The dimension (dimension in the X-direction) of each of the portions of the insulating layer ZS which are interposed between the semiconductor layers EP2 and the gate electrodes GE is sufficiently larger than the thickness of each of the gate insulating films GI and is, e.g., not less than ten times the thickness of the gate insulating film GI.

The semiconductor layers EP2 are epitaxial layers (epitaxial semiconductor layers) formed over the semiconductor substrate SB exposed at the bottom portions of the trenches TR3. For example, the semiconductor layers EP2 are made of monocrystalline silicon into which an impurity has been introduced. In terms of reducing the number of steps in the manufacturing process of the semiconductor device, the semiconductor layers EP2 are preferably formed in the same step of forming the semiconductor layers EP. Accordingly, the semiconductor layers EP2 are preferably made of the same material as that of the semiconductor layers EP.

In the respective upper portions (upper-layer portions) of the semiconductor layers EP2, p-type semiconductor regions PR2 are formed. Over each of the p-type semiconductor regions PR2, no n-type semiconductor region is formed.

Before the p-type semiconductor regions PR2 are formed, the entire semiconductor layers EP2 are n-type semiconductor layers. However, by implanting a p-type impurity into the n-type semiconductor layers EP2, the p-type semiconductor regions PR2 each having a conductivity type opposite to that of each of the n-type semiconductor layers EP2 are formed. Accordingly, each of the portions of the semiconductor layers EP2 which are located under the p-type semiconductor regions PR2 has the n-type conductivity type.

It is assumed herein that, of the semiconductor layers EP2, the portions located under the p-type semiconductor regions PR2 are referred to as n-type semiconductor regions EP3. Thus, the semiconductor layers EP2 include the n-type semiconductor regions EP3, and the p-type semiconductor regions PR2 present over the n-type semiconductor regions EP3.

In the insulating layer IL, contact holes (openings or through holes) CT3 extending through the insulating layer IL to reach the semiconductor layers EP2 are formed. The contact holes CT3 are formed over the semiconductor layers EP2 to extend through the insulating layer IL and further cut into parts of the semiconductor layers EP2. From the contact holes CT3, the p-type semiconductor regions PR2 are exposed. Consequently, the bottom surfaces of the contact holes CT3 are located midway of the thicknesses of the p-type semiconductor regions PR2. However, the contact holes CT3 have not reached the n-type semiconductor regions EP3.

Parts of the emitter wire M1E are embedded in the contact holes CT3. Of the emitter wire M1E, the portions embedded in the contact holes CT3 can also be referred to as carrier discharge via portions VC. The carrier discharge via portions VC can also be regarded as the via portions of the emitter wire M1E. The carrier discharge via portions VC are made of a conductor showing metallic conduction and can be regarded as electrodes (electrode portions).

Since the bottom surfaces (lower surfaces) of the carrier discharge via portions VC are in contact with the p-type semiconductor regions PR2, the carrier discharge via portions VC are in contact with and electrically coupled to the p-type semiconductor regions PR2. The carrier discharge via portions VC are not in contact with the n-type semiconductor regions EP3. The carrier discharge via portions VC and the emitter via portions VE are connected via the emitter wire M1E as a conductor.

The configuration of the semiconductor device in Embodiment 4 is otherwise basically the same as that of the semiconductor device in Embodiment 1 described above so that a repeated description thereof is omitted herein.

Next, a description will be given of the manufacturing process of the semiconductor device in Embodiment 4. FIGS. 40 to 45 are main-portion cross-sectional views of the semiconductor device in Embodiment 4 during the manufacturing process thereof.

The manufacturing process in Embodiment 4 is also the same as the manufacturing process in Embodiment 1 described above until the structure in FIG. 11 described above is obtained. Accordingly, a repeated description thereof is omitted herein and a description will be given of the process steps subsequent to Step S2 described above.

Figure 40:
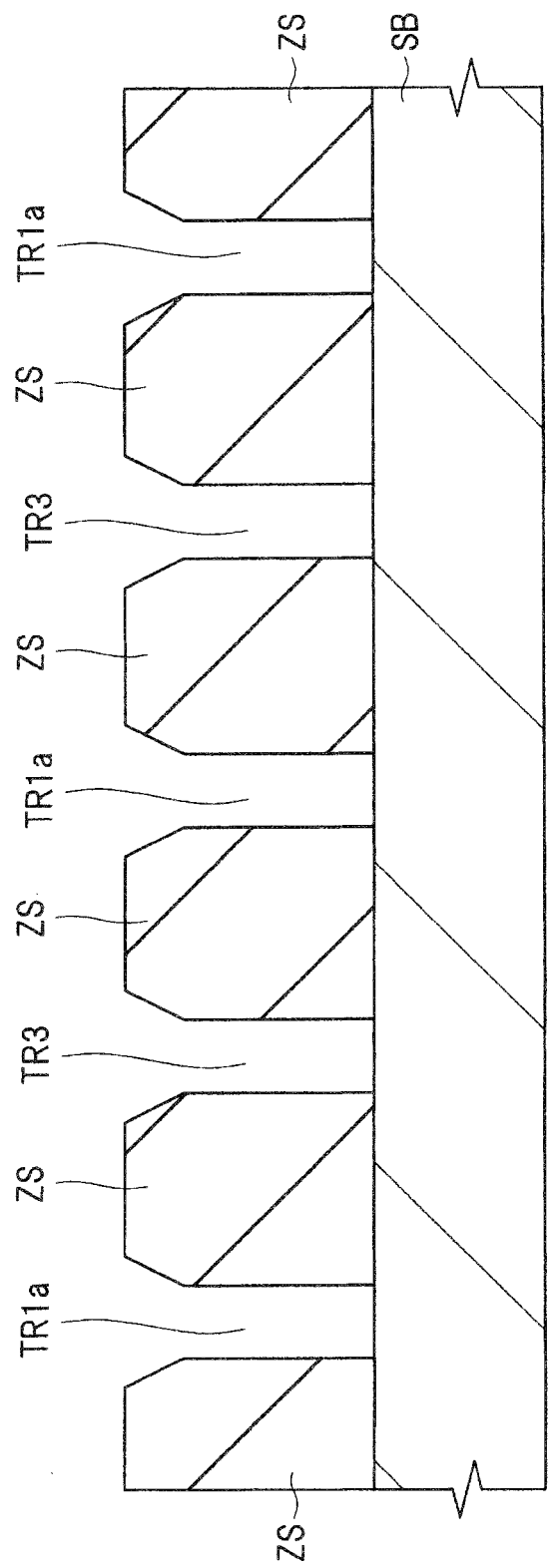
FIG. 40 is a main-portion cross-sectional view of the semiconductor device in the yet other embodiment during the manufacturing process thereof.

After the structure in FIG. 11 described above is obtained by performing the process including Step S2 and the step prior thereto in the same manner as in the foregoing embodiments, in Step S3 in Embodiment 4, as shown in FIG. 40 corresponding to FIG. 15 described above, the trenches TR1a and TR3 are formed in the insulating layer ZS. Each of the trenches TR1a and TR3 extends through the insulating layer ZS to reach the semiconductor substrate SB. At the bottom portion of each of the trenches TR1a and TR3, the semiconductor substrate SB is exposed.

In Embodiment 1 described above, in Step S3, the trenches TR1a are formed. Embodiment 4 is different from Embodiment 1 described above in that not only the trenches TR1a, but also the trenches TR3 are formed in Step S3. A method of forming the trenches TR1a is the same in each of Embodiment 4 and Embodiment 1 described above. The trenches TR3 are formed in the same step of forming the trenches TR1a using the same technique as used to form the trenches TR1a. Accordingly, in the case in Embodiment 4, the photoresist pattern RP1 shown in FIGS. 12 to 14 described above has not only the openings RP1a for forming the trenches TR1a, but also openings for forming the trenches TR3.

The trenches TR3 are formed to be spaced apart from the trenches TR1a. In the case in FIG. 40, each of the trenches TR1a and TR3 extends in the Y-direction (direction perpendicular to the surface of the paper sheet with FIG. 40). Between the trenches TR1a adjacent to each other in the X-direction, the trenches TR3 are disposed. The trenches TR1a and TR3 are spaced apart from each other in the X-direction.

Since the shapes of the trenches TR3 are the same as those of the trenches TR1a, a repeated description thereof is omitted herein. The dimensions (dimensions in the X-direction and dimensions in the Y-direction) of the trenches TR3 may be either the same as or different from those of the trenches TR1a.

Figure 41:
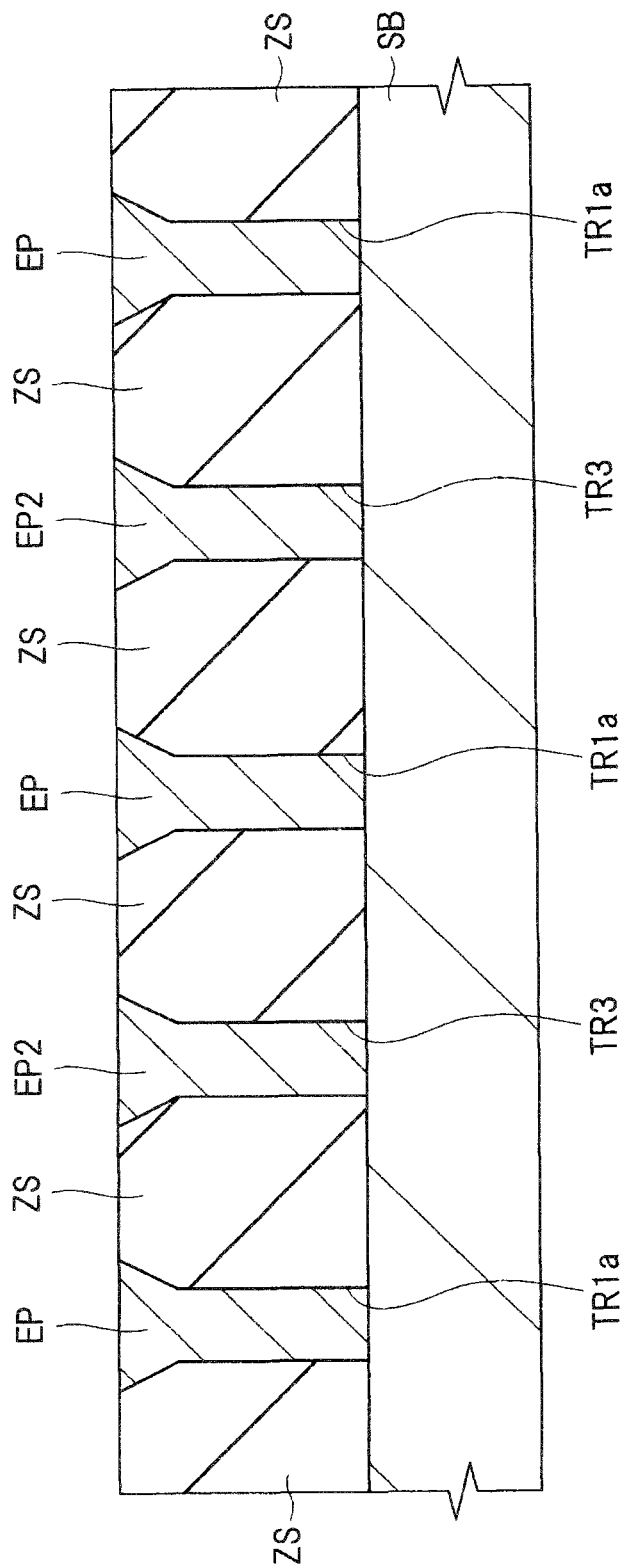
FIG. 41 is a main-portion cross-sectional view of the semiconductor device during the manufacturing process thereof, which is subsequent to FIG. 40.

Then, in Step S4, as shown in FIG. 41 corresponding to FIG. 16 described above, the semiconductor layers EP and EP2 are formed by epitaxial growth. The semiconductor layers EP are formed over the semiconductor substrate SB exposed from the trenches TR1a so as to be embedded in the trenches TR1a. The semiconductor layers EP2 are formed over the semiconductor substrate SB exposed from the trenches TR3 so as to be embedded in the trenches TR3.

In Embodiment 1 described above, the semiconductor layers EP are formed in the trenches TR1a in Step S4. However, Embodiment 4 is different from Embodiment 1 described above in that the semiconductor layers EP are formed not only in the trenches TR1a, but also in the trenches TE3. The method of forming the semiconductor layers EP is the same in each of Embodiment 4 and Embodiment 1 described above. The semiconductor layers EP2 are formed in the same step of forming the semiconductor layers EP using the same technique as used to form the semiconductor layers EP. Here, each of the semiconductor layers EP and EP2 is made of monocrystalline silicon. Each of the semiconductor layers EP and EP2 is an n-type semiconductor layer into which an n-type impurity has been introduced.

Figure 42:
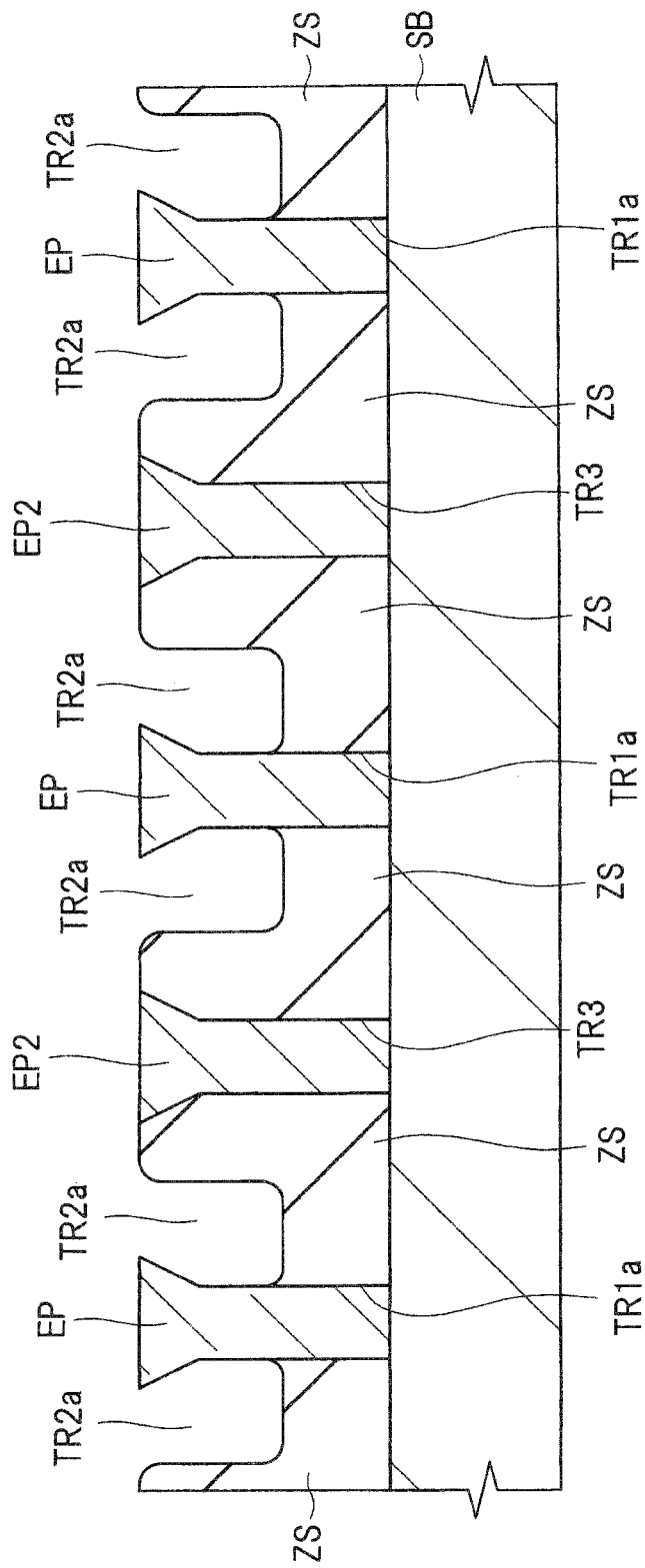
FIG. 42 is a main-portion cross-sectional view of the semiconductor device during the manufacturing process thereof, which is subsequent to FIG. 41.

Then, in the same manner as in Embodiment 1 described above, Step S5 (step of forming the trenches TR2a) and Step S6 (step of expanding the trenches TR2a) are performed to form the trenches TR2a, as shown in FIG. 42 corresponding to FIG. 19 described above. Step S5 (step of forming the trenches TR2a) and Step S6 (step of expanding the trenches TR2a) are basically the same in each of Embodiment 4 and Embodiment 1 described above so that a repeated description thereof is omitted herein.

The trenches TR2a are the same in each of Embodiment 4 and Embodiment 1 described above. Accordingly, in Embodiment 4 also, in the same manner as in Embodiment 1 described above, the trenches TR2a are formed on both sides of the trenches TR1a so that the side surfaces of the semiconductor layers EP are exposed from the trenches TR2a. On the other hand, for each of the semiconductor layers EP2 embedded in the trenches TR3, no equivalent to the trench TR2a is formed. As a result, even when Step S5 (step of forming the trenches TR2a) and Step S6 (step of expanding the trenches TR2a) are performed, the side surfaces of the semiconductor layers EP2 are not exposed and the state where the entire side surfaces of the semiconductor layers EP2 are covered with the insulating layer ZS is maintained.

Thus, in Embodiment 4, in Step S5 (step of forming the trenches TR2a) and Step S6 (step of expanding the trenches TR2a), trenches which are adjacent to the semiconductor layers EP2 and exposing the side surfaces of the semiconductor layers EP2 are not formed. The trenches TR2a formed by Steps S5 and S6 are adjacent not to the semiconductor layers EP2, but to the semiconductor layers EP to expose the side surfaces of the semiconductor layers EP.

Figure 43:
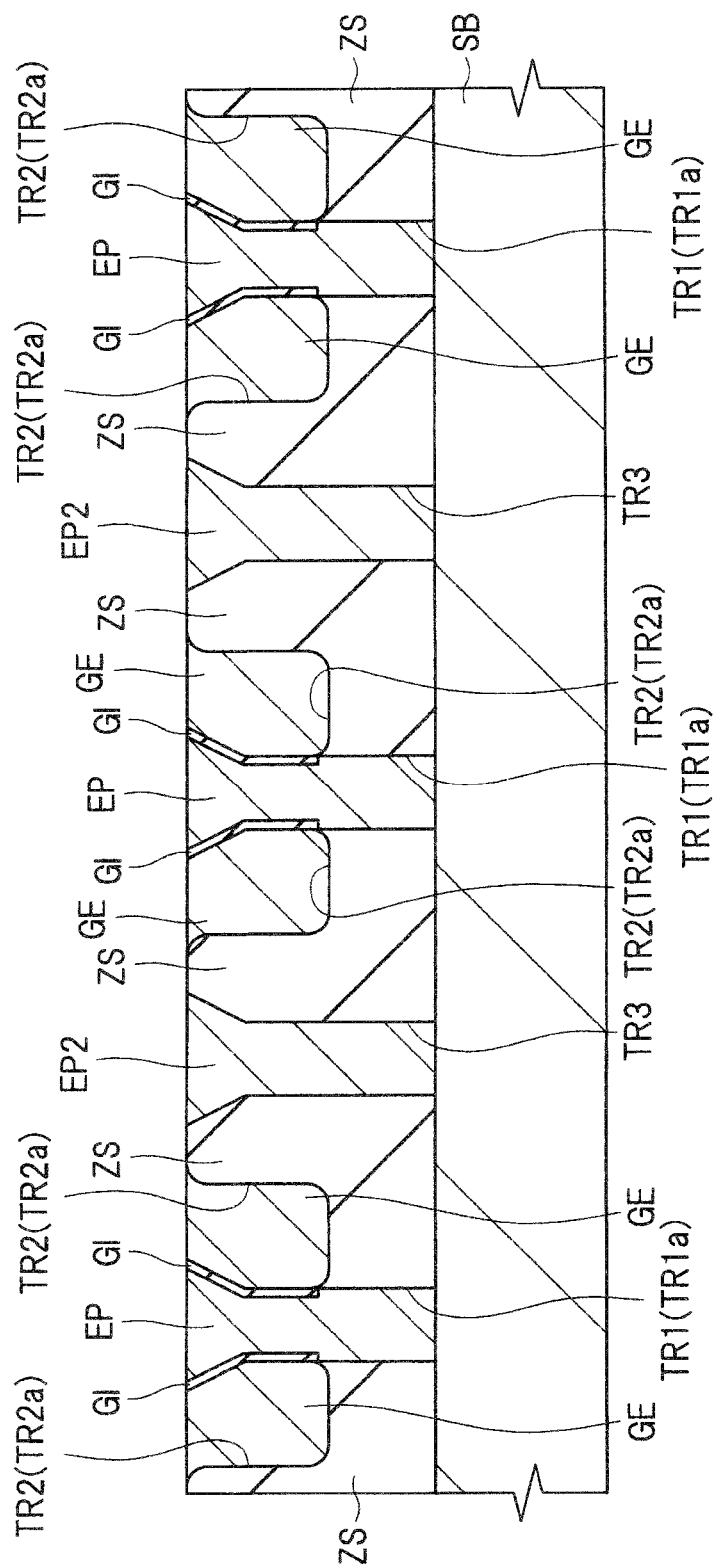
FIG. 43 is a main-portion cross-sectional view of the semiconductor device during the manufacturing process thereof, which is subsequent to FIG. 42.

Then, in the same manner as in Embodiment 1 described above, Step S7 (step of forming the insulating films GIa for gate insulating films) and Step S8 (step of forming the gate electrodes GE) are performed to form the gate insulating films GI and the gate electrodes GE, as shown in FIG. 43 corresponding to FIG. 21 described above. Step S7 (step of forming the insulating films GIa) and Step S8 (step of forming the gate electrodes GE) are basically the same in each of Embodiment 4 and Embodiment 1 described above so that a repeated description thereof is omitted herein.

In Embodiment 4, the side surfaces of the semiconductor layers EP2 are covered with the insulating layer ZS. Accordingly, over each of the side surfaces of the semiconductor layers EP2, no equivalent to the gate insulating film GI is formed. In addition, since no equivalent to the trench TR2a is formed at each of the positions adjacent to the semiconductor layers EP2, the gate electrodes GE adjacent to the semiconductor layers EP2 are not formed.

Figure 44:
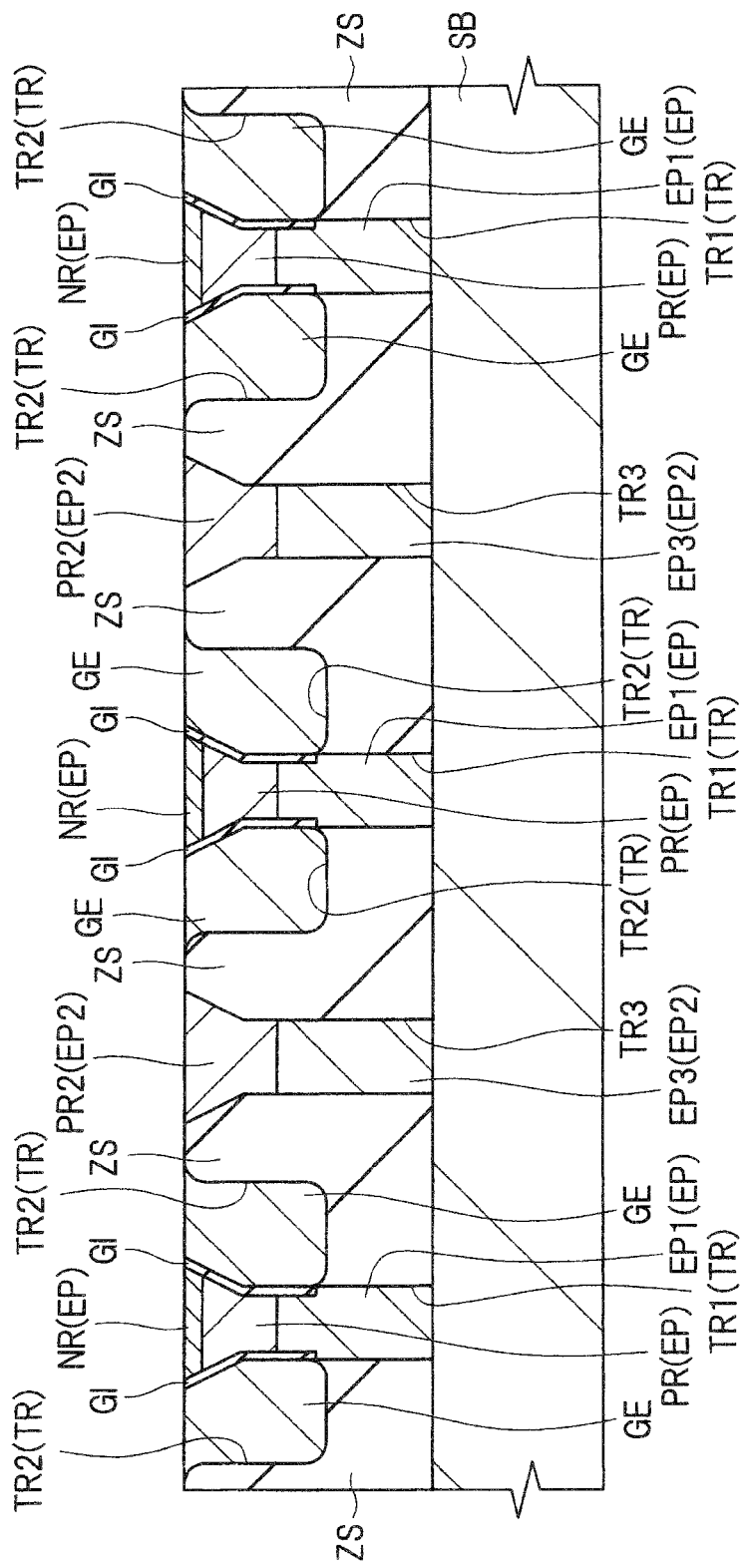
FIG. 44 is a main-portion cross-sectional view of the semiconductor device during the manufacturing process thereof, which is subsequent to FIG. 43.

Then, in Step S9, as shown in FIG. 44 corresponding to FIG. 22 described above, the p-type semiconductor regions PR are formed in the upper portions (upper-layer portions) of the semiconductor layers EP. In Step S10, the $n^+$-type semiconductor regions NR are formed in the upper portions (upper-layer portions) of the semiconductor layers EP. The p-type semiconductor regions PR and the $n^+$-type semiconductor regions NR are the same in each of Embodiment 4 and Embodiment 1 described above so that a repeated description thereof is omitted herein.

In Embodiment 4, when the p-type semiconductor regions PR are formed in the upper portions (upper-layer portions) of the semiconductor layers EP in Step S9, the p-type semiconductor regions PR2 are formed in the upper portions (upper-layer portions) of the semiconductor layers EP2. That is, by the same ion implantation step (step of ion-implanting a p-type impurity), the p-type semiconductor regions PR are formed in the upper portions (upper-layer portions) of the semiconductor layers EP and the p-type semiconductor regions PR2 are formed in the upper portions (upper-layer portions) of the semiconductor layers EP2.

However, in Step S10, the $n^+$-type semiconductor regions NR are formed in the upper portions (upper-layer portions)

of the semiconductor layers EP, while n-type semiconductor regions equivalent to the n$^+$-type semiconductor regions NR are not formed in the semiconductor layers EP2. That is, in Step S10, in the state where a mask layer exposing the semiconductor layers EP and covering the semiconductor layers EP2 is formed, an n-type impurity is ion-implanted to implant (ion-implant) an n-type impurity into the upper portions (upper-layer portions) of the semiconductor layers EP and thus form the n$^+$-type semiconductor regions NR, while the n-type impurity is prevented from being implanted (ion-implanted) into the semiconductor layers EP2.

When Steps S9 and S10 are performed, each of the semiconductor layers EP is brought into the state where the semiconductor layer EP includes the n-type semiconductor region EP1, the p-type semiconductor region PR over the n-type semiconductor region EP1, and the n$^+$-type semiconductor region NR over the p-type semiconductor region PR. On the other hand, each of the semiconductor layers EP2 is brought into the state where the semiconductor layer EP2 includes the n-type semiconductor region EP3, and the p-type semiconductor region PR2 over the n-type semiconductor region EP3.

Figure 45:
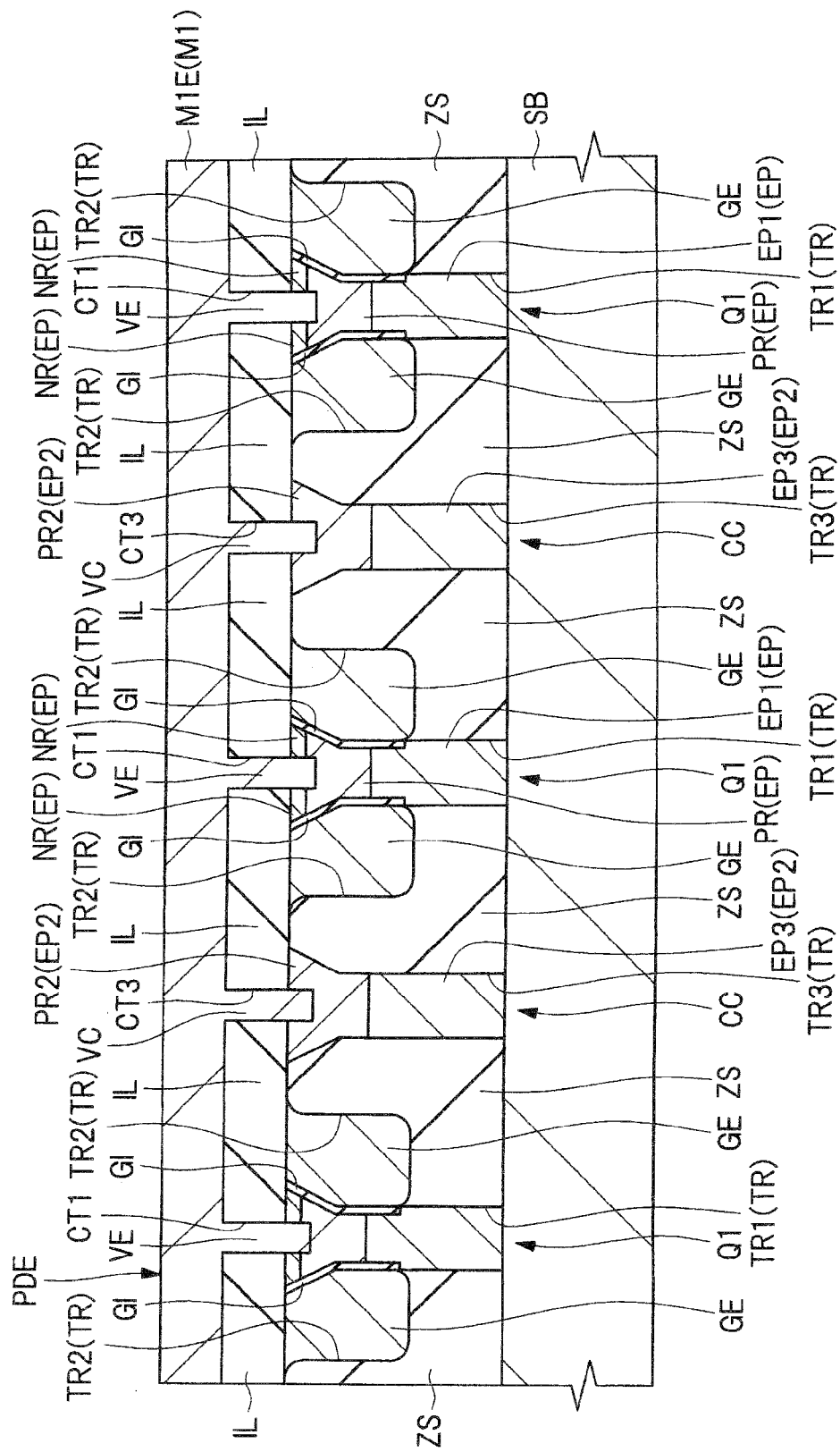
FIG. 45 is a main-portion cross-sectional view of the semiconductor device during the manufacturing process thereof, which is subsequent to FIG. 44.

Then, as shown in FIG. 45 corresponding to FIG. 25 described above, in the same manner as in Embodiment 1 described above, activation anneal is performed in Step S11 and, in Step S12, the insulating layer IL is formed as the interlayer insulating film.

Then, in Step S13, the same contact holes CT1 as formed in Embodiment 1 described above are formed. However, in Step S13 in Embodiment 4, not only the contact holes CT1, but also the contact holes CT3 are formed.

The contact holes CT3 are formed so as to be included in the semiconductor layers EP2 in plan view. The contact holes CT3 extend through the insulating layer IL so that the bottom portions of the contact holes CT3 reach the p-type semiconductor regions PR2. Consequently, the contact holes CT3 are formed over the semiconductor layers EP2 and, at the bottom surfaces of the contact holes CT3, the p-type semiconductor regions PR2 are exposed. The contact holes CT3 are formed in the same step of forming the contact holes CT1 using the same technique as used to form the contact holes CT1. Accordingly, the depth positions of the contact holes CT3 are substantially the same as the depth positions of the contact holes CT1. The contact holes CT3 extending through the insulating layer IL may also further cut into parts of the semiconductor layers EP2 (parts of the p-type semiconductor regions PR2 along the thicknesses thereof). However, the contact holes CT3 have not extended through the p-type semiconductor regions PR2 and have not reached the n-type semiconductor regions EP3.

Then, in the same manner as in Embodiment 1 described above, in Step S14, the foregoing contact holes CT2 are formed. The foregoing contact holes CT2 may also be formed in the same step of forming the contact holes CT1 and CT3.

Then, in Step S15, over the insulating layer IL, the wires M1 are formed. The configuration of the wires M1 (the emitter wire M1E and the gate wires M1G) in Embodiment 4 and the manufacturing method thereof are basically the same as in Embodiment 1 described above except that parts of the emitter wire M1E are embedded in the contact holes CT3. In the contact holes CT1, parts of the emitter wire M1E are embedded to form the emitter via portions VE. In the contact holes CT3, other parts of the emitter wire M1E are embedded to form the carrier discharge via portions VC. The emitter via portions VE embedded in the contact holes CT3 and the carrier discharge via portions VC embedded in the contact holes CT3 are connected via a conductor, specifically through the emitter wire M1E and electrically coupled to each other.

The emitter via portions VE are in contact with the n$^+$-type semiconductor regions NR and the p-type semiconductor regions PR via the bottom portions of the contact holes CT1 and electrically coupled to both of the n$^+$-type semiconductor regions NR and the p-type semiconductor regions PR. The carrier discharge via portions VC are in contact with the p-type semiconductor regions PR2 at the bottom portions of the contact holes CT3 and electrically coupled to the p-type semiconductor regions PR2. The gate via portions VG are in contact with the gate electrodes GE at the bottom portions of the contact holes CT2 and electrically coupled to the gate electrodes GE.

The subsequent process is the same in each of Embodiment 4 and Embodiment 1 described above. That is, in Steps S16 to S20, after the foregoing insulating film PA is formed, the foregoing opening OP is formed in the foregoing insulating film PA and the back surface of the semiconductor substrate SB is ground or polished as necessary. Then, the p-type semiconductor region CL and the n-type semiconductor region FS are formed and, over the entire back surface of the semiconductor substrate SB, the foregoing back-side electrode BE is formed. However, a repeated description thereof is omitted herein.

In Embodiment 4, the carrier discharge cells CC are provided. This allows the following effects to be further obtained in addition to the effects obtained in Embodiment 1 described above.

That is, as has been described in the section "Configuration and Operation of IGBT" in Embodiment 1 described above, when the IGBT is in the ON state, holes are stored in the n-type base region (the n-type semiconductor region FS, the n-type substrate region NSB, and the n-type semiconductor region EP1). To switch the IGBT from the ON state to the OFF state, the voltage of each of the gate electrodes GE is set to a value of not more than the threshold value. However, even when the voltage of the gate electrode GE is set to a value of not more than the threshold value, the IGBT is not immediately turned OFF. The turning OFF of the IGBT is delayed by the time period required by the holes stored in the n-type base region to flow to the outside. Accordingly, to promptly turning OFF the IGBT and rapidly prevent a current from flowing when an OFF operation (operation of setting the voltage of the gate electrode GE to a value of not more than the threshold value) is performed, it is desirable to allow the holes stored in the n-type base region to be promptly discharged to the outside of the IGBT upon the OFF operation.

In Embodiment 4, the carrier discharge cells CC are provided. This allows the holes stored in the n-type base region (the n-type semiconductor region FS, the n-type substrate region NSB, and the n-type semiconductor region EP1) to be discharged also from the carrier discharge cells CC toward the emitter wire M1E when the OFF operation is performed. That is, when the carrier discharge cells CC are provided, the carrier discharge cells CC also serve as a hole discharge path to allow the holes stored in the n-type base region (the n-type semiconductor region FS, the n-type substrate region NSB, and the n-type semiconductor region EP1) to be discharged toward the carrier discharge via portions VC through the n-type semiconductor regions EP3 and the p-type semiconductor regions PR2 of the semiconductor layers EP2.

In Embodiment 4, the carrier discharge cells CC are provided. This results in an increased number of paths for discharging the holes stored in the n-type base region to the outside of the IGBT at the time of the OFF operation. When the OFF operation is performed, the holes stored in the n-type base region are easily discharged to the outside of the IGBT. Accordingly, it is possible to further shorten (reduce) the time period (turn-OFF loss) from when the OFF operation is performed until the IGBT is turned OFF and the current no longer flows. A reduction in the turn-OFF loss of the IGBT leads to an improvement in the switching speed of the IGBT. Consequently, the performance of the semiconductor device can be improved.

On the other hand, when the carrier discharge cells CC are provided, during the ON period, some of the holes stored in the n-type base region may be discharged from the carrier discharge cells CC. When the holes stored in the n-type base region are discharged from the carrier discharge cells CC during the ON period, the ON voltage of the IGBT tends to increase.

Therefore, Embodiment 1 described above in which the carrier discharge cells CC are not provided is advantageous over Embodiment 4 in terms of reducing the ON voltage of the IGBT. On the other hand, in Embodiment 4 in which the carrier discharge cells CC are provided is advantageous over Embodiment 1 described above in terms of reducing the turn-off loss (accordingly improving the switching speed).

As a result, it is possible to selectively determine whether or not the carrier discharge cells CC are to be provided depending on which one of the ON voltage of the IGBT and the switching speed thereof is considered to be more important. Even when the carrier discharge cells CC are provided, it is possible to selectively determine the number of the carrier discharge cells CC or the like. For example, in the case in FIGS. 38 and 39 described above, the carrier discharge cells CC are disposed between the unit transistors Q1 adjacent to each other in the X-direction. However, in another form, it is also possible to mixedly provide places where the carrier discharge cells CC are disposed between the unit transistors Q1 adjacent to each other in the X-direction and places where the carrier discharge cells CC are not disposed between the unit transistors Q1 adjacent to each other in the X-direction.

To Embodiment 4, one or both of Embodiments 2 and 3 described above can also be applied.

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device including an IGBT, the method comprising the steps of:
   (a) providing a semiconductor substrate for a first base region having a first conductivity type;
   (b) forming a first insulating layer over a main surface of the semiconductor substrate;
   (c) forming, in the first insulating layer, a first trench extending through the first insulating layer to expose a part of the semiconductor substrate;
   (d) forming a first semiconductor layer having a first conductivity type over the semiconductor substrate exposed at a bottom portion of the first trench such that the first semiconductor layer is embedded in the first trench;
   (e) forming, in the first insulating layer, a pair of second trenches on both sides of the first trench such that the first trench is interposed between the pair of second trenches;
   (f) expanding the pair of second trenches to expose parts of side surfaces of the first semiconductor layer from the pair of second trenches;
   (g) forming insulating films for gate insulating films over the side surfaces of the first semiconductor layer exposed from the pair of second trenches;
   (h) forming gate electrodes in the pair of second trenches; and
   (i) forming, in an upper portion of the first semiconductor layer, a second base region having a second conductivity type opposite to the first conductivity type, and an emitter region having the first conductivity type,
   wherein, in the step (e), the side surfaces of the first semiconductor layer are not exposed from the pair of second trenches, and the pair of second trenches have not reached the semiconductor substrate, and
   wherein, in the step (f), parts of the first insulating layer remain under the pair of second trenches, and
   wherein parts of the first insulating layer are present under the pair of gate electrodes formed in the step (h).

2. The method of manufacturing the semiconductor device according to claim 1,
   wherein, in the step (d), the first semiconductor layer is formed by epitaxial growth.

3. The method of manufacturing the semiconductor device according to claim 1,
   wherein, in the step (f), the pair of second trenches are expanded by isotropic etching.

4. The method of manufacturing the semiconductor device according to claim 3,
   wherein, in the step (f), the pair of second trenches are expanded by wet etching.

5. The method of manufacturing the semiconductor device according to claim 4,
   wherein, in the step (f), the pair of second trenches are expanded by performing etching under a condition under which the first semiconductor layer is less likely to be etched than the first insulating layer.

6. The method of manufacturing the semiconductor device according to claim 1,
   wherein the first trench formed in the step (c) has a width which is larger in an upper portion of the first trench than in a lower portion of the first trench.

7. The method of manufacturing the semiconductor device according to claim 6,
   wherein the step (c) includes the steps of:
   (c1) forming a mask layer over the first insulating layer;
   (c2) isotropically etching the first insulating layer using the mask layer as an etching mask; and
   (c3) after the step (c2), anisotropically etching the first insulating layer using the mask layer as an etching mask,
   wherein, in the step (c2), the first trench does not reach the semiconductor substrate, and
   wherein, in the step (c3), the first trench reaches the semiconductor substrate.

8. The method of manufacturing the semiconductor device according to claim 1,
   wherein the first trench formed in the step (c) is tapered.

9. The method of manufacturing the semiconductor device according to claim 1,
wherein the step (f) includes the steps of: a
(f1) oxidizing the side surfaces of the first semiconductor layer exposed from the pair of second trenches; and
(f2) removing oxide films formed over the side surfaces of the first semiconductor layer in the step (f1), and
wherein, after the step (f) and before the step (g), the steps (f1) and (f2) are performed in one or more cycles.

10. The method of manufacturing the semiconductor device according to claim 1, further comprising the steps of:
(j) forming, over the first insulating layer, a second insulating layer so as to cover the first semiconductor layer and the gate electrodes;
(k) forming, over the first semiconductor layer, a first contact hole extending through the second insulating layer to reach the first semiconductor layer; and
(l) forming, in the first contact hole, a first electrode portion electrically coupled to each of the second base region and the emitter region.

11. The method of manufacturing the semiconductor device according to claim 10,
wherein, when a first width of the first semiconductor layer at a depth position of a bottom surface of the first contact hole is W1 and a second width of a portion of the first semiconductor layer which is located under the second base region and interposed between the pair of gate electrodes is W2, W1>W2 is satisfied.

12. The method of manufacturing the semiconductor device according to claim 10,
wherein, in the step (c), in the first insulating layer, a third trench is also formed to be spaced apart from the first trench and extend through the first insulating layer,
wherein, in the step (d), over the semiconductor substrate exposed at a bottom portion of the third trench, a second semiconductor layer having the first conductivity type is also formed so as to be embedded in the third trench,
wherein, in the steps (e) and (f), a trench adjacent to the second semiconductor layer and exposing a side surface of the second semiconductor layer is not formed,
wherein, in the step (i), in an upper portion of the second semiconductor layer, a semiconductor region having the second conductivity type is formed,
wherein, in the step (k), over the second semiconductor layer, a second contact hole is also formed to extend through the second insulating layer and reach the second semiconductor layer,
wherein, in the step (l), in the second contact hole, a second electrode portion is also formed to be electrically coupled to the semiconductor region,
wherein a gate electrode adjacent to the second semiconductor layer is not formed, and
wherein the first and second electrode portions are connected via a conductor.

* * * * *